United States Patent
Misaki

(10) Patent No.: US 10,804,406 B2
(45) Date of Patent: Oct. 13, 2020

(54) THIN-FILM TRANSISTOR SUBSTRATE, LIQUID CRYSTAL DISPLAY DEVICE INCLUDING THE SAME, AND METHOD FOR PRODUCING THIN-FILM TRANSISTOR SUBSTRATE

(71) Applicant: Sharp Kabushiki Kaisha, Sakai, Osaka (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/662,114

(22) Filed: Oct. 24, 2019

(65) Prior Publication Data
US 2020/0135933 A1    Apr. 30, 2020

Related U.S. Application Data

(60) Provisional application No. 62/752,390, filed on Oct. 30, 2018.

(51) Int. Cl.
*H01L 29/786* (2006.01)
*G02F 1/1368* (2006.01)
(Continued)

(52) U.S. Cl.
CPC ...... *H01L 29/78618* (2013.01); *G02F 1/1368* (2013.01); *H01L 21/441* (2013.01);
(Continued)

(58) Field of Classification Search
CPC ........... H01L 29/78618; H01L 27/1225; H01L 29/45; H01L 29/24; H01L 29/66969; H01L 29/7869; H01L 27/127; H01L 27/1288; H01L 21/441; H01L 21/471; H01L 29/42384; H01L 2029/42388; G02F 1/1368
(Continued)

(56) References Cited

U.S. PATENT DOCUMENTS

2010/0117079 A1  5/2010  Miyairi et al.
2011/0128275 A1  6/2011  Ueda et al.
(Continued)

FOREIGN PATENT DOCUMENTS

JP    2010-74148 A    4/2010
JP    2010-141308 A   6/2010
(Continued)

*Primary Examiner* — Charles S Chang
(74) *Attorney, Agent, or Firm* — Keating & Bennett, LLP

(57) ABSTRACT

The present invention provides a thin-film transistor substrate including a base substrate and a thin-film transistor, the thin-film transistor including: a gate electrode; a gate insulating layer; a source electrode and a drain electrode; and an oxide semiconductor layer in this order. The source electrode and the drain electrode each include a first conductive layer and a second conductive layer covering the first conductive layer. The second conductive layer contains at least one element selected from the group consisting of molybdenum, tantalum, tungsten, and nickel. The gate insulating layer in a region between the source electrode and the drain electrode has a smaller thickness than in a region below the source electrode and in a region below the drain electrode.

12 Claims, 35 Drawing Sheets

(51) Int. Cl.
*H01L 27/12* (2006.01)
*H01L 29/24* (2006.01)
*H01L 29/45* (2006.01)
*H01L 29/66* (2006.01)
*H01L 21/441* (2006.01)
*H01L 21/471* (2006.01)
*H01L 29/423* (2006.01)

(52) U.S. Cl.
CPC .......... *H01L 21/471* (2013.01); *H01L 27/127* (2013.01); *H01L 27/1225* (2013.01); *H01L 27/1288* (2013.01); *H01L 29/24* (2013.01); *H01L 29/42384* (2013.01); *H01L 29/45* (2013.01); *H01L 29/66969* (2013.01); *H01L 29/7869* (2013.01); *H01L 2029/42388* (2013.01)

(58) Field of Classification Search
USPC ....................................................... 349/42–48
See application file for complete search history.

(56) References Cited

U.S. PATENT DOCUMENTS

| | | | |
|---|---|---|---|
| 2012/0292610 A1* | 11/2012 | Wang ................. | H01L 27/1259 257/43 |
| 2013/0334525 A1 | 12/2013 | Miyairi et al. | |
| 2014/0154823 A1* | 6/2014 | Liu ..................... | H01L 27/1225 438/34 |
| 2015/0102317 A1* | 4/2015 | Kim ................... | H01L 29/78606 257/40 |
| 2015/0187948 A1* | 7/2015 | Misaki ............... | H01L 29/66969 257/43 |
| 2017/0154998 A1 | 6/2017 | Ueda et al. | |

FOREIGN PATENT DOCUMENTS

| | | |
|---|---|---|
| JP | 2014-232880 A | 12/2014 |
| JP | 2016-36043 A | 3/2016 |
| JP | 2017-187782 A | 10/2017 |

\* cited by examiner

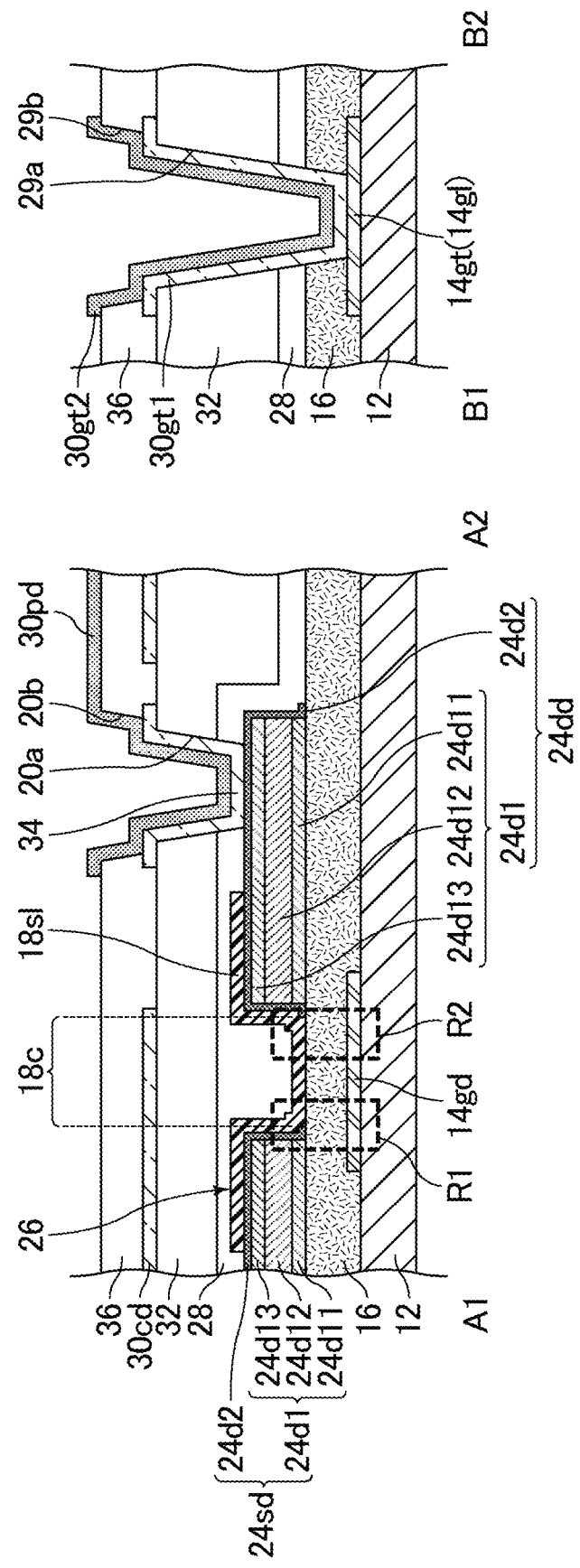

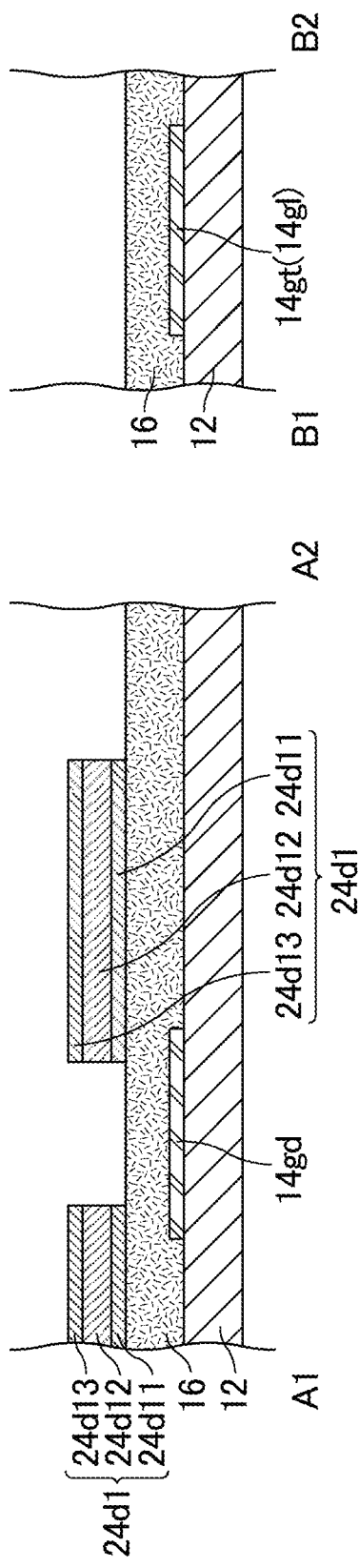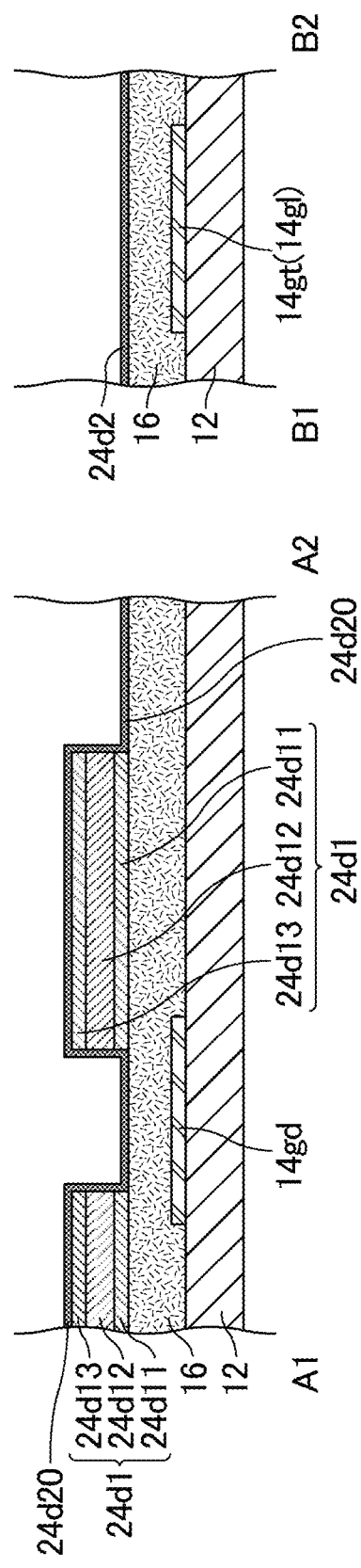

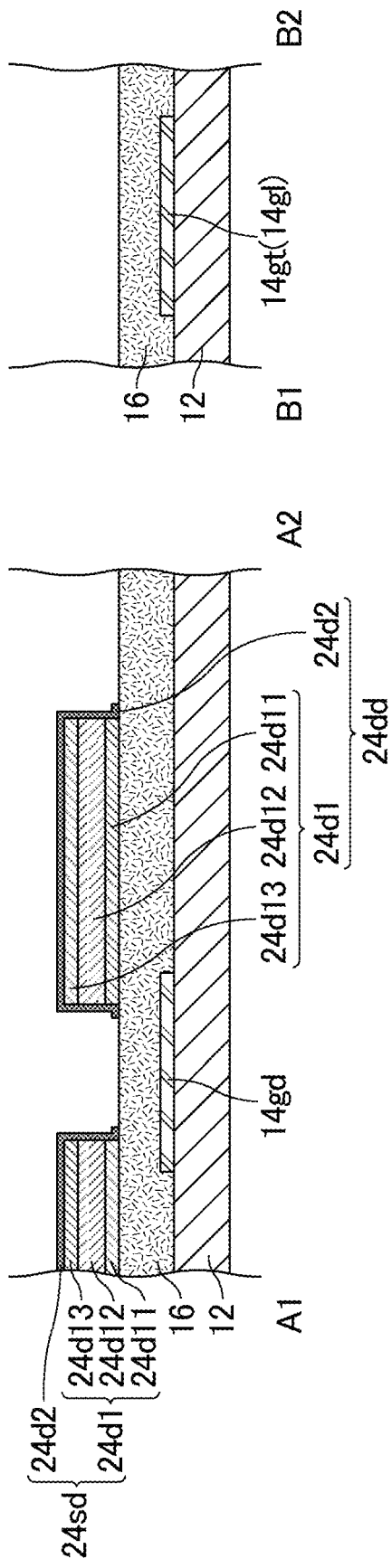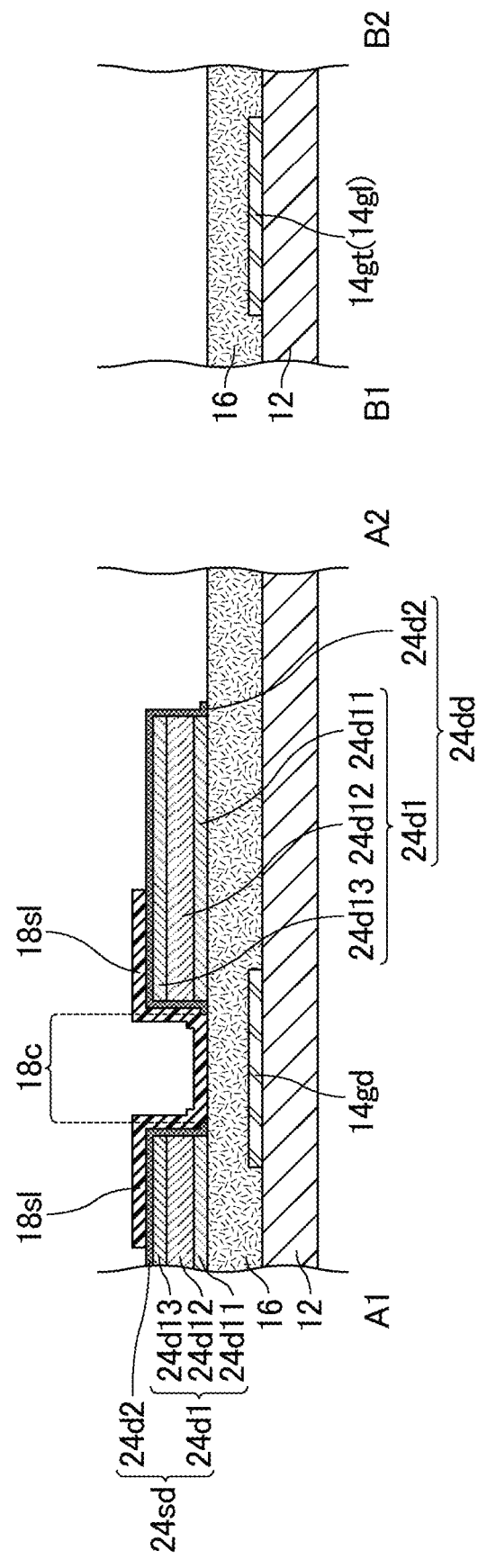

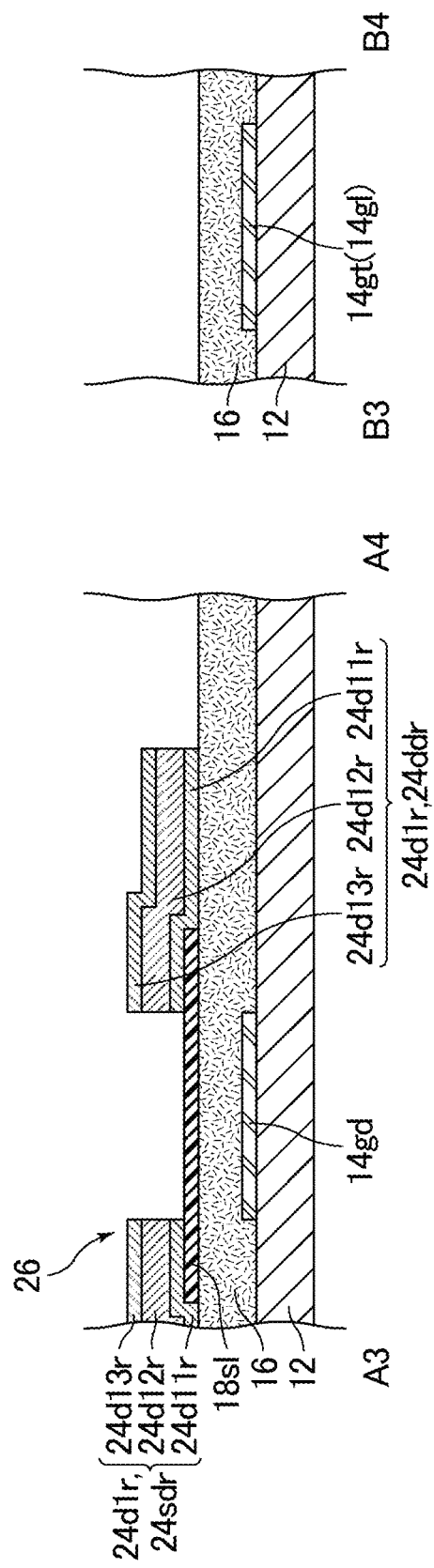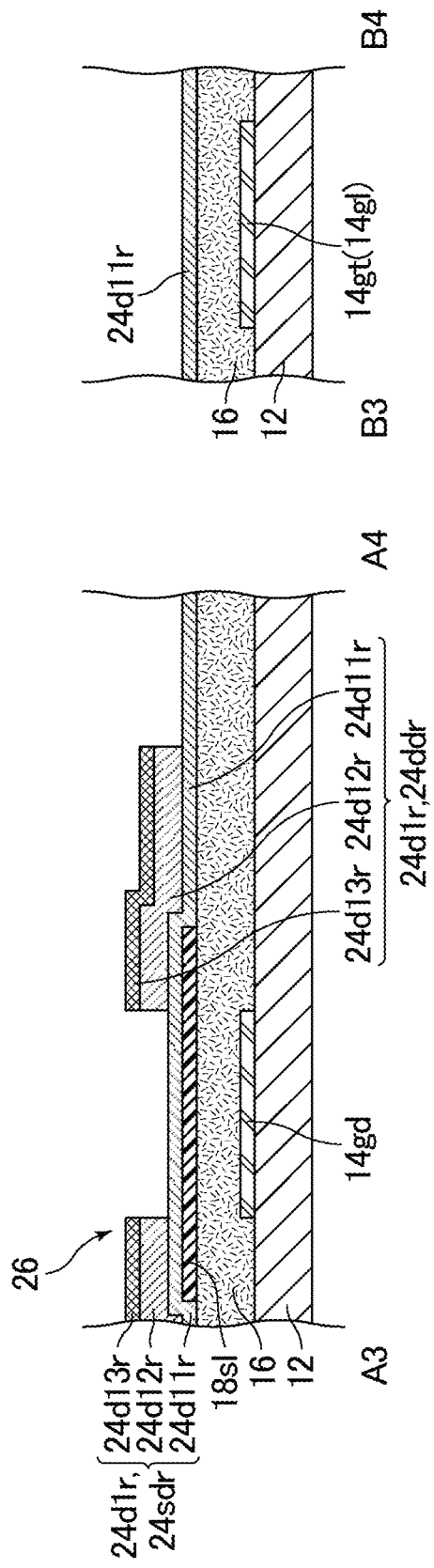

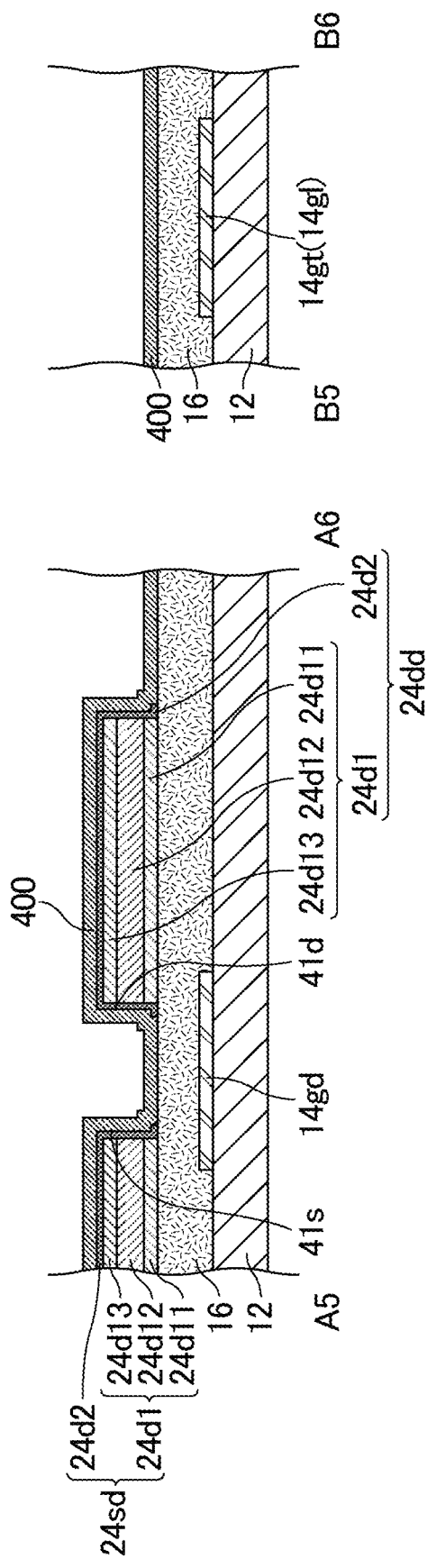
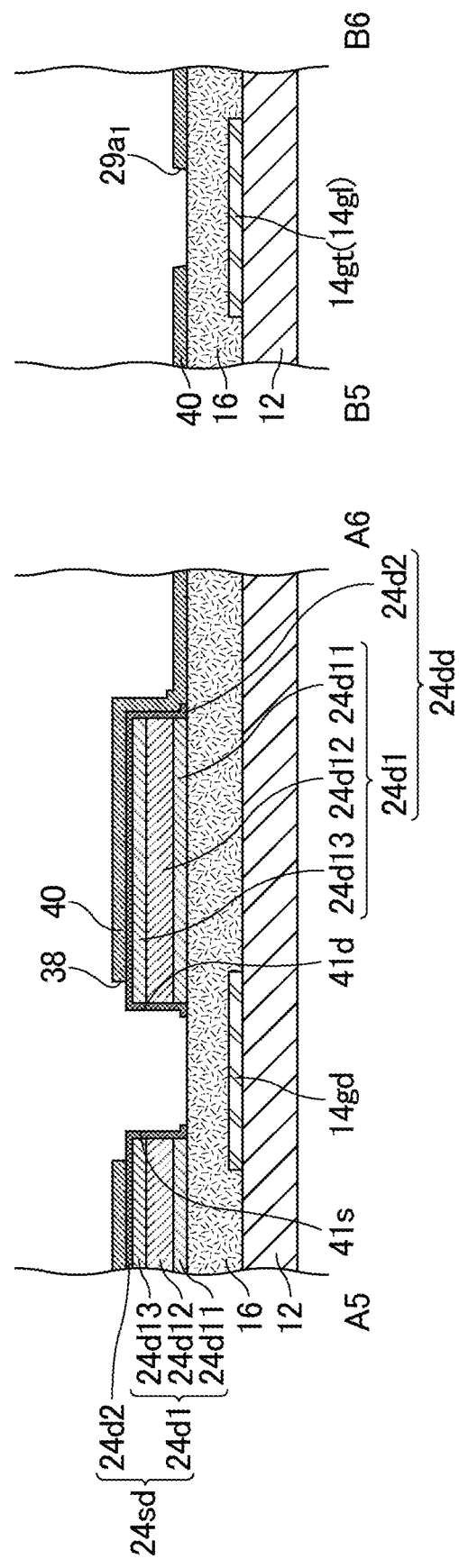
FIG. 25
FIG. 26

THIN-FILM TRANSISTOR SUBSTRATE, LIQUID CRYSTAL DISPLAY DEVICE INCLUDING THE SAME, AND METHOD FOR PRODUCING THIN-FILM TRANSISTOR SUBSTRATE

CROSS-REFERENCE TO RELATED APPLICATIONS

The present application claims priority under 35 U.S.C. § 119 to U.S. Provisional Application No. 62/752,390 filed on Oct. 30, 2018, the contents of which are incorporated herein by reference in their entirety.

BACKGROUND OF THE INVENTION

Field of the Invention

The present invention relates to thin-film transistor (hereinafter, also referred to as TFT) substrates and liquid crystal display devices including a TFT substrate, and methods for producing a TFT substrate. The present invention specifically relates to a TFT substrate and a liquid crystal display device each including a TFT that includes a semiconductor layer formed from an oxide semiconductor, and a method for producing the TFT substrate.

Description of Related Art

In the field of TFT substrates constituting liquid crystal display devices, TFTs having good properties such as high carrier mobility, high reliability, and low off-current have been proposed recently. Such a TFT achieves the good properties by employing a semiconductor layer formed from an oxide semiconductor (hereinafter, also referred to as oxide semiconductor layer) as a switching element of a pixel, a minimum unit of an image, differently from conventional TFTs that employ a semiconductor layer formed from amorphous silicon.

As techniques relating to such an oxide semiconductor layer, for example, JP 2010-141308 A, JP 2014-232880 A, JP 2016-36043 A, and JP 2017-187782 A each disclose an oxide semiconductor layer which includes on one substrate a pixel and a drive circuit for driving the pixel and in which at least part of the drive circuit is formed of a thin-film transistor including an oxide semiconductor sandwiched by top and bottom gate electrodes. JP 2010-74148 A discloses a field effect transistor including: a gate electrode to which a gate voltage is applied; a source electrode and a drain electrode for obtaining a current in response to the gate voltage; an active layer provided adjacent to the source electrode and the drain electrode and formed of an oxide semiconductor including magnesium (Mg) and indium (In) as major components; and a gate insulating layer provided between the gate electrode and the active layer. The flow rate of oxygen gas supplied when forming the active layer is controlled so that the partial oxygen pressure becomes $1.7 \times 10^{-3}$ Pa. The oxide semiconductor which constitutes the active layer is a $MgIn_2O_4$ oxide semiconductor having a volume resistivity of 10 Ωcm and having nonstoichiometric composition in regard to oxygen.

BRIEF SUMMARY OF THE INVENTION

A channel-etched TFT structure, which includes a semiconductor layer including an oxide semiconductor (e.g., In—Ga—Zn—O-based oxide semiconductor), is obtained by forming a gate layer, a gate insulating layer (also referred to as gate insulating film) on the gate layer, an oxide semiconductor layer on the gate insulating layer, and a source/drain layer (hereinafter, also referred to as SD layer) provided with source electrodes, drain electrodes, source lines, and drain lines. The SD layer is formed from Al or Cu, i.e., a metal having a low resistance. When the SD layer has a structure in which Al or Cu having a low resistance is sandwiched by Ti, the SD layer is formed by dry etching. In this case, the channel portion of each TFT has troubles due to plasma damage caused by the dry etching. Specifically, the TFT properties are degraded, namely, the threshold value is significantly reduced to the negative side, whereby the TFT may fail to function as a switching element.

In JP 2010-141308 A, JP 2014-232880 A, JP 2016-36043 A, and JP 2017-187782 A, a surface of the gate insulating layer serving as channels of the TFTs has undergone plasma treatment. When the plasma treatment is performed by asking treatment, the SD layer is oxidized and may possibly cause poor contact. When the plasma treatment is performed by etching the gate insulating layer, the SD layer is also etched and the lengths L of the TFT elements (channel lengths of the TFT elements) varies in the substrate plane to cause variation in carrier mobility and threshold value of the TFTs. When such TFTs are used for an X-ray sensor, for example, the sensitivity of the X-ray sensor is significantly varied. When the plasma treatment is performed before formation of the semiconductor layer, the surface of the gate insulating layer (interface between the gate insulating layer and the semiconductor layer) has a defect due to plasma damage and may fail in providing stable TFT properties (threshold value).

Even in the bottom-contact/bottom-gate TFT disclosed in FIG. 14 of JP 2010-74148 A, the top layer of the gate insulating layer, which corresponds to the interface between the gate insulating layer and the semiconductor layer, may be contaminated during resist removal in forming an SD layer. In this case, the threshold values of the TFTs are unstable to possibly cause reduced on-state current. In addition, etching the SD layer in the forming of an SD layer may cause a residue of the SD layer or an ionic residue. As a result, among the TFT properties, the off-leakage current increases and the threshold value shifts to the negative side. These troubles may cause the TFTs to fail to function as switching elements, possibly leading to unstable TFT properties.

The present invention has been made under the current situation in the art and aims to provide a thin-film transistor substrate achieving stable TFT properties, a liquid crystal display device including the thin-film transistor substrate, and a method for producing a thin-film transistor substrate.

(1) An embodiment of the present invention is a thin-film transistor substrate including a base substrate and a thin-film transistor, the thin-film transistor including: a gate electrode disposed on the base substrate; a gate insulating layer covering the gate electrode; a source electrode and a drain electrode facing each other and disposed above the gate electrode via the gate insulating layer; and an oxide semiconductor layer which faces the gate electrode via at least the gate insulating layer and whose first end and second end respectively overlap the source electrode and the drain electrode and are thereby respectively connected to the source electrode and the drain electrode, the source electrode and the drain electrode each including a first conductive layer and a second conductive layer covering the first conductive layer, the second conductive layer containing at least one element selected from the group consisting of molybdenum, tantalum, tungsten, and nickel, the gate insulating layer in a region between the source electrode and the drain electrode having a smaller thickness than in a region below the source electrode and in a region below the drain electrode.

(2) In an embodiment of the present invention, the thin-film transistor substrate includes the structure (1), the thin-film transistor includes no etching stopper layer on the source electrode and on the drain electrode, and the oxide semiconductor layer faces the gate electrode via the gate insulating layer.

(3) In an embodiment of the present invention, the thin-film transistor substrate includes the structure (1), the thin-film transistor further includes an etching stopper layer on the source electrode and on the drain electrode, the thin-film transistor substrate further includes a protective insulating layer covering the thin-film transistor and a conductive layer disposed on the protective insulating layer and connected to the drain electrode via a first contact hole in the etching stopper layer and in the protective insulating layer, the etching stopper layer covers the source electrode except for a connection portion between the oxide semiconductor layer and the source electrode and covers the drain electrode except for a connection portion between the oxide semiconductor layer and the drain electrode and a connection portion between the conductive layer and the drain electrode, and the connection portion between the oxide semiconductor layer and the source electrode and the connection portion between the oxide semiconductor layer and the drain electrode are located in a region with the gate electrode.

(4) In an embodiment of the present invention, the thin-film transistor substrate includes the structure (3), the etching stopper layer is not present in a region between the oxide semiconductor layer and the gate insulating layer, and the oxide semiconductor layer faces the gate electrode via the gate insulating layer.

(5) In an embodiment of the present invention, the thin-film transistor substrate includes the structure (3), the etching stopper layer is present in a region between the oxide semiconductor layer and the gate insulating layer, and the oxide semiconductor layer is connected to the source electrode via a second contact hole in the etching stopper layer and connected to the drain electrode via a third contact hole in the etching stopper layer.

(6) In an embodiment of the present invention, the thin-film transistor substrate includes the structure (5), the second contact hole overlaps an end of the source electrode and the gate insulating layer in a part adjacent to the end of the source electrode, the third contact hole overlaps an end of the drain electrode and the gate insulating layer in a part adjacent to the end of the drain electrode, and the gate insulating layer in a region between the source electrode and the drain electrode and below the etching stopper layer has a greater thickness than in a region below the second contact hole and in a region below the third contact hole.

(7) In an embodiment of the present invention, the thin-film transistor substrate includes the structure (5), the second contact hole overlaps an end of the source electrode but does not overlap the gate insulating layer, the third contact hole overlaps an end of the drain electrode but does not overlap the gate insulating layer, and the gate insulating layer in a region between the source electrode and the drain electrode and below the etching stopper layer has a smaller thickness than in a region below the source electrode and in a region below the drain electrode.

(8) In an embodiment of the present invention, the thin-film transistor substrate includes the structure (1), (2), (3), (4), (5), (6), or (7), the first conductive layer is a laminate including a lower layer, a middle layer, and an upper layer stacked in the stated order from a base substrate side, the middle layer contains aluminum or copper, and the lower layer and the upper layer each contain titanium or molybdenum nitride.

(9) In an embodiment of the present invention, the thin-film transistor substrate includes the structure (1), (2), (3), (4), (5), (6), (7), or (8), the second conductive layer contains at least one substance selected from the group consisting of molybdenum, molybdenum nitride, a molybdenum alloy, a nitride of the molybdenum alloy, tantalum, tantalum nitride, a tantalum alloy, a nitride of the tantalum alloy, tungsten, tungsten nitride, a tungsten alloy, a nitride of the tungsten alloy, nickel, nickel nitride, a nickel alloy, and a nitride of the nickel alloy.

(10) In an embodiment of the present invention, the thin-film transistor substrate includes the structure (1), (2), (3), (4), (5), (6), (7), (8), or (9), the oxide semiconductor layer includes an indium gallium zinc oxide-based oxide semiconductor.

(11) Another embodiment of the present invention is a liquid crystal display device including: the thin-film transistor substrate having the structure (1), (2), (3), (4), (5), (6), (7), (8), (9), or (10); a counter substrate facing the thin-film transistor substrate; and a liquid crystal layer disposed between the thin-film transistor substrate and the counter substrate.

(12) Another embodiment of the present invention is a method for producing a thin-film transistor substrate, including in the following order: first patterning including forming a gate electrode conductive film on a base substrate and patterning the gate electrode conductive film using a first photomask to form a gate electrode; formation of a gate insulating layer including forming a gate insulating layer so as to cover the gate electrode; second patterning including forming a first conductive film so as to cover the gate insulating layer and patterning the first conductive film using a second photomask; third patterning including forming a second conductive film containing at least one element selected from the group consisting of molybdenum, tantalum, tungsten, and nickel and patterning the second conductive film using a third photomask to form a source electrode and a drain electrode; hydrofluoric acid treatment including treating a gate insulating layer side surface of the base substrate with hydrofluoric acid; and fourth patterning including forming an oxide semiconductor film so as to cover the source electrode and the drain electrode and patterning the oxide semiconductor film using a fourth photomask to form an oxide semiconductor layer.

(13) In an embodiment of the present invention, the production method includes the structure (12), and, between the hydrofluoric acid treatment and the fourth patterning, fifth patterning including forming an insulating film so as to cover the source electrode and the drain electrode and patterning the insulating film using a fifth photomask to form an etching stopper layer.

(14) In an embodiment of the present invention, the production method includes the structure (13), and, between the fifth patterning and the fourth patterning, second hydrofluoric acid treatment including treating the gate insulating layer side surface of the base substrate with hydrofluoric acid.

(15) In an embodiment of the present invention, the production method includes the structure (12), (13), or (14), and the second conductive film is a conductive film containing at least one substance selected from the group consisting of molybdenum, molybdenum nitride, a molybdenum alloy, a nitride of the molybdenum alloy, tantalum, tantalum nitride, a tantalum alloy, a nitride of the tantalum alloy, tungsten, tungsten nitride, a tungsten alloy, a nitride of the tungsten alloy, nickel, nickel nitride, a nickel alloy, and a nitride of the nickel alloy.

(16) In an embodiment of the present invention, the production method includes the structure (12), (13), (14), or (15), and the oxide semiconductor film is an indium gallium zinc oxide-based oxide semiconductor.

The present invention provides a thin-film transistor substrate achieving stable TFT properties, a liquid crystal display device including the thin-film transistor substrate, and a method for producing a thin-film transistor substrate.

BRIEF DESCRIPTION OF THE DRAWINGS

FIG. 4 includes schematic cross-sectional views taken along the line A1-A2 and the line B1-B2 in FIG. 3.

FIG. 8 includes schematic cross-sectional views of the regions shown in FIG. 4, each showing a state where a first conductive film is patterned in second patterning in production of the TFT substrate of Embodiment 1.

FIG. 9 includes schematic cross-sectional views of the regions shown in FIG. 4, each showing a state where a second conductive film is formed in third patterning in production of the TFT substrate of Embodiment 1.

FIG. 10 includes schematic cross-sectional views of the regions shown in FIG. 4, each showing a state where the second conductive film is patterned in the third patterning in production of the TFT substrate of Embodiment 1.

FIG. 11 includes schematic cross-sectional views of the regions shown in FIG. 4, each showing a state where an oxide semiconductor layer is formed in fourth patterning in production of the TFT substrate of Embodiment 1.

FIG. 19 includes schematic cross-sectional views of the regions shown in FIG. 18, each showing a production process of a TFT substrate of Specific Example 1 of Comparative Embodiment 1.

FIG. 20 includes schematic cross-sectional views of the regions shown in FIG. 18, each showing a production process of a TFT substrate of Specific Example 2 of Comparative Embodiment 1.

FIG. 25 includes schematic cross-sectional views of the regions shown in FIG. 23, each showing a state where an insulating film is formed in fourth patterning in production of the TFT substrate of Embodiment 2.

FIG. 26 includes schematic cross-sectional views of the regions shown in FIG. 23, each showing a state where an insulating film is patterned in the fourth patterning in production of the TFT substrate of Embodiment 2.

DETAILED DESCRIPTION OF THE INVENTION

Embodiments of the present invention are described below. The embodiments, however, are not intended to limit the scope of the present invention, and modifications can be appropriately made to the design within the scope of the present invention.

Embodiment 1

Figure 1:
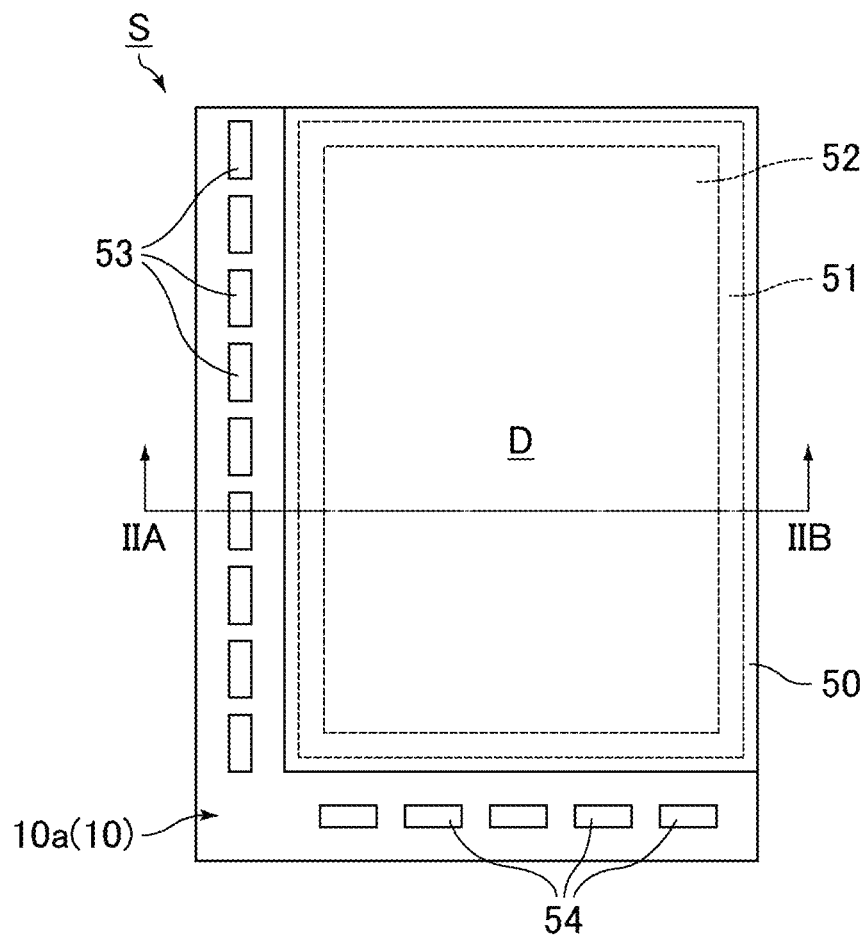
FIG. 1 is a schematic plan view of a liquid crystal display device of Embodiment 1.
Figure 2:
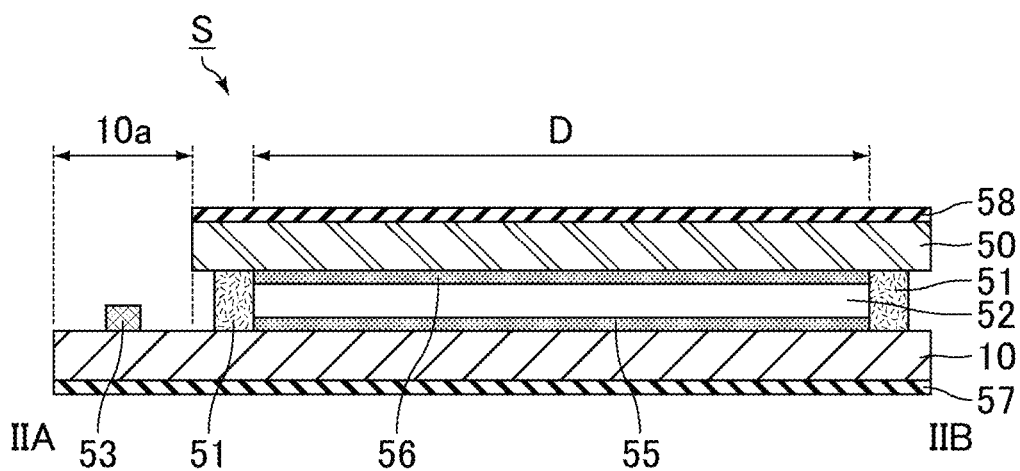
FIG. 2 is a schematic cross-sectional view taken along the line IIA-IIB in FIG. 1.

FIG. 1 is a schematic plan view of a liquid crystal display device of Embodiment 1. FIG. 2 is a schematic cross-sectional view taken along the line IIA-IIB in FIG. 1. FIG. 1 does not show a polarizing plate 58 shown in FIG. 2.
<Structure of Liquid Crystal Display Device S>

A liquid crystal display device S includes a thin-film transistor (TFT) substrate 10 and a counter substrate 50 facing each other, a sealant 51 in a frame pattern which bonds the TFT substrate 10 and the counter substrate 50 at their outer edges, and a liquid crystal layer 52 enclosed inside the sealant 51 between the TFT substrate 10 and the counter substrate 50.

The liquid crystal display device S is a transmissive liquid crystal display device and includes a display region D for image display in a region where the TFT substrate 10 and the counter substrate 50 overlap each other inside the sealant 51, i.e., a region where the liquid crystal layer 52 is disposed. Outside the display region D is disposed a terminal region 10a that is an L-shaped part of the TFT substrate 10 protruding from the counter substrate 50, for example.

The display region D has a rectangle shape, for example, and includes pixels, which are minimum units of an image, arranged in a matrix. On one side (left side in FIG. 1) of the terminal region 10a are mounted gate driver integrated circuit (hereinafter, abbreviated to IC) chips 53 via anisotropic conductive films (hereinafter, abbreviated to ACFs). On another side (bottom side in FIG. 1) of the terminal region 10a are mounted source driver IC chips 54 via ACFs.

The TFT substrate 10 and the counter substrate 50 each have a rectangle shape, for example, and as shown in FIG. 2, respectively have alignment films 55 and 56 on their facing inner surfaces and respectively have polarizing plates 57 and 58 on their outer surfaces. The liquid crystal layer 52 is formed from a nematic liquid crystal material having electro-optical properties, for example.
<Structure of TFT Substrate 10>

Figure 3:
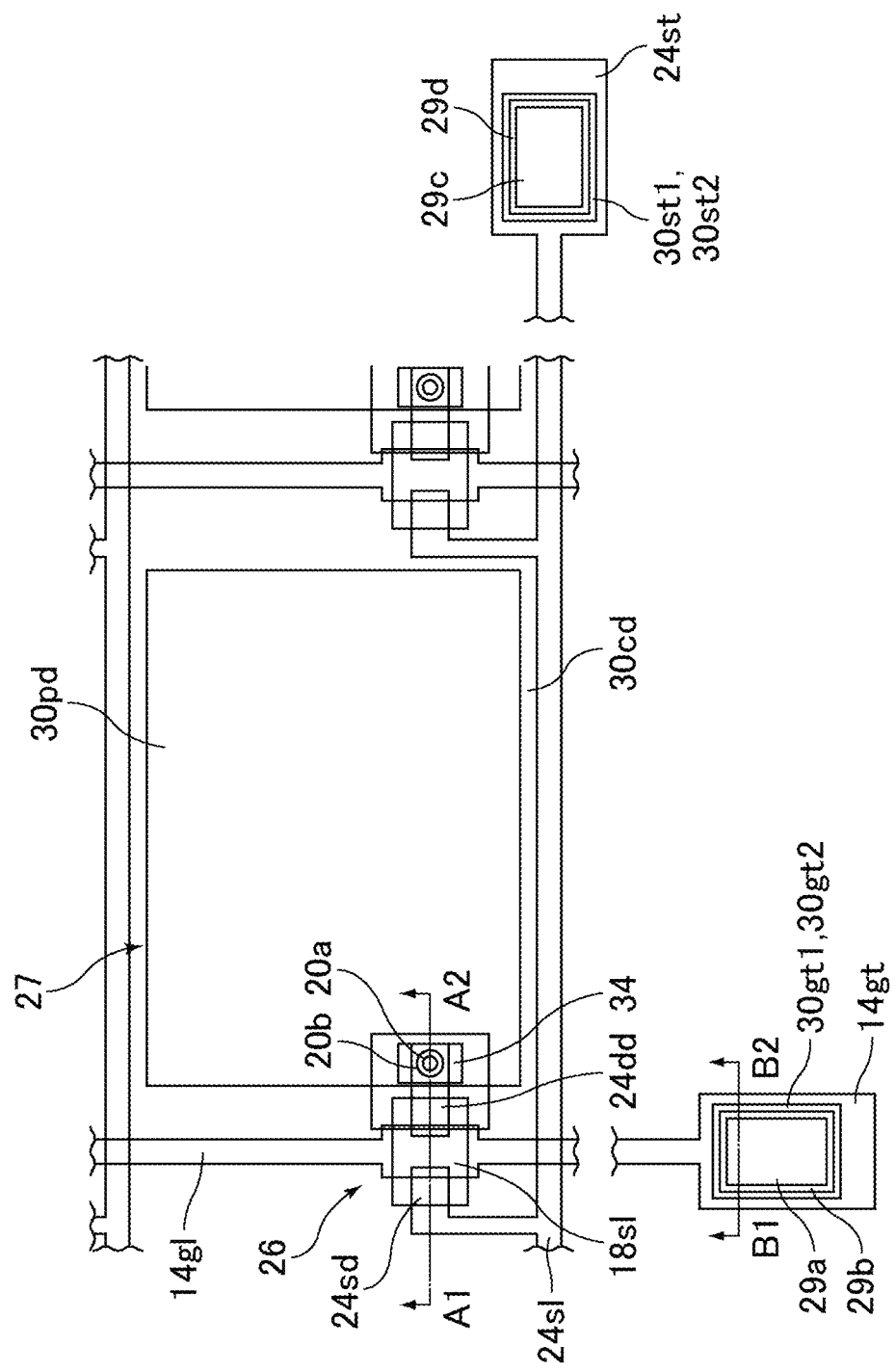
FIG. 3 is a schematic plan view showing the structures of one pixel and ends of lines on a TFT substrate of Embodiment 1.
Figure 5A:
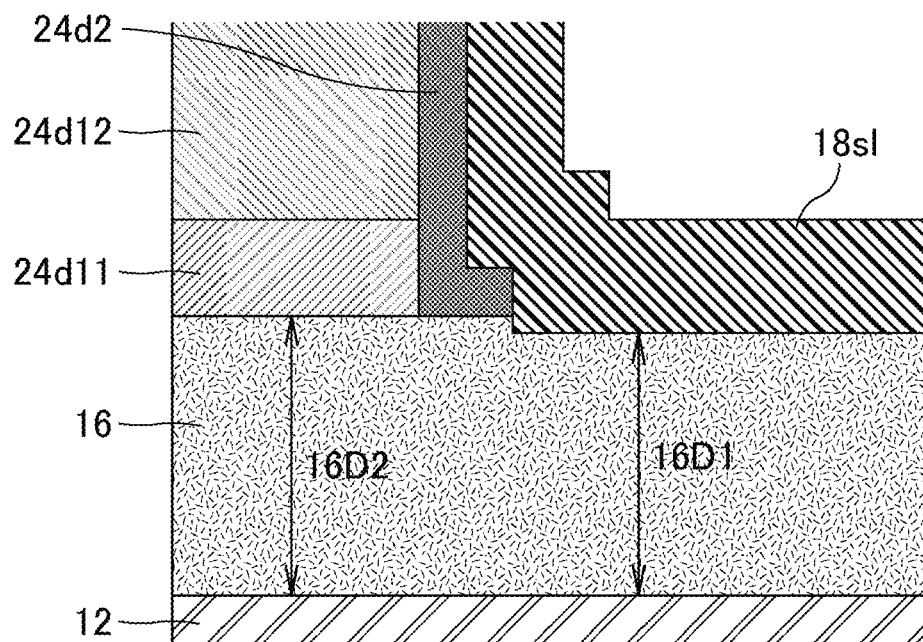
FIG. 5A is a schematic cross-sectional view of a region R1 surrounded by a broken line in FIG. 4.
Figure 5B:
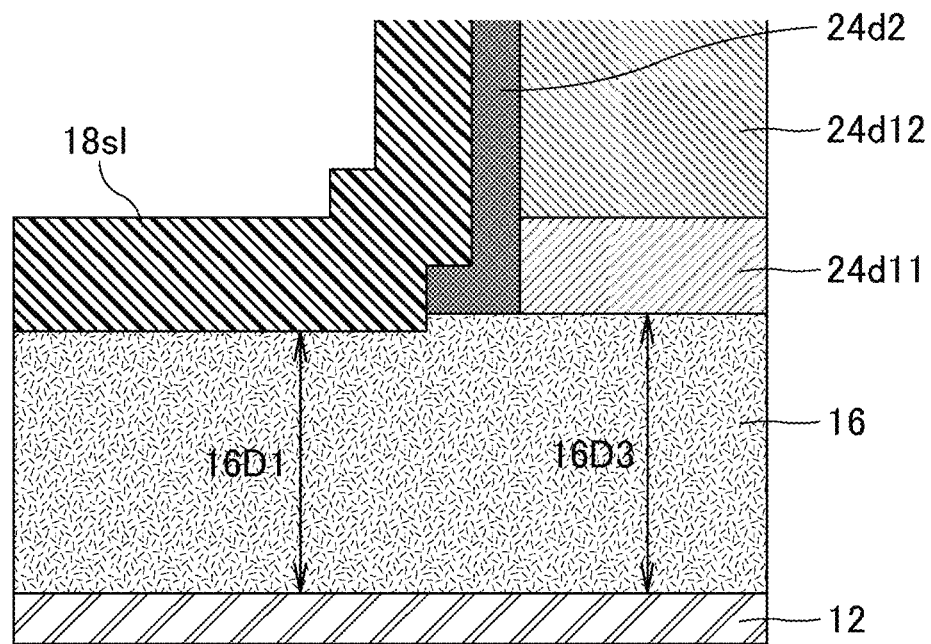
FIG. 5B is a schematic cross-sectional view of a region R2 surrounded by a broken line in FIG. 4.

FIG. 3 and FIG. 4 show schematic structure views of the TFT substrate 10. FIG. 3 is a schematic plan view showing the structures of one pixel and ends of lines on the TFT substrate of Embodiment 1. FIG. 4 includes schematic cross-sectional views taken along the line A1-A2 and the line B1-B2 in FIG. 3. FIG. 4 shows, from left, a schematic cross-sectional view taken along the line A1-A2 in FIG. 3 and a schematic cross-sectional view taken along the line B1-B2 in FIG. 3. FIG. 5A is a schematic cross-sectional view of a region R1 surrounded by a broken line in FIG. 4. FIG. 5B is a schematic cross-sectional view of a region R2 surrounded by a broken line in FIG. 4. FIG. 5A and FIG. 5B do not show the gate electrode.

As shown in FIG. 4, the TFT substrate 10 includes an insulating substrate 12 such as a glass substrate serving as a base substrate. As shown in FIG. 3, in the display region D, the insulating substrate 12 has parallel gate lines 14gl and parallel source lines 24sl that insect the gate lines 14gl via an insulating film. The gate lines 14gl and the source lines 24sl form a grid pattern to partition the pixels.

The TFT substrate 10 further includes, in each intersection of the gate lines 14gl and the source lines 24sl, i.e., in each pixel, a TFT 26, a connection electrode 34 functioning as the above mentioned conductive layer connected to a drain electrode 24dd, and a pixel electrode 30pd connected to a storage capacitance element 27 and the connection electrode 34. The TFT substrate 10 also includes a common electrode 30cd provided in common in all the pixels.

The TFTs 26 are each a bottom-contact/bottom-gate TFT. As shown in FIG. 4 (the cross-sectional view taken along the line A1-A2), each TFT 26 includes a gate electrode 14gd on the insulating substrate 12, a gate insulating layer 16 covering the gate electrode 14gd, a source electrode 24sd and the drain electrode 24dd facing each other above the gate electrode 14gd via the gate insulating layer 16, and an oxide semiconductor layer 18sl which faces the gate electrode 14gd via the gate insulating layer 16 and whose first end and second end respectively overlap and are thereby connected to the source electrode 24sd and the drain electrode 24dd. The oxide semiconductor layer 18sl includes a channel region 18c in a region between the source electrode 24sd and the drain electrode 24dd. The source electrode 24sd is connected to a branch of the corresponding source line 24sl. The "gate electrode" as used herein means one of three electrodes constituting a TFT (the others are a source electrode and a drain electrode) and the charge generated in the channel region of the semiconductor layer is modulated in accordance with the voltage applied to the gate electrode to control the current between the source electrode and the drain electrode. The "source electrode" as used herein means one of the three electrodes constituting a TFT and is an electrode that serves as a donor for a carrier to flow in the semiconductor layer of the TFT. The "drain electrode" as used herein means one of the three electrodes constituting a TFT and is an electrode that serves as an acceptor for a carrier to flow in the semiconductor layer of the TFT.

The gate electrode 14gd is part of the gate line 14gl that constitutes the corresponding intersection and includes protrusions extending from the gate line 14gl to the respective sides in the width direction, as shown in FIG. 3. Adjusting the width of each protrusion controls the channel length of the TFT 26. Although not being shown, the gate electrode 14gd has a structure in which the gate line 14gl, an aluminum (Al) layer, and a molybdenum (Mo) layer, for example, are stacked in the stated order and integrated.

The gate insulating layer 16 is formed from, for example, silicon nitride (SiN), silicon oxide ($SiO_2$), or a multilayer film in which a silicon nitride film and a silicon oxide film are stacked in the stated order and integrated.

The oxide semiconductor layer 18sl is formed from an indium gallium zinc oxide (hereinafter, abbreviated to In—Ga—Zn—O) semiconductor. The oxide semiconductor layer 18sl, which is an In—Ga—Zn—O semiconductor layer in the present embodiment, may be an oxide semiconductor layer formed from an indium silicon zinc oxide (In—Si—Zn—O), an indium aluminum zinc oxide (In—Al—Zn—O), a tin silicon zinc oxide (Sn—Si—Zn—O), a tin aluminum zinc oxide (Sn—Al—Zn—O), a tin gallium zinc oxide (Sn—Ga—Zn—O), a gallium silicon zinc oxide (Ga—Si—Zn—O), a gallium aluminum zinc oxide (Ga—Al—Zn—O), an indium copper zinc oxide (In—Cu—Zn—O), a tin copper zinc oxide (Sn—Cu—Zn—O), an indium tin gallium oxide (In—Sn—Ga—O), an indium tin zinc oxide (In—Sn—Zn—O), an indium tin gallium zinc oxide (In—Sn—Ga—Zn—O), a tin oxide (Zn—O), or an indium oxide (In—O). The oxide semiconductor layer 18sl may be applied to a TFT substrate having a TFT formed from a combination of these oxides.

The source electrode 24sd and the drain electrode 24dd each include a first conductive layer 24d1 and a second conductive layer 24d2 covering the first conductive layer 24d1. The second conductive layer 24d2 contains at least one element selected from the group consisting of molybdenum, tantalum, tungsten, and nickel. The gate insulating layer 16 may be contaminated in formation of the source electrode 24sd and the drain electrode 24dd, for example. Thereby, the threshold value (also referred to as threshold voltage) among the TFT properties may be unstable to possibly cause reduced on-state current. In production of the TFT substrate 10 of the present embodiment, in order to remove contaminants on the gate insulating layer 16, for example, the surface of the gate insulating layer 16 in the region between the source electrode 24sd and the drain electrode 24dd is removed (modified) by etching with hydrofluoric acid before disposing the oxide semiconductor layer 18sl. This can stabilize the threshold value among the TFT properties and prevent or reduce a reduction in on-state current to achieve stable TFT properties. In the TFT substrate 10 of the present embodiment, the second conductive layer 24d2 contains at least one element selected from the group consisting of molybdenum, tantalum, tungsten, and nickel. When the conductive layer contains at least one element selected from the group consisting of molybdenum, tantalum, tungsten, and nickel, the conductive layer has hydrofluoric acid resistance and thus can prevent the source electrode 24sd and the drain electrode 24dd from being etched during the etching with hydrofluoric acid. This can achieve less variation in channel length of the TFT 26 in the substrate plane, and thereby can achieve less variation in carrier mobility and threshold value among the TFT properties. As a result, the TFT properties can further be stabilized.

When the surface of the gate insulating layer 16 in the region between the source electrode 24sd and the drain electrode 24dd is etched with hydrofluoric acid before disposing the oxide semiconductor layer 18sl as mentioned above, the gate insulating layer 16 in the region between the source electrode 24sd and the drain electrode 24dd is etched while the gate insulating layer 16 in the regions below the source electrode 24sd and the drain electrode 24dd is not etched. As a result, as shown in FIG. 5A and FIG. 5B, the thickness 16D1 of the gate insulating layer 16 in the region between the source electrode 24sd and the drain electrode 24dd is smaller than the thickness 16D2 of the gate insulating layer 16 in the region below the source electrode 24sd and is also smaller than the thickness 16D3 of the gate insulating layer 16 in the region below the drain electrode 24dd. The "thickness of a gate insulating layer" herein means the thickness from the upper surface of the base substrate (insulating substrate 12 of the present embodiment) to the upper surface of the gate insulating layer. The thickness of the gate insulating layer is expressed as the average of the thicknesses of the gate insulating layer measured at multiple points (e.g., 5 points in length×5 points in width=25 points).

The thickness 16D1 of the gate insulating layer is, for example, 40% or greater and 99.8% or smaller of the thickness 16D2 of the gate insulating layer and 40% or greater and 99.8% or smaller of the thickness 16D3 of the gate insulating layer. The thickness 16D1 of the gate insulating layer is preferably 90% or greater and 99.5% or smaller of the thickness 16D2 of the gate insulating layer and 90% or greater and 99.5% or smaller of the thickness 16D3 of the gate insulating layer.

The first conductive layer 24d1 is a laminate including a lower layer 24d11, a middle layer 24d12, and an upper layer 24d13 stacked in the stated order from the insulating substrate 12 side. The middle layer 24d12 is sandwiched by the lower layer 24d11 from the bottom and the upper layer 24d13 from the top.

The middle layer 24d12 contains aluminum or copper, and the lower layer 24d11 and the upper layer 24d13 each contain titanium or molybdenum nitride. The substance(s) contained in the lower layer 24d11 and the upper layer 24d13 may be the same as each other or may be different at least in part.

The second conductive layer 24d2 covers the upper surface and the side surfaces of the first conductive layer 24d1. The first conductive layer 24d1 is completely covered with a conductive layer containing at least one element selected from the group consisting of molybdenum, tantalum, tungsten, and nickel.

The second conductive layer 24d2 has a thickness of 10 nm or greater and 300 nm or smaller, for example. The second conductive layer 24d2 has a thickness of preferably 20 nm or greater and 200 nm or smaller, more preferably 40 nm or greater and 150 nm or smaller, still more preferably 90 nm or greater and 110 nm or smaller.

The second conductive layer 24d2 contains at least one element selected from the group consisting of molybdenum, tantalum, tungsten, and nickel. In other words, the second conductive layer 24d2 contains at least one substance selected from the group consisting of molybdenum, a compound containing molybdenum, tantalum, a compound containing tantalum, tungsten, a compound containing tungsten, nickel, and a compound containing nickel. The second conductive layer 24d2 contains, for example, at least one substance selected from the group consisting of molybdenum, molybdenum nitride, a molybdenum alloy (i.e., an alloy mainly containing molybdenum), a nitride of the molybdenum alloy, tantalum, tantalum nitride, a tantalum alloy (i.e., an alloy mainly containing tantalum), a nitride of the tantalum alloy, tungsten, tungsten nitride, a tungsten alloy (i.e., an alloy mainly containing tungsten), a nitride of the tungsten alloy, nickel, nickel nitride, a nickel alloy (i.e., an alloy mainly containing nickel), and a nitride of the nickel alloy.

Specific examples of the molybdenum nitride include MoN. Specific examples of the molybdenum alloy include MoNb, MoNi, MoNbNi, MoTa, and MoW. Specific examples of the tantalum nitride include TaN. Specific examples of the tantalum alloy include TaNb, TaW, and TaTi. Specific examples of the tungsten nitride include WN. Specific examples of the tungsten alloy include WNi, WNiFe, WNiCo, and WNiCu. Specific examples of the nickel nitride include NiN. Specific examples of the nickel alloy include NiMo and NiMoCo. The second conductive layer 24d2 preferably contains molybdenum or molybdenum nitride.

As shown in FIG. 4, each TFT 26 includes no etching stopper layer on the source electrode 24sd and on the drain electrode 24dd, and the oxide semiconductor layer 18sl faces the gate electrode 14gd via the gate insulating layer 16. The oxide semiconductor layer 18sl is in contact with the gate insulating layer 16 and faces the gate electrode 14gd in the region between the source electrode 24sd and the drain electrode 24dd.

As shown in FIG. 4, each TFT 26 is covered with a protective insulating layer 28 formed from silicon oxide ($SiO_2$) and a protective insulating layer 32 formed from transparent insulating resin. The protective insulating layer 28 formed from silicon oxide can prevent the oxide semiconductor layer 18sl from having oxygen deficiency which may be caused by hydrogen desorption in the film when the protective insulating layer 28 is formed from a different substance such as silicon nitride. On the protective insulating layer 32 are disposed the common electrode 30cd and the connection electrode 34. The common electrode 30cd and the connection electrode 34 are covered with a protective insulating layer 36 formed from silicon nitride (SiN) or silicon oxide ($SiO_2$). On the protective insulating layer 36 is disposed the pixel electrode 30pd.

The common electrode 30cd and each pixel electrode 30pd are each a transparent conductive film and formed from an indium tin oxide (hereinafter, referred to as ITO) or an indium zinc oxide (hereinafter, referred to as IZO). The common electrode 30cd is formed on the substantially entire display region D, and each pixel electrode 30pd is formed on the substantially entire pixel. The pixel electrode 30pd is provided with slits (not shown). The protective insulating layers 28 and 32 include a contact hole 20a and the protective insulating layer 36 includes a contact hole 20b. The contact holes 20a and 20b each function as a first contact hole that is formed in the region corresponding to the drain electrode 24dd and exposes the drain electrode 24dd in each pixel. The connection electrode 34 is formed in an island shape so as to be superimposed with the contact hole 20a in each pixel. The pixel electrode 30pd is connected to the drain electrode 24dd via the connection electrode 34 through the contact holes 20a and 20b in each pixel. In the present embodiment, the drain electrode 24dd and the pixel electrode 30pd are connected via the connection electrode 34, and the connection electrode 34 functions as the above mentioned conductive layer. Alternatively, the pixel electrode 30pd may be directly connected to the drain electrode 24dd without the connection electrode 34. In this case, the pixel electrode 30pd is directly connected to the drain electrode 24dd through the contact holes 20a and 20b, and the pixel electrode 30pd functions as the above mentioned conductive layer. In the present embodiment, the pixel electrode 30pd provided with slits is disposed above the common electrode 30cd. Alternatively, the positions of the pixel electrode 30pd and the common electrode 30cd may be switched, whereby the common electrode 30cd may be provided with slits and disposed above the pixel electrode 30pd. In this case, the pixel electrode 30pd is directly connected to the drain electrode 24dd through the contact hole 20a in the protective insulating layers 28 and 32 and functions as the above mentioned conductive layer.

Each storage capacitance element 27 consists of the pixel electrode 30pd, a dielectric layer that is a protective insulating layer in a region corresponding to the pixel electrode 30pd, and a common electrode in a region corresponding to the pixel electrode 30pd via the dielectric layer.

Each gate line 14gl extends to the terminal region 10a on which the gate driver IC chips 53 are mounted, and the lead-out end of the gate line 14gl constitutes a gate terminal 14gt shown in FIG. 3. This gate terminal 14gt is connected to a gate connection electrode 30gt1 disposed on the protective insulating layer 32 and to a gate connection electrode 30gt2 disposed on the protective insulating layer 36 through a contact hole 29a shown in FIG. 4 (the cross section taken along the line B1-B2), which is formed in the gate insulating layer 16 and the protective insulating layers 28 and 32, and a contact hole 29b shown in FIG. 4 (the cross section taken along the line B1-B2), which is formed in the protective insulating layer 36. The gate connection electrodes 30gt1 and 30gt2 are electrically connected to the gate driver IC chips 53.

Each source line 24sl extends to the terminal region 10a on which the source driver IC chips 54 are mounted, and the lead-out end of the source line 24sl constitutes a source terminal 24st shown in FIG. 3. This source terminal 24st is connected to a source connection electrode 30st1 disposed on the protective insulating layer 32 and a source connection electrode 30st2 disposed on the protective insulating layer 36 through a contact hole 29c formed in the protective insulating layers 28 and 32 and a contact hole 29d formed in the protective insulating layer 36. The source connection electrodes 30st1 and 30st2 are electrically connected to the source driver IC chips 54.

The ends of the common electrode 30cd reach the regions with the sealant 51 and are connected to common lines (not shown). Common voltage is applied to the common electrode 30cd via the common lines.

<Structure of Counter Substrate 50>

Although not being shown, the counter substrate 50 includes a black matrix on an insulating substrate as a base substrate in a grid pattern that corresponds to the gate lines 14gl and the source lines 24sl; color filters with multiple colors including a red layer, a green layer, and a blue layer that are periodically arranged in the grid rectangles of the black matrix; an overcoat layer that is formed from transparent insulating resin and covers the black matrix and the color filters; and columnar photo spacers disposed on the overcoat layer.

<Operation of Liquid Crystal Display Device S>

In each pixel of the liquid crystal display device S having the above structure, a gate signal is sent from the corresponding gate driver IC chip 53 to the gate electrode 14*gd* via the gate line 14*gl*, whereby the TFT 26 is turned on. Then, a source signal is sent from the corresponding source driver IC chip 54 to the source electrode 24*sd* via the source line 24*sl*, whereby a predetermined charge is written in the pixel electrode 30*pd* via the oxide semiconductor layer 18*sl* and the drain electrode 24*dd* while the storage capacitance element 27 is charged. Here, a potential difference is caused between the pixel electrode 30*pd* and the common electrode 30*cd*, whereby a predetermined voltage is applied to the liquid crystal layer 52. When the TFT 26 is turned off, the storage capacitance formed in the storage capacitance element 27 holds the voltage written in the pixel electrode 30*pd* so as not to be reduced. In each pixel of the liquid crystal display device S, the alignment of liquid crystal molecules is changed according to the magnitude of the voltage applied to the liquid crystal layer 52 to control the light transmittance of the liquid crystal layer 52, whereby an image is displayed.

Production Method

Figure 6:
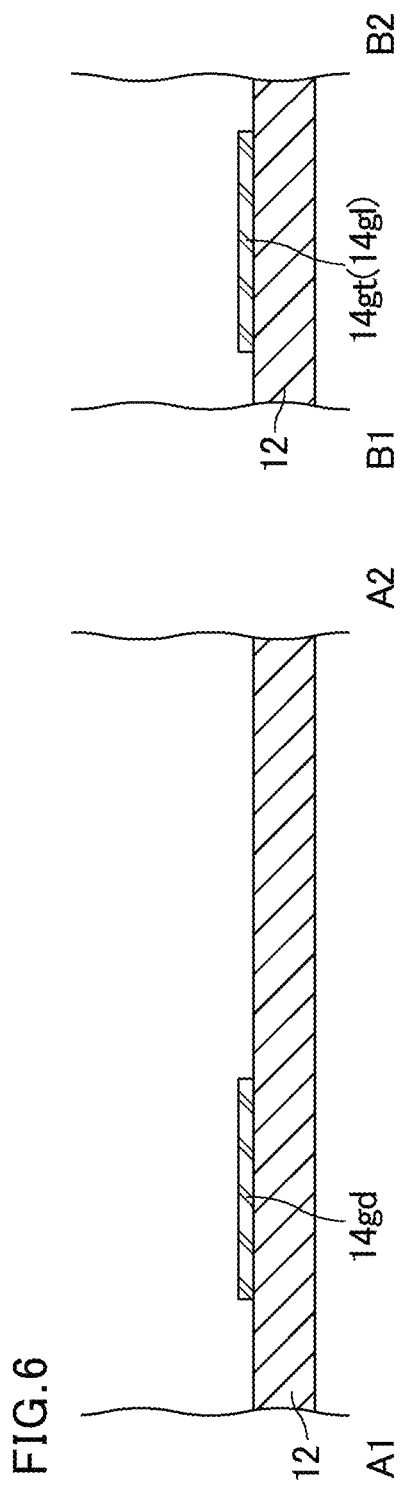
FIG. 6 includes schematic cross-sectional views of the regions shown in FIG. 4, each showing a state where a gate electrode is formed in first patterning in production of the TFT substrate of Embodiment 1.
Figure 7:
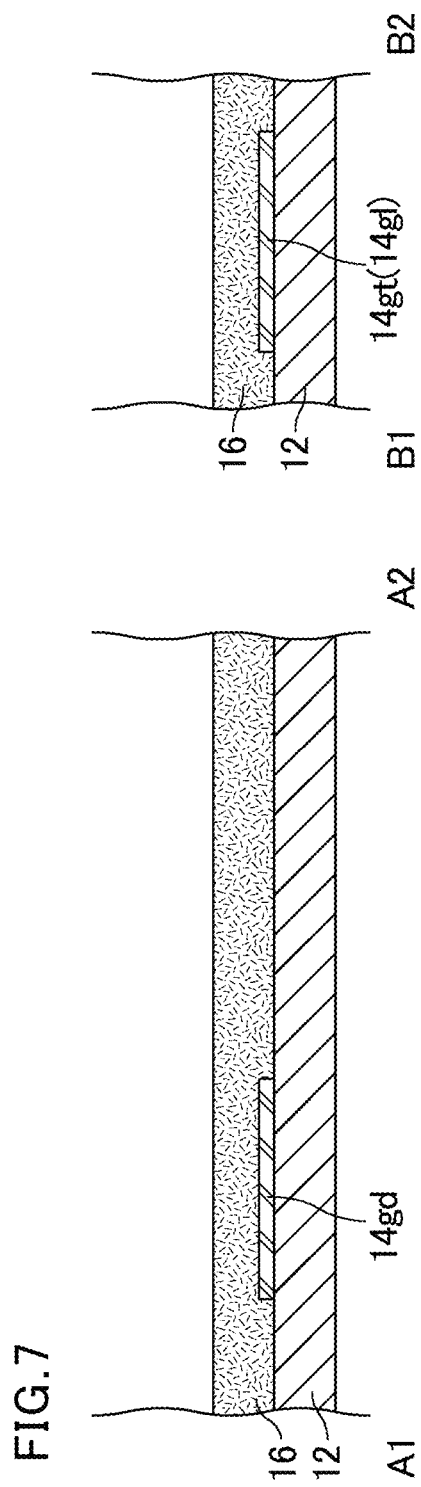
FIG. 7 includes schematic cross-sectional views of the regions shown in FIG. 4, each showing a state where a gate insulating layer is formed in formation of a gate insulating layer in production of the TFT substrate of Embodiment 1.
Figure 12:
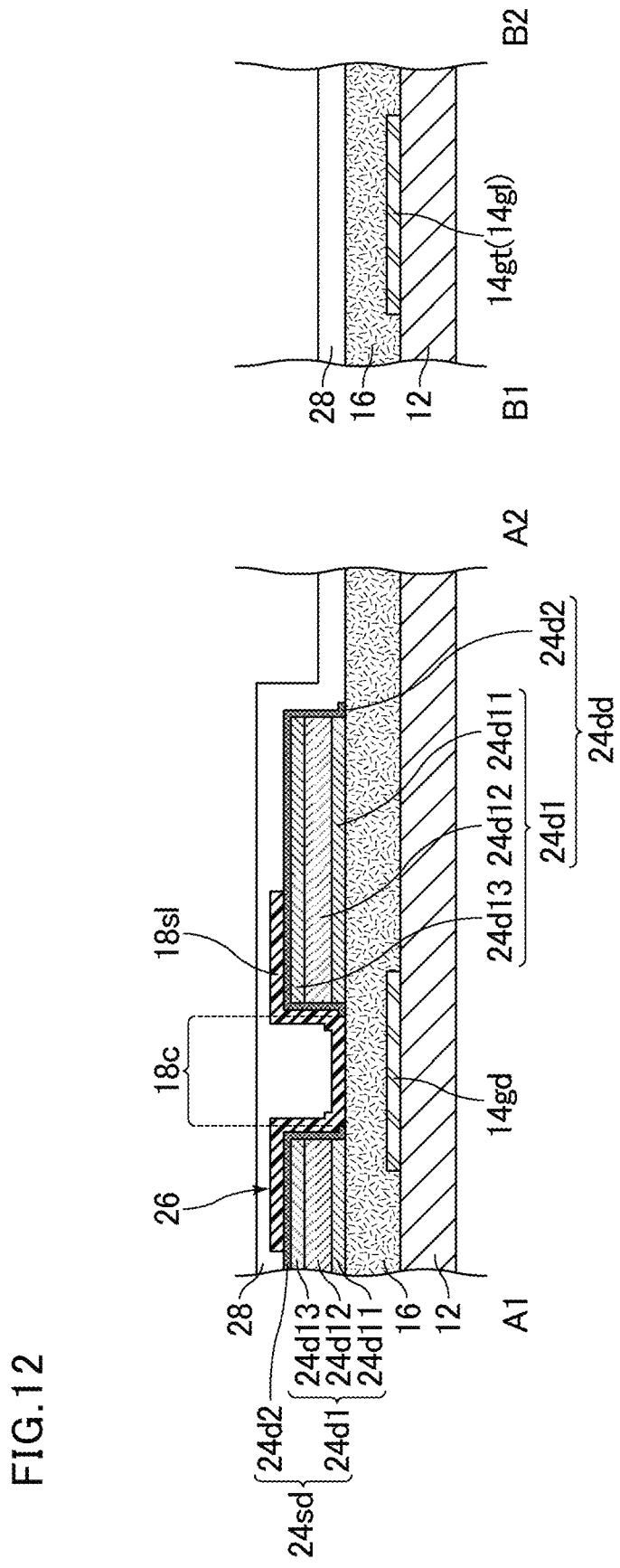
FIG. 12 includes schematic cross-sectional views of the regions shown in FIG. 4, each showing a state where a protective insulating layer formed from silicon oxide is formed in fifth patterning in production of the TFT substrate of Embodiment 1.
Figure 13:
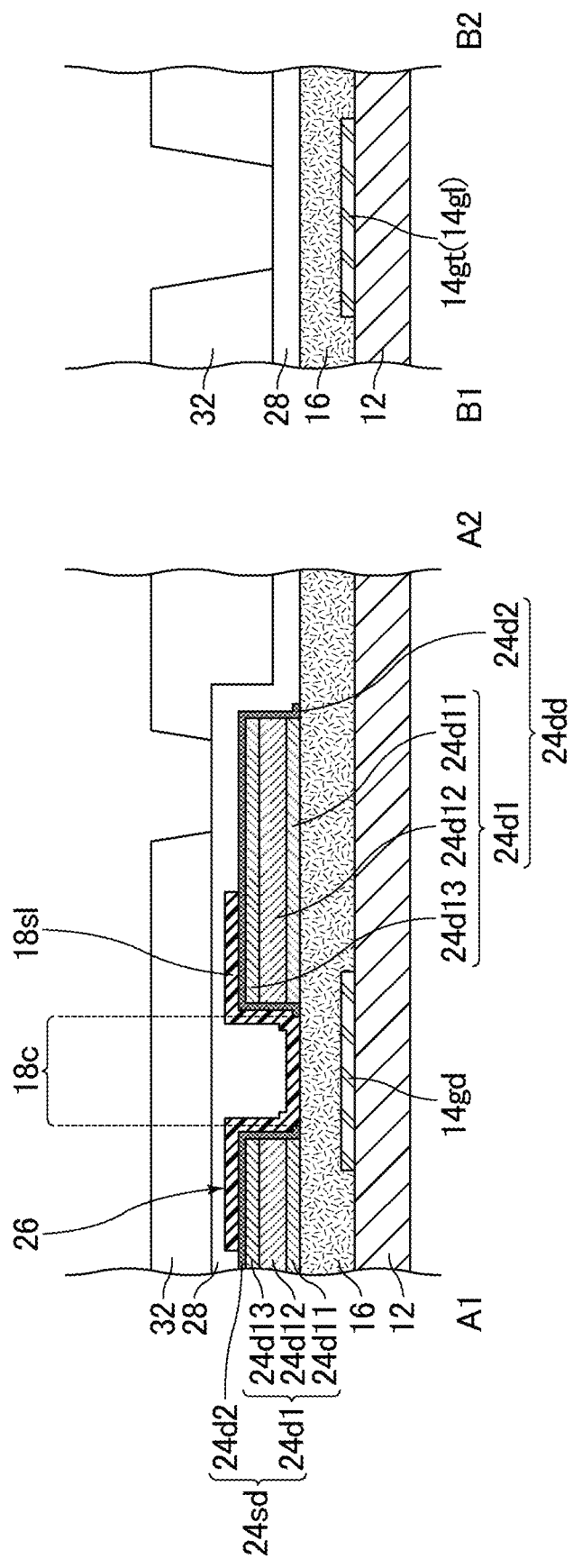
FIG. 13 includes schematic cross-sectional views of the regions shown in FIG. 4, each showing a state where a protective insulating layer formed from transparent insulating resin is formed in the fifth patterning in production of the TFT substrate of Embodiment 1.
Figure 14:
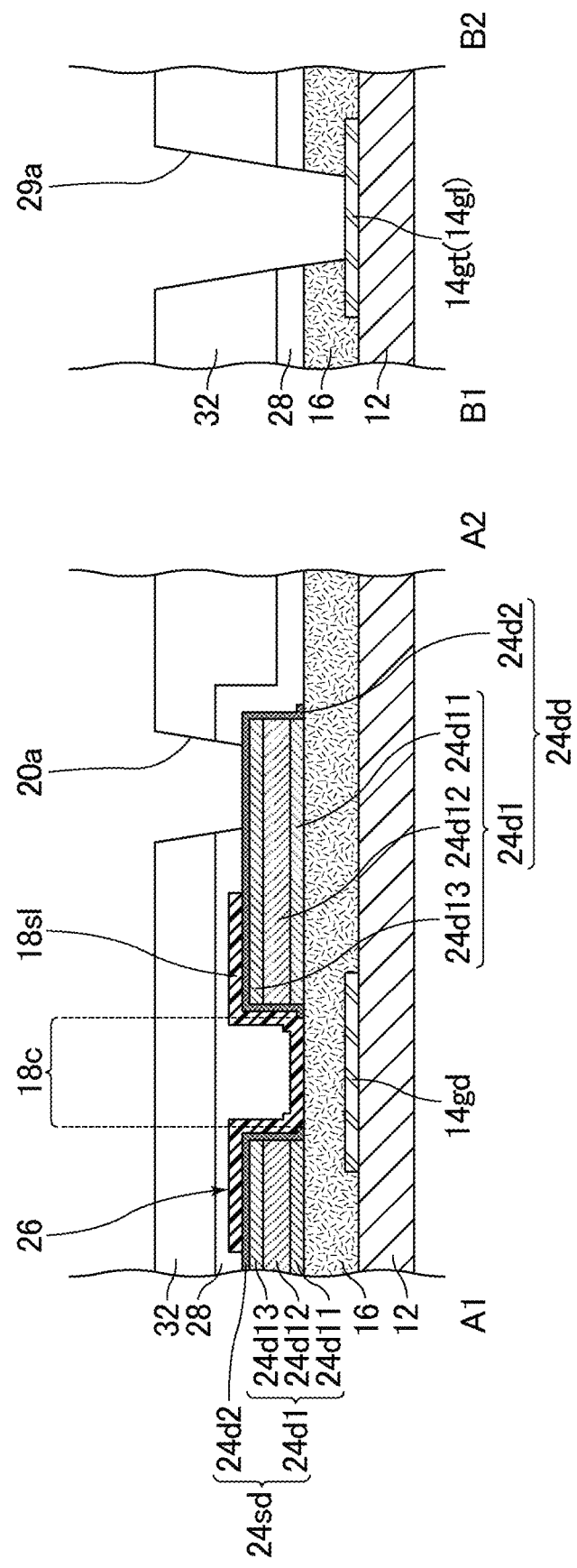
FIG. 14 includes schematic cross-sectional views of the regions shown in FIG. 4, each showing a state where a contact hole is formed in the gate insulating layer and in the protective insulating layer formed from silicon oxide in the fifth patterning in production of the TFT substrate of Embodiment 1.
Figure 15:
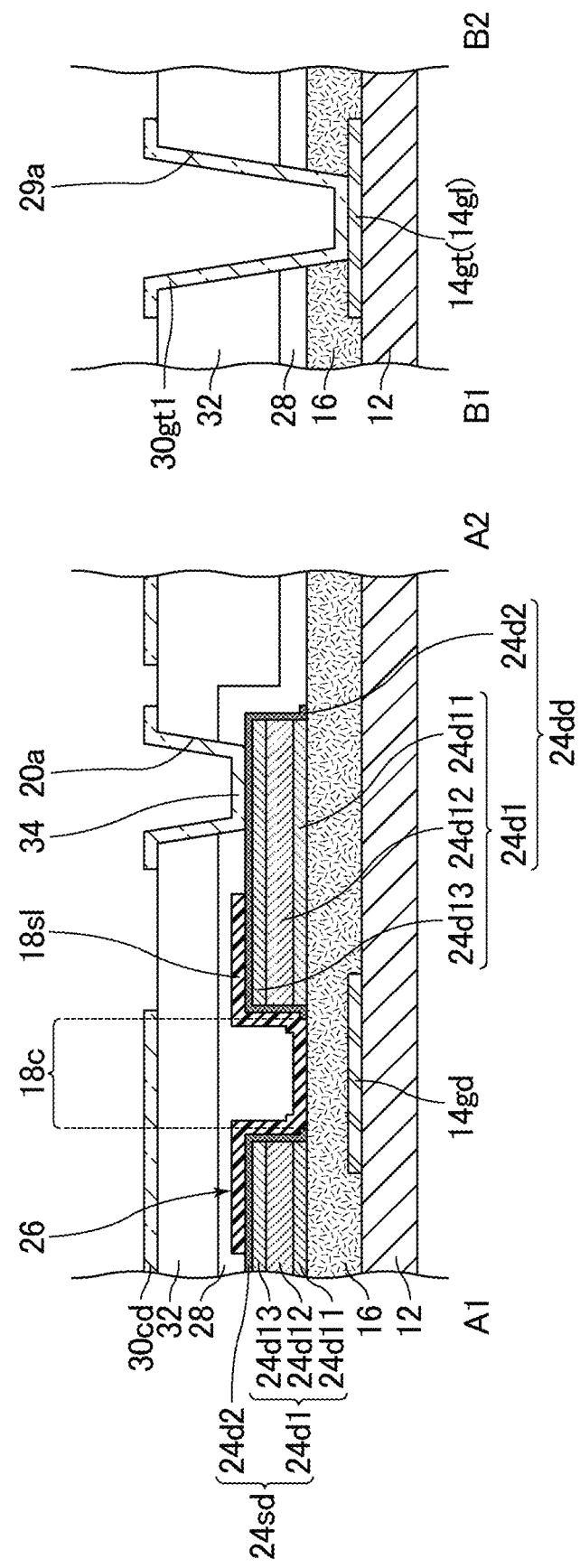
FIG. 15 includes schematic cross-sectional views of the regions shown in FIG. 4, each showing a state where a common electrode is formed in sixth patterning in production of the TFT substrate of Embodiment 1.
Figure 16:
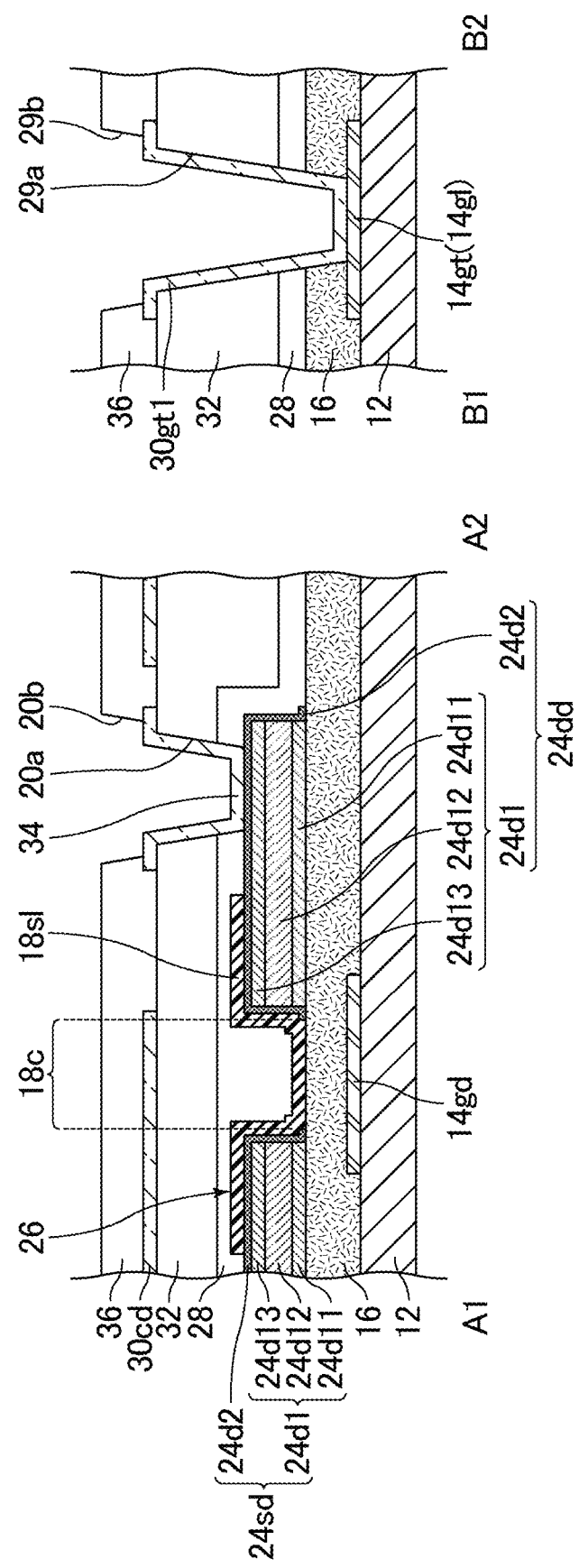
FIG. 16 includes schematic cross-sectional views of the regions shown in FIG. 4, each showing a state where a protective insulating layer formed from a silicon oxide film or a silicon nitride film is formed in seventh patterning in production of the TFT substrate of Embodiment 1.

An exemplary method for producing the TFT substrate 10 and the liquid crystal display device S is described with reference to FIG. 6 to FIG. 16. FIG. 6 includes schematic cross-sectional views of the regions shown in FIG. 4, each showing a state where a gate electrode is formed in first patterning in production of the TFT substrate of Embodiment 1. FIG. 7 includes schematic cross-sectional views of the regions shown in FIG. 4, each showing a state where a gate insulating layer is formed in formation of a gate insulating layer in production of the TFT substrate of Embodiment 1. FIG. 8 includes schematic cross-sectional views of the regions shown in FIG. 4, each showing a state where a first conductive film is patterned in second patterning in production of the TFT substrate of Embodiment 1. FIG. 9 includes schematic cross-sectional views of the regions shown in FIG. 4, each showing a state where a second conductive film is formed in third patterning in production of the TFT substrate of Embodiment 1. FIG. 10 includes schematic cross-sectional views of the regions shown in FIG. 4, each showing a state where the second conductive film is patterned in the third patterning in production of the TFT substrate of Embodiment 1. FIG. 11 includes schematic cross-sectional views of the regions shown in FIG. 4, each showing a state where an oxide semiconductor layer is formed in fourth patterning in production of the TFT substrate of Embodiment 1. FIG. 12 includes schematic cross-sectional views of the regions shown in FIG. 4, each showing a state where a protective insulating layer formed from silicon oxide is formed in fifth patterning in production of the TFT substrate of Embodiment 1. FIG. 13 includes schematic cross-sectional views of the regions shown in FIG. 4, each showing a state where a protective insulating layer formed from transparent insulating resin is formed in the fifth patterning in production of the TFT substrate of Embodiment 1. FIG. 14 includes schematic cross-sectional views of the regions shown in FIG. 4, each showing a state where a contact hole in formed in the gate insulating layer and in the protective insulating layer formed from silicon oxide in the fifth patterning in production of the TFT substrate of Embodiment 1. FIG. 15 includes schematic cross-sectional views of the regions shown in FIG. 4, each showing a state where a common electrode is formed in sixth patterning in production of the TFT substrate of Embodiment 1. FIG. 16 includes schematic cross-sectional views of the regions shown in FIG. 4, each showing a state where a protective insulating layer formed from a silicon oxide film or a silicon nitride film is formed in seventh patterning in production of the TFT substrate of Embodiment 1.

The method for producing the liquid crystal display device S of the present embodiment includes production of a TFT substrate, production of a counter substrate, attaching, and mounting.

<Production of TFT Substrate>

The production of a TFT substrate includes first patterning, formation of a gate insulating layer, second patterning, third patterning, hydrofluoric acid treatment, fourth patterning, fifth patterning, sixth patterning, seventh patterning, and eighth patterning in the stated order.

<First Patterning>

The insulating substrate 12 such as a glass substrate is prepared in advance. Then, films such as an aluminum film (e.g., thickness: about 200 nm) and a molybdenum film (e.g., thickness: about 100 nm) are stacked thereon in the stated order by sputtering to form a laminated conductive film. Then, a resist pattern is formed on the laminated conductive film in the regions for forming the gate line 14*gl*, the gate electrode 14*gd*, and the gate terminal 14*gt* by photolithography using a first photomask. Using the resist pattern as a mask, the laminated conductive film is patterned by reactive ion etching (hereinafter, abbreviated as RIE). The RIE is a kind of dry etching and uses a chlorine-based gas. The resist pattern is removed with a resist stripper and the workpiece is washed. Thereby, the gate line 14*gl*, the gate electrode 14*gd*, and the gate terminal 14*gt* are simultaneously formed as shown in FIG. 6.

<Formation of Gate Insulating layer>

On the substrate having the gate electrode 14*gd* and the gate terminal 14*gt* are formed a silicon nitride film (e.g., thickness: about 350 nm) and a silicon oxide film (e.g., thickness: about 50 nm) in the stated order by CVD to form the gate insulating layer 16 as shown in FIG. 7.

<Second Patterning>

On the substrate having the gate insulating layer 16 are formed a molybdenum nitride film or a titanium film (e.g., thickness: about 50 nm), an aluminum film or a copper film (e.g., thickness: about 300 nm), and a molybdenum nitride film or a titanium film (e.g., thickness: about 100 nm) in the stated order by sputtering to form a first conductive film having a three-layer laminate structure. The first conductive film is patterned using a second photomask, whereby the first conductive layer 24*d*1 is formed as shown in FIG. 8 in which a lower layer 24*d*11 formed from molybdenum nitride or titanium, a middle layer 24*d*12 formed from an aluminum film or a copper film, and an upper layer 24*d*13 formed from molybdenum nitride or titanium are stacked in the stated order from the insulating substrate 12 side.

The lower layer 24*d*11 may be formed from molybdenum nitride, the middle layer 24*d*12 may be formed from aluminum or copper, and the upper layer 24*d*13 may be formed from molybdenum nitride. In this case, in the second patterning, a first conductive film in which a molybdenum nitride film, an aluminum film or a copper film, and a molybdenum nitride film are stacked in the stated order from the insulating substrate 12 side is patterned by wet etching with a mixed acid solution containing a phosphoric acid, acetic acid, and nitric acid, for example.

Alternatively, the lower layer 24*d*11 may be formed from titanium, the middle layer 24*d*12 may be formed from aluminum or copper, and the upper layer 24*d*13 may be formed from titanium. In this case, in the second patterning, a first conductive film in which a titanium film, an aluminum film or a copper film, and a titanium film are stacked in the stated order from the insulating substrate 12 side is patterned by dry etching, for example. When the dry etching is performed by RIE, for example, the RIE is performed using as a raw material gas a mixed gas containing $Cl_2$ (flow rate: about 100 sccm) and $BCl_3$ (flow rate: about 100 sccm) at a chamber pressure of about 4 Pa and at a high frequency power of about 1100 W, for example.

<Third Patterning>

On the substrate having the first conductive layer 24d1 is formed a second conductive film 24d20 formed from a molybdenum film or a molybdenum nitride film (e.g., thickness: about 100 nm) by sputtering as shown in FIG. 9. The second conductive film is patterned using a third photomask, whereby the source electrode 24sd formed from the first conductive layer 24d1 and the second conductive layer 24d2 covering the first conductive layer 24d1 and the drain electrode 24dd formed from the first conductive layer 24d1 and the second conductive layer 24d2 covering the first conductive layer 24d1 are formed as shown in FIG. 10. In the present embodiment, a molybdenum film or a molybdenum nitride film is formed as the second conductive film. The second conductive film is a film containing at least one element selected from the group consisting of molybdenum, tantalum, tungsten, and nickel. Specific examples of the second conductive film include, in addition to a molybdenum film and a molybdenum nitride film, a film formed from a molybdenum alloy, a film formed from a nitride of the molybdenum alloy, a tantalum film, a tantalum nitride film, a film formed from a tantalum alloy, a film formed from a nitride of the tantalum alloy, a tungsten film, a tungsten nitride film, a film formed from a tungsten alloy, a film formed from a nitride of the tungsten alloy, a nickel film, a nickel nitride film, a film formed from a nickel alloy, and a film formed from a nitride of the nickel alloy.

<Hydrofluoric Acid Treatment>

The gate insulating layer 16 side surface of the insulating substrate 12 is treated with hydrofluoric acid, whereby the surface of the gate insulating layer 16 is removed (modified) in the region between the source electrode 24sd and the drain electrode 24dd. Thereby, the surface of the gate insulating layer 16 in the region between the source electrode 24sd and the drain electrode 24dd, which may be contaminated during formation of the source electrode 24sd and the drain electrode 24dd, can be removed (modified) before the oxide semiconductor layer 18sl is formed in the fourth patterning. This can stabilize the threshold value among the TFT properties and prevent or reduce a reduction in on-state current to achieve stable TFT properties. In the present embodiment, the source electrode 24sd and the drain electrode 24dd include on their top surfaces the second conductive layer 24d2 that contains at least one element selected from the group consisting of molybdenum, tantalum, tungsten, and nickel. When the conductive layer contains at least one element selected from the group consisting of molybdenum, tantalum, tungsten, and nickel, the conductive layer has hydrofluoric acid resistance. Accordingly, even when the hydrofluoric acid treatment is performed after formation of the source electrode 24sd and the drain electrode 24dd, the conductive layer can prevent the source electrode 24sd and the drain electrode 24dd from being etched. This can resultantly achieve less variation in channel length of the TFT 26 in the substrate plane. Thereby, the TFT properties can further be stabilized.

The hydrofluoric acid treatment after formation of the source electrode 24sd and the drain electrode 24dd may be performed at a hydrofluoric acid concentration of 0.1% or higher and 20% or lower and at a temperature of 20 degrees or higher and 40 degrees or lower, for example.

<Fourth Patterning>

Then, an oxide semiconductor film (e.g., thickness: about 70 nm) formed from an In—Ga—Zn—O-based oxide semiconductor is formed by sputtering so as to cover the source electrode 24sd and the drain electrode 24dd. Then, a resist pattern is formed for the oxide semiconductor film by photolithography using a first photomask. Using the resist pattern as a mask, the oxide semiconductor film is patterned by wet etching with an oxalic acid liquid. The resist pattern is removed with a resist stripper and the workpiece is washed. Thereby, the oxide semiconductor layer 18sl is formed as shown in FIG. 11.

<Fifth Patterning (Formation of Protective Insulating Layer and Annealing)>

On the substrate having the source electrode 24sd and the drain electrode 24dd is formed a silicon oxide film by CVD to form the protective insulating layer 28 (e.g., thickness: about 270 nm) as shown in FIG. 12.

The substrate having the protective insulating layer 28 is subjected to high temperature anneal treatment in an annealing chamber with an oxygen-containing atmosphere at a temperature of about 100° C. to about 450° C. and at an atmospheric pressure using an oxygen gas as a carrier gas. The protective insulating layer 28 formed from silicon oxide generally has a higher oxygen transmittance than a silicon nitride film, for example. Thus, oxygen used in the anneal treatment is effectively supplied to the channel region 18c of the oxide semiconductor layer 18sl. Even when the channel region 18c of the oxide semiconductor layer 18sl has been exposed to plasma by the CVD for forming the protective insulating layer 28 and thereby oxygen in the channel region 18c has been lost, the anneal treatment after formation of the protective insulating layer 28 can supplement the oxygen deficiency in the oxide semiconductor layer 18sl, whereby the properties of the oxide semiconductor layer 18sl can be stabilized.

On the substrate after the anneal treatment is formed a transparent insulating resin film (e.g., thickness: about 2 μm) formed from a positive photosensitive acrylic transparent resin by spin coating or slit coating. Then (after pre-baking), the regions for forming the contact holes 20a, 29a, and 29c and the regions to be removed are exposed to light by photolithography using a fifth photomask and developed, whereby patterning is performed. In order to make the resin transparent (bleached), the entire surface is exposed to light at an exposure dose of 280 to 350 $mJ/cm^2$ and then post-baked at 200° C. to 230° C., whereby the protective insulating layer 32 is formed as shown in FIG. 13.

Using the pattern of the protective insulating layer 32 as a mask, the gate insulating layer 16 and the protective insulating layer 28 are patterned by reactive ion etching (hereinafter, abbreviated to RIE) using a fluorine-based gas, whereby the contact holes 20a, 29a, and 29c are formed as shown in FIG. 3 and FIG. 14. In the present embodiment, the protective insulating layer 28 is patterned using the pattern of the protective insulating layer 32 as a mask. Alternatively, before formation of the protective insulating layer 32, a resist pattern may be formed by conventional photolithography using a photomask, and the protective insulating layer 28 may be patterned using this resist pattern as a mask. Alternatively, after formation of the protective insulating layers 28 and 32, a resist pattern may be formed by conventional photolithography using a photomask, and the protective insulating layers 28 and 32 may be patterned using this resist pattern as a mask.

<Sixth Patterning>

On the substrate having the patterned protective insulating layers 28 and 32 is formed a transparent conductive film such as an ITO film or an IZO film (e.g., thickness: about 70 nm) by sputtering. Then, a resist pattern is formed on the transparent conductive film in the regions for forming the common electrode 30cd, the connection electrode 34, the gate connection electrode 30gt1, and the source connection electrode 30st1 by photolithography using a sixth photomask. Using the resist pattern as a mask, the transparent conductive film is patterned by wet etching with an oxalic acid liquid. The resist pattern is removed with a resist stripper and the workpiece is washed. Thereby, the common electrode 30cd, the connection electrode 34, the gate connection electrode 30gt1, and the source connection electrode 30st1 are formed as shown in FIG. 15.

<Seventh Patterning>

On the substrate having members such as the common electrode 30cd and the connection electrode 34, a silicon oxide film or a silicon nitride film is formed by CVD to form the protective insulating layer 36 (e.g., thickness: about 300 nm).

On the substrate having the protective insulating layer 36 is formed a resist pattern with openings in the regions for forming the contact holes 20b, 29b, and 29d by photolithography using a seventh photomask. Using the resist pattern as a mask, the protective insulating layer 36 is patterned by RIE with a fluorine-based gas. The resist pattern is removed with a resist stripper and the workpiece is washed. Thereby, the contact holes 20b, 29b, and 29d are formed as shown in FIG. 3 and FIG. 16.

<Eighth Patterning>

On the substrate having the contact holes 20b, 29b, and 29d, a transparent conductive film such as an ITO film or an IZO film (e.g., thickness: about 70 nm) is formed by sputtering. Then, a resist pattern is formed on the transparent conductive film in the regions for forming the pixel electrode 30pd, the gate connection electrode 30gt2, and the source connection electrode 30st2 by photolithography using an eighth photomask. Using the resist pattern as a mask, the transparent conductive film is patterned by wet etching with an oxalic acid liquid. The resist pattern is removed with a resist stripper and the workpiece is washed. Thereby, the pixel electrode 30pd, the gate connection electrode 30gt2, and the source connection electrode 30st2 are formed.

These steps provide the TFT substrate 10 shown in FIG. 4.

Figure 17:
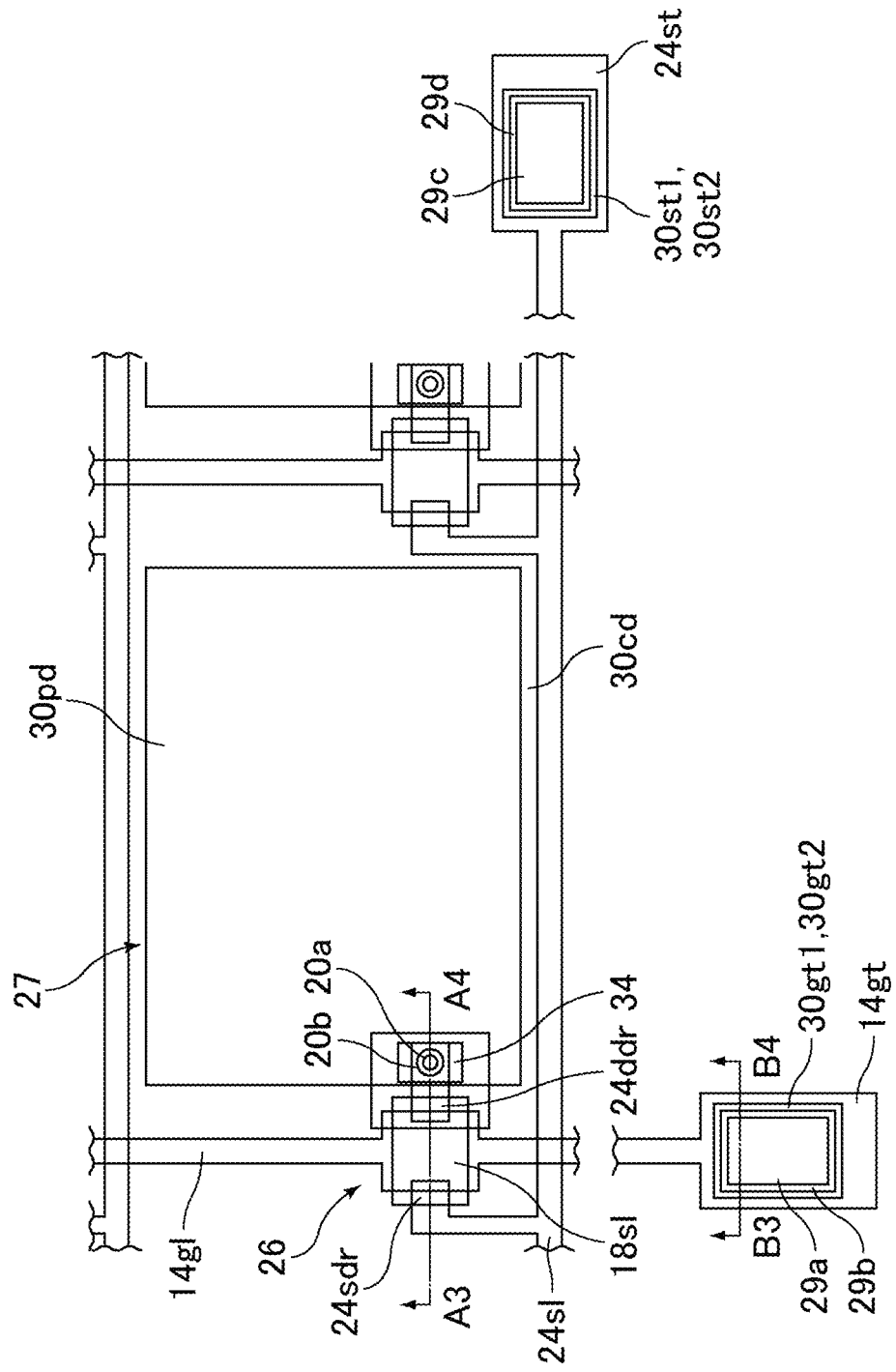
FIG. 17 is a schematic plan view showing the structures of one pixel and ends of lines on a TFT substrate of Comparative Embodiment 1.
Figure 18:
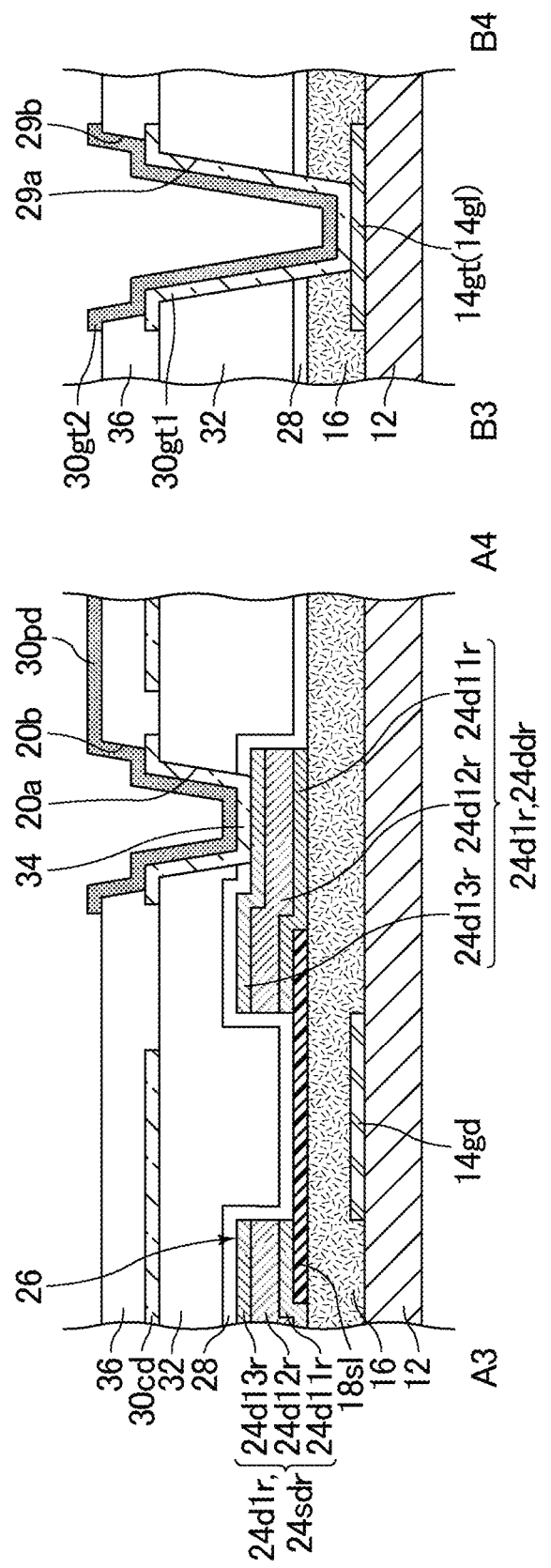
FIG. 18 includes schematic cross-sectional views taken along the line A3-A4 and the line B3-B4 in FIG. 17.

Here, a comparative embodiment is given and the difference from the present embodiment is described. FIG. 17 is a schematic plan view showing the structures of one pixel and ends of lines on a TFT substrate of Comparative Embodiment 1. FIG. 18 includes schematic cross-sectional views taken along the line A3-A4 and the line B3-B4 in FIG. 17. FIG. 18 shows, from left, a schematic cross-sectional view taken along the line A3-A4 in FIG. 17 and a schematic cross-sectional view taken along the line B3-B4 in FIG. 17.

The TFT substrate of the present embodiment is a bottom-contact substrate, while the TFT substrate of Comparative Embodiment 1 is a top-contact substrate as shown in FIG. 17 and FIG. 18. The TFT substrate of Comparative Embodiment 1 has the same structure as that of the TFT substrate 10 of the present embodiment except for the position of the oxide semiconductor layer 18sl and the structures of a source electrode 24sdr and a drain electrode 24ddr. The oxide semiconductor layer 18sl of the TFT substrate of Comparative Embodiment 1 is disposed between the gate insulating layer 16 and the source electrodes 24sdr and between the gate insulating layer 16 and the drain electrodes 24ddr.

The source electrode 24sdr and the drain electrode 24ddr of the TFT substrate of Comparative Embodiment 1 are each formed from a first conductive layer 24d1r. The first conductive layer 24d1r has a laminate structure including a lower layer 24d11r, a middle layer 24d12r, and an upper layer 24d13r stacked in the stated order from the insulating substrate 12 side. Specific examples of the structure of the first conductive layer 24d1r include a structure in which the lower layer 24d11r formed from titanium, the middle layer 24d12r formed from aluminum or copper, and the upper layer 24d13r formed from titanium are stacked (hereinafter, also referred to as Specific Example 1 of Comparative Embodiment 1), and a structure in which the lower layer 24d11r formed from titanium, the middle layer 24d12r formed from aluminum or copper, and the upper layer 24d13r formed from molybdenum or molybdenum nitride are stacked (hereinafter, also referred to as Specific Example 2 of Comparative Embodiment 1).

Figure 21:
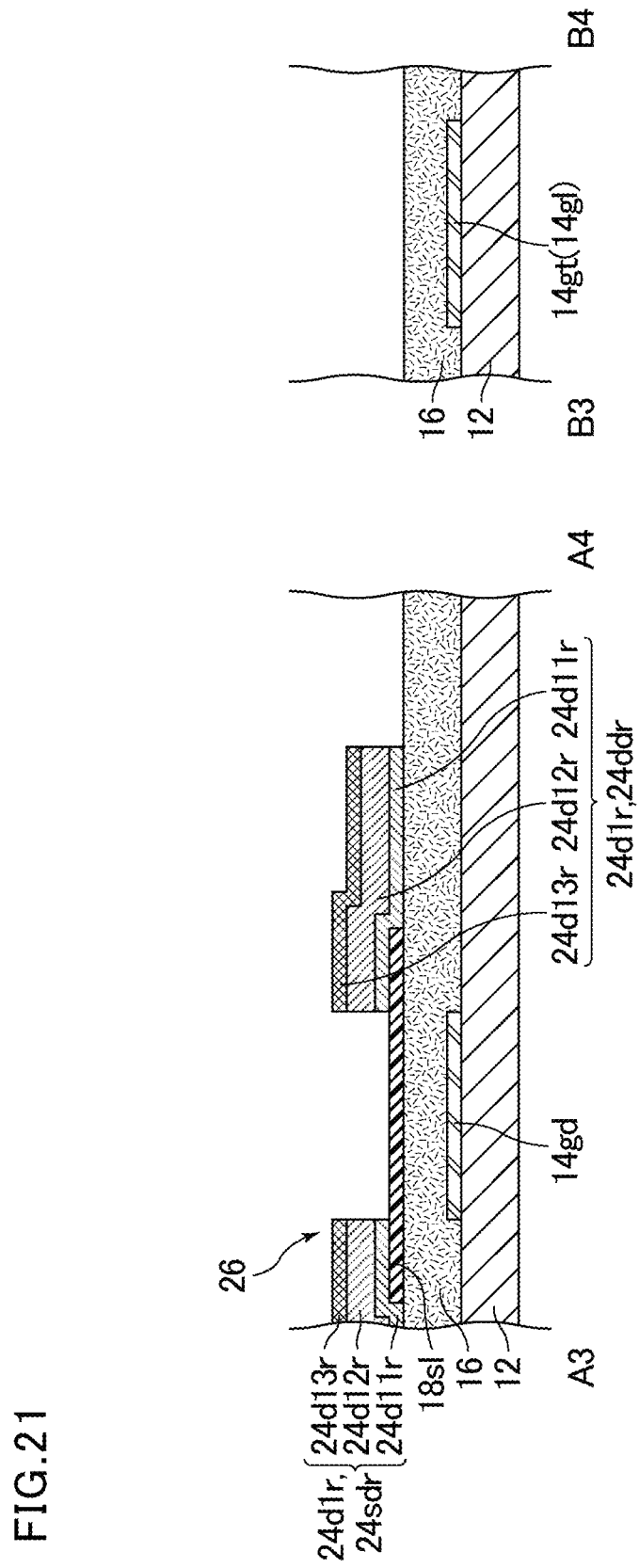
FIG. 21 includes schematic cross-sectional views of the regions shown in FIG. 18, each showing a production process of the TFT substrate of Specific Example 2 of Comparative Embodiment 1.

FIG. 19 includes schematic cross-sectional views of the regions shown in FIG. 18, each showing a production process of the TFT substrate of Specific Example 1 of Comparative Embodiment 1. FIG. 20 and FIG. 21 each include schematic cross-sectional views of the regions shown in FIG. 18, each showing a production process of the TFT substrate of Specific Example 2 of Comparative Embodiment 1. In production of the TFT substrate of Comparative Embodiment 1, the gate lines 14gl, the gate electrodes 14gd, and the gate terminals 14gt are formed, the gate insulating layer 16 is formed, and then the oxide semiconductor layer 18sl is formed. Next, the first conductive film as a material of the first conductive layer 24d1r is formed and then etched to form the source electrodes 24sdr and the drain electrodes 24dd. In the case of Specific Example 1 of Comparative Embodiment 1, the first conductive film is etched by dry etching. Here, as shown in FIG. 19, the channel portion of each TFT suffers plasma damage by the dry etching. The TFT properties are thereby degraded, and thus the threshold value is significantly reduced to have a negative value. As a result, the TFT fails to function as a switching element. In the case of Specific Example 2 of Comparative Embodiment 1, as shown in FIG. 20, a molybdenum film or a molybdenum nitride film (corresponding to the upper layer 24d13r) and an aluminum film or a copper film (corresponding to the middle layer 24d12r) of the first conductive film are etched by wet etching using a mixed acid solution containing phosphoric acid, acetic acid, and nitric acid. Then, as shown in FIG. 21, a titanium film (corresponding to the lower layer 24d11r) is etched by dry etching. Here, similarly to Specific Example 1 of Comparative Embodiment 1, the channel portion of each TFT suffers plasma damage by the dry etching. The TFT properties are thereby degraded and the threshold value is significantly reduced to have a negative value. As a result, the TFT fails to function as a switching element.

In contrast, in the method for producing the TFT substrate 10 of the present embodiment, as mentioned above, the surface of the gate insulating layer 16 in the TFT channel portion can be modified while preventing the channel side end of each source electrode 24sd and the channel side end of each drain electrode 24dd from being etched. As a result, the threshold value among the TFT properties can be stable to prevent malfunction of the switching element.

<Production of Counter Substrate>

To an insulating substrate such as a glass substrate is applied a black photosensitive resin by spin coating or slit coating, for example. The applied film is exposed to light using a photomask and then developed to be patterned, whereby a black matrix is formed.

To the substrate having the black matrix is applied a red, green, or blue negative acrylic photosensitive resin, for example. The applied film is exposed to light using a photomask and then developed to be patterned, whereby a color layer in the selected color (e.g., red layer) is formed. Two color layers in other two colors (e.g., green layer and blue layer) are formed in the same manner as above, whereby color filters are formed.

On the substrate having the color filters is formed a transparent insulating resin film formed from acrylic transparent resin by spin coating or slit coating, for example, whereby an overcoat layer is formed.

To the substrate having the overcoat layer is applied a positive phenol novolac-based photosensitive resin by spin coating. The applied film is exposed to light using a photomask and then developed to be patterned, whereby photo spacers are formed.

These steps provide the counter substrate 50.

<Attaching>

To a surface of the TFT substrate 10 is applied a polyimide-based resin by printing. The applied film is subjected to baking and rubbing treatment, whereby an alignment film 55 is formed. Similarly, to a surface of the counter substrate 50 is applied a polyimide-based resin by printing. The applied film is subjected to baking and rubbing treatment, whereby the alignment film 56 is formed.

To the counter substrate 50 having the alignment film 56, the sealant 51 such as a combination resin having ultraviolet curability and heat curability is applied in a rectangular frame pattern using a tool such as a dispenser. Then, a predetermined amount of liquid crystal material is dropped in the region inside the sealant 51 on the counter substrate 50.

The counter substrate 50 with the dropped liquid crystal material and the TFT substrate 10 having the alignment film 55 are attached together under reduced pressure. The attached workpiece is placed under atmospheric pressure, whereby the surfaces of the attached workpiece are pressurized. The sealant 51 of the attached workpiece is irradiated with ultra violet (UV) light to be pre-cured. The attached workpiece is then heated so that the sealant 51 is post-cured, whereby the TFT substrate 10 and the counter substrate 50 are bonded.

Then, polarizing plates 57 and 58 are attached to the respective outer surfaces of the TFT substrate 10 and the counter substrate 50 that are bonded to each other.

<Mounting>

ACFs are placed in the terminal region 10$a$ of the attached workpiece whose surfaces are covered with the polarizing plates 57 and 58. Then, the gate driver IC chips 53 and the source driver IC chips 54 are mounted on the ACFs in the terminal region 10$a$ of the attached workpiece by thermo-compression bonding.

These steps provide the liquid crystal display device S.

Embodiment 2

In the present embodiment, the characteristic features of the present embodiment are mainly described and the same points as in Embodiment 1 are not described. The components having the same or a similar function have the same reference numerals in both the present embodiment and Embodiment 1, and such components are not described in the present embodiment. The present embodiment is substantially the same as Embodiment 1 except that the TFTs include an etching stopper layer, as described below.

<Structure of TFT Substrate 10>

Figure 22:
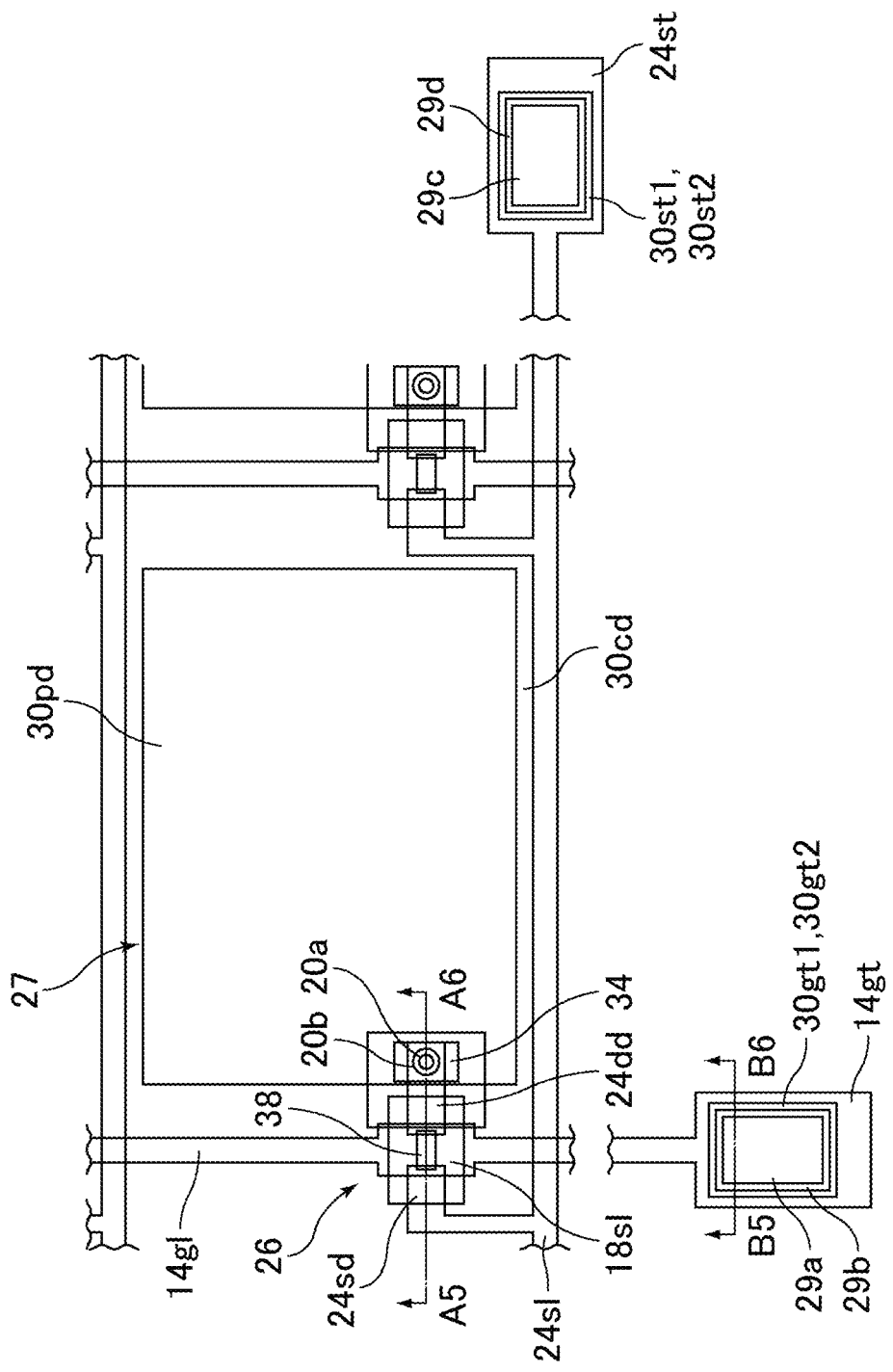
FIG. 22 is a schematic plan view showing the structures of one pixel and ends of lines on a TFT substrate of Embodiment 2.
Figure 23:
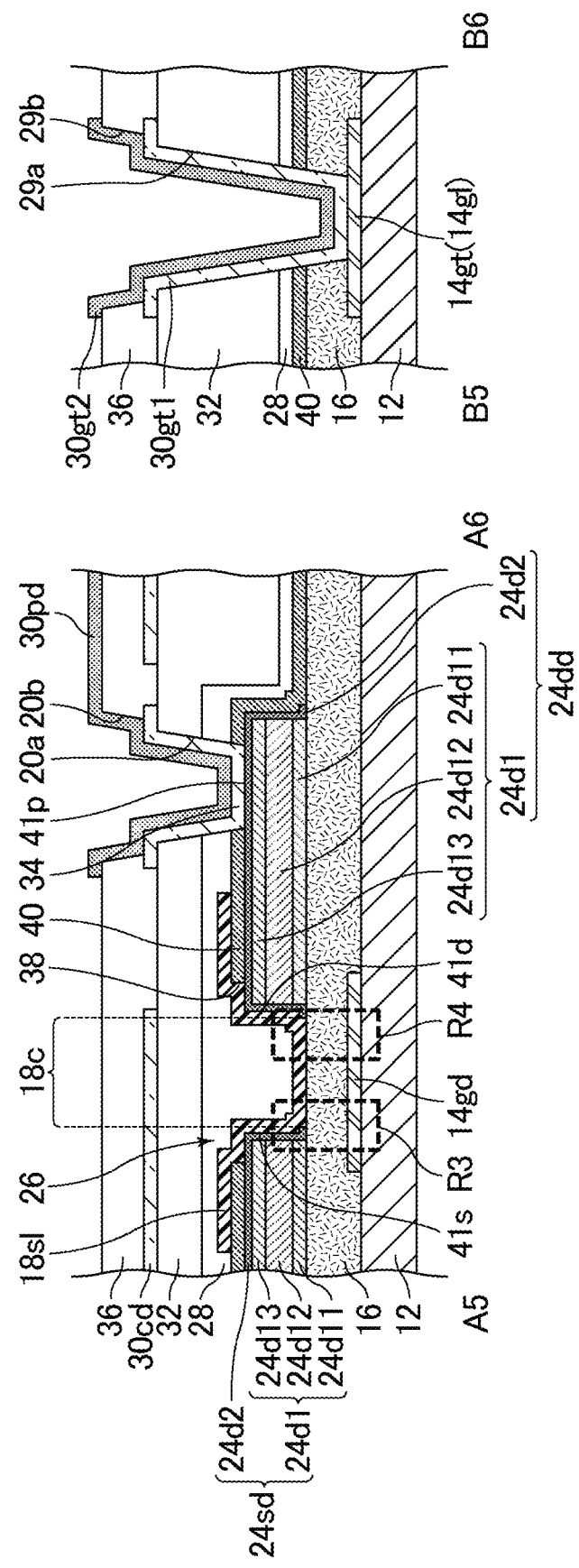
FIG. 23 includes schematic cross-sectional views taken along the line A5-A6 and the line B5-B6 in FIG. 22.

FIG. 22 and FIG. 23 show schematic structure views of the TFT substrate 10 of the present embodiment. FIG. 22 is a schematic plan view showing the structures of one pixel and ends of lines on the TFT substrate of Embodiment 2. FIG. 23 includes schematic cross-sectional views taken along the line A5-A6 and the line B5-B6 in FIG. 22. FIG. 23 shows, from left, a schematic cross-sectional view taken along the line A5-A6 in FIG. 22 and a schematic cross-sectional view taken along the line B5-B6 in FIG. 22.

In this embodiment, the TFT substrate 10 has the same planar layout as of the TFT substrate 10 of Embodiment 1 except that, as shown in FIG. 22, the later described etching stopper layer 40 has contact holes 38 each in a region overlapping the corresponding source electrode 24$sd$ and drain electrode 24$dd$.

In the TFT substrate 10, as shown in FIG. 23, the etching stopper layer 40 (e.g., thickness: about 200 nm) formed from silicon oxide ($SiO_2$) covers the source electrode 24$sd$ except for a connection portion 41$s$ between the oxide semiconductor layer 18$sl$ and the source electrode 24$sd$ and covers the drain electrode 24$dd$ except for a connection portion 41$d$ between the oxide semiconductor layer 18$sl$ and the drain electrode 24$dd$ and a connection portion 41$p$ between the pixel electrode 30$pd$ and the drain electrode 24$dd$, and the connection portions 41$s$ and 41$d$ are located in a region with the gate electrode 14$gd$. In the present embodiment, the etching stopper layer 40 is formed from $SiO_2$. Alternatively, the etching stopper layer 40 may be a laminate including a SiN film (e.g., thickness: about 100 nm) and a $SiO_2$ film (e.g., thickness: about 100 nm) stacked in the stated order from the insulating substrate 12 side, a laminate including a $SiO_2$ film (e.g., thickness: about 100 nm) and a SiN film (e.g., thickness: about 100 nm) stacked in the stated order from the insulating substrate 12 side, a SiN film (e.g., thickness: about 200 nm), or a SiON film (e.g., thickness: about 200 nm).

Here, in formation of the oxide semiconductor layer 18$sl$, when the oxide semiconductor film is etched with a mixed acid solution containing phosphoric acid, acetic acid, and nitric acid, for example, the source electrode 24$sd$ and the drain electrode 24$dd$ may also be etched with the mixed acid solution. The presence of the etching stopper layer 40 as in the present embodiment can prevent the source electrode 24$sd$ and the drain electrode 24$dd$ from being etched.

The phrase "the connection portion 41$s$ is located in a region with the gate electrode 14$gd$" means that, in a plan view, at least part of the connection portion 41$s$ is in a region with the gate electrode 14$gd$. Similarly, the phrase "the connection portion 41$d$ is located in a region with the gate electrode 14$gd$" means that, in a plan view, at least part of the connection portion 41$d$ is in a region with the gate electrode 14$gd$.

The contact hole 29$a$ for connecting the gate connection electrode 30$gt1$ is formed in the gate insulating layer 16, the etching stopper layer 40, and the protective insulating layers 28 and 32.

The etching stopper layer 40 is not present in the region between the oxide semiconductor layer 18$sl$ and the gate insulating layer 16, and the oxide semiconductor layer 18$sl$ faces the gate electrode 14$gd$ via the gate insulating layer 16.

Figure 24A:
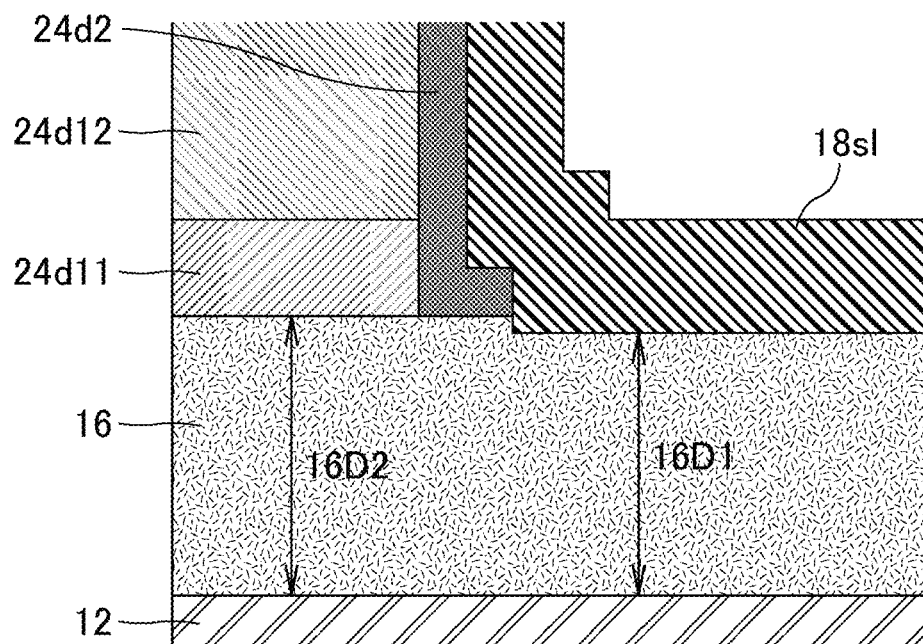
FIG. 24A is a schematic cross-sectional view of a region R3 surrounded by a broken line in FIG. 23.
Figure 24B:
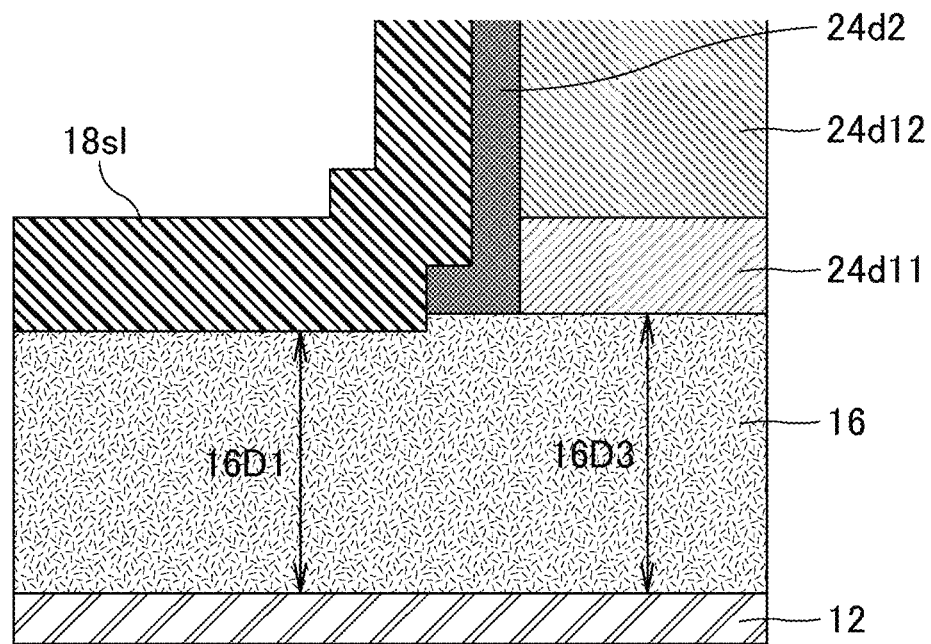
FIG. 24B is a schematic cross-sectional view of a region R4 surrounded by a broken line in FIG. 23.

FIG. 24A is a schematic cross-sectional view of the region R3 surrounded by a broken line in FIG. 23. FIG. 24B is a schematic cross-sectional view of the region R4 surrounded by a broken line in FIG. 23. The source electrode 24sd and the drain electrode 24dd each include the first conductive layer 24d1 and the second conductive layer 24d2 covering the first conductive layer 24d1. The second conductive layer 24d2 contains at least one element selected from the group consisting of molybdenum, tantalum, tungsten, and nickel. The gate insulating layer 16 may be contaminated in formation of the source electrode 24sd and the drain electrode 24dd, for example. Thereby, the threshold value among the TFT properties may be unstable to possibly cause reduced on-state current. In production of the TFT substrate 10 of the present embodiment, in order to remove contaminants on the gate insulating layer 16, for example, the surface of the gate insulating layer 16 in the region between the source electrode 24sd and the drain electrode 24dd is removed (modified) by etching with hydrofluoric acid before disposing the oxide semiconductor layer 18sl. This can stabilize the threshold value among the TFT properties and prevent or reduce a reduction in on-state current to achieve stable TFT properties. In the TFT substrate 10 of the present embodiment, the second conductive layer 24d2 contains at least one element selected from the group consisting of molybdenum, tantalum, tungsten, and nickel. When the conductive layer contains at least one element selected from the group consisting of molybdenum, tantalum, tungsten, and nickel, the conductive layer has hydrofluoric acid resistance and thus can prevent the source electrode 24sd and the drain electrode 24dd from being etched during the etching with hydrofluoric acid. This can achieve less variation in channel length of the TFT 26 in the substrate plane, and thereby can achieve less variation in carrier mobility and threshold value among the TFT properties. As a result, the TFT properties can further be stabilized.

When the surface of the gate insulating layer 16 in the region between the source electrode 24sd and the drain electrode 24dd is etched with hydrofluoric acid before disposing the oxide semiconductor layer 18sl as mentioned above, the gate insulating layer 16 in the region between the source electrode 24sd and the drain electrode 24dd is etched while the gate insulating layer 16 in the regions below the source electrode 24sd and the drain electrode 24dd is not etched. As a result, as shown in FIG. 24A and FIG. 24B, the thickness 16D1 of the gate insulating layer 16 in the region between the source electrode 24sd and the drain electrode 24dd is smaller than the thickness 16D2 of the gate insulating layer 16 in the region below the source electrode 24sd and is also smaller than the thickness 16D3 of the gate insulating layer 16 in the region below the drain electrode 24dd.

The thickness 16D1 of the gate insulating layer is, for example, 40% or greater and 99.8% or smaller of the thickness 16D2 of the gate insulating layer and 40% or greater and 99.8% or smaller of the thickness 16D3 of the gate insulating layer. The thickness 16D1 of the gate insulating layer is preferably 90% or greater and 99.5% or smaller of the thickness 16D2 of the gate insulating layer and 90% or greater and 99.5% or smaller of the thickness 16D3 of the gate insulating layer.

Production Method

Figure 27:
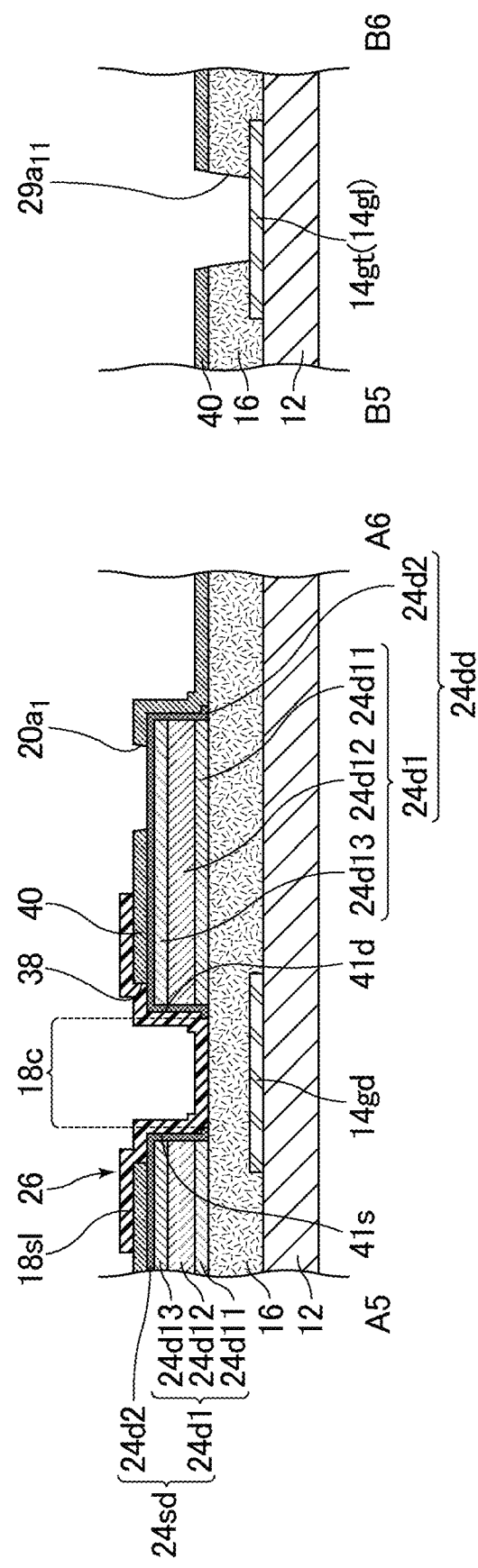
FIG. 27 includes schematic cross-sectional views of the regions shown in FIG. 23, each showing a state where a contact hole is formed in fifth patterning in production of the TFT substrate of Embodiment 2.
Figure 28:
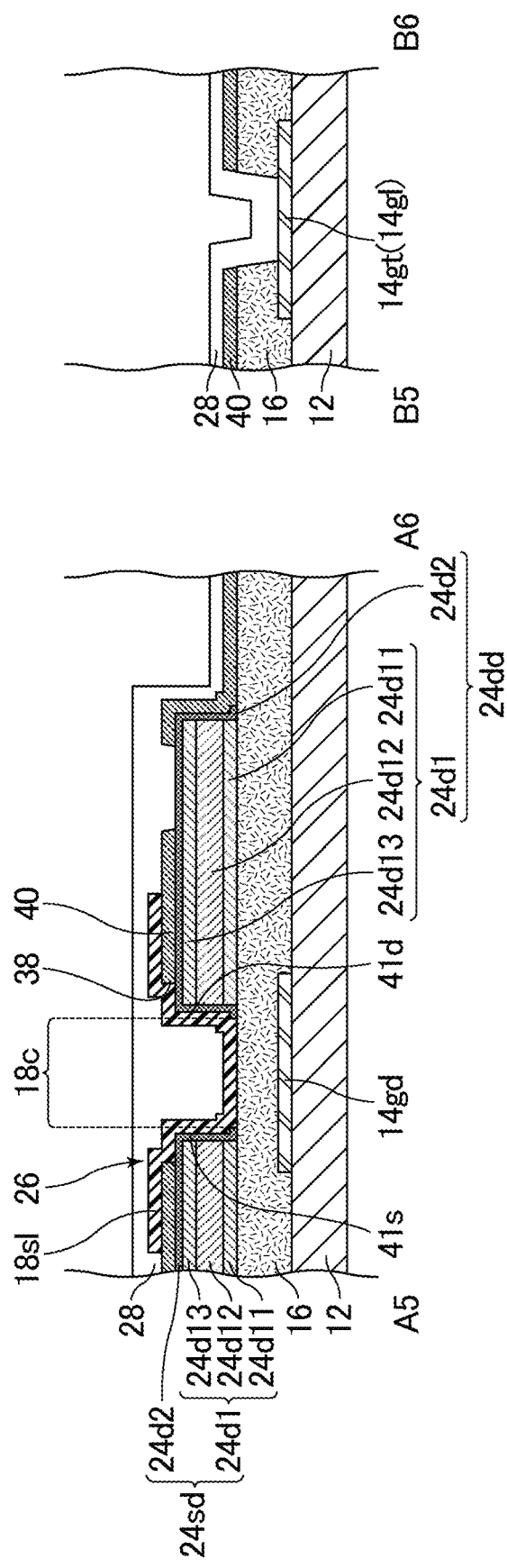
FIG. 28 includes schematic cross-sectional views of the regions shown in FIG. 23, each showing a state where a protective insulating layer formed from silicon oxide is formed in seventh patterning in production of the TFT substrate of Embodiment 2.
Figure 29:
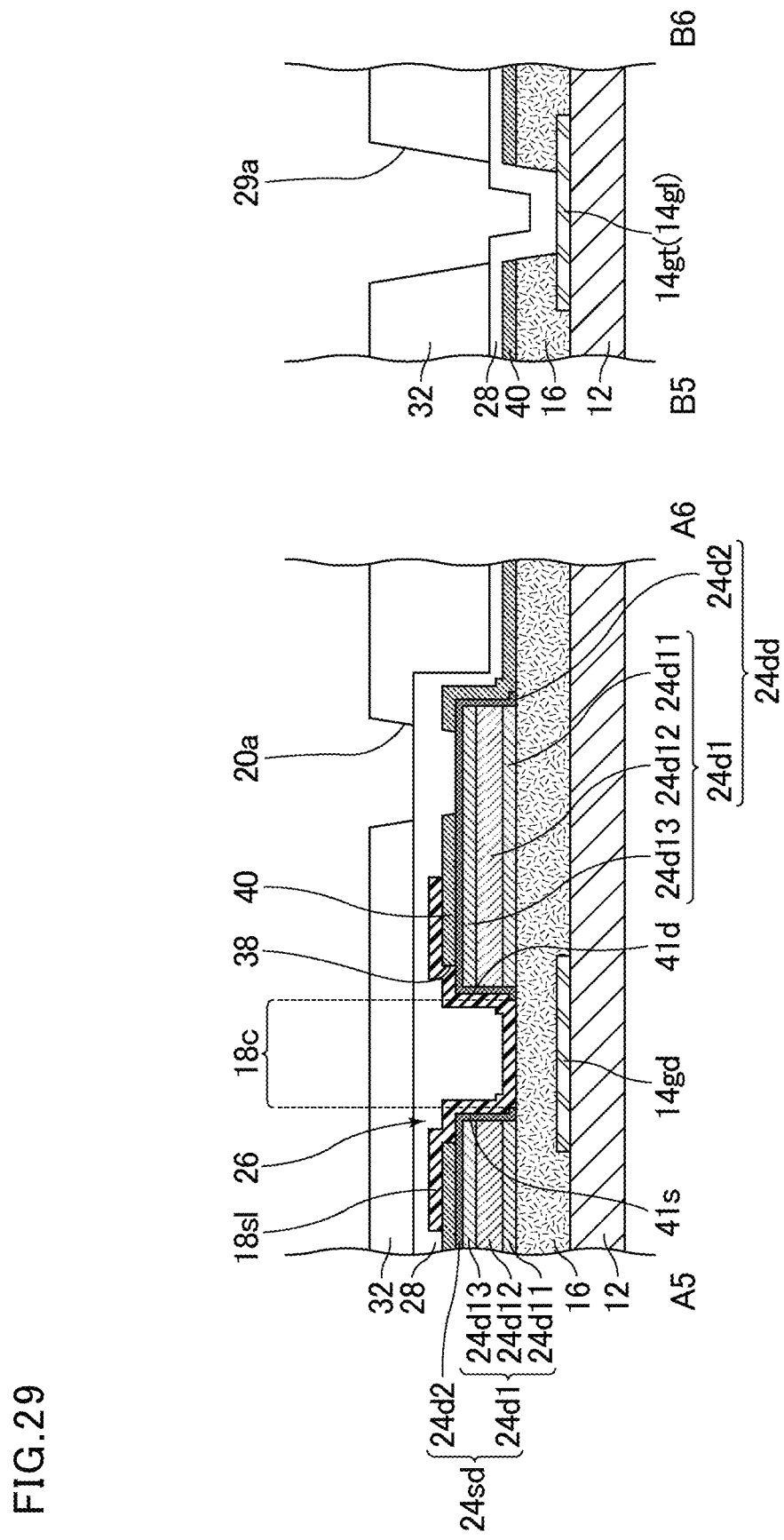
FIG. 29 includes schematic cross-sectional views of the regions shown in FIG. 23, each showing a state where a protective insulating layer formed from transparent insulating resin is formed in the seventh patterning in production of the TFT substrate of Embodiment 2.
Figure 30:
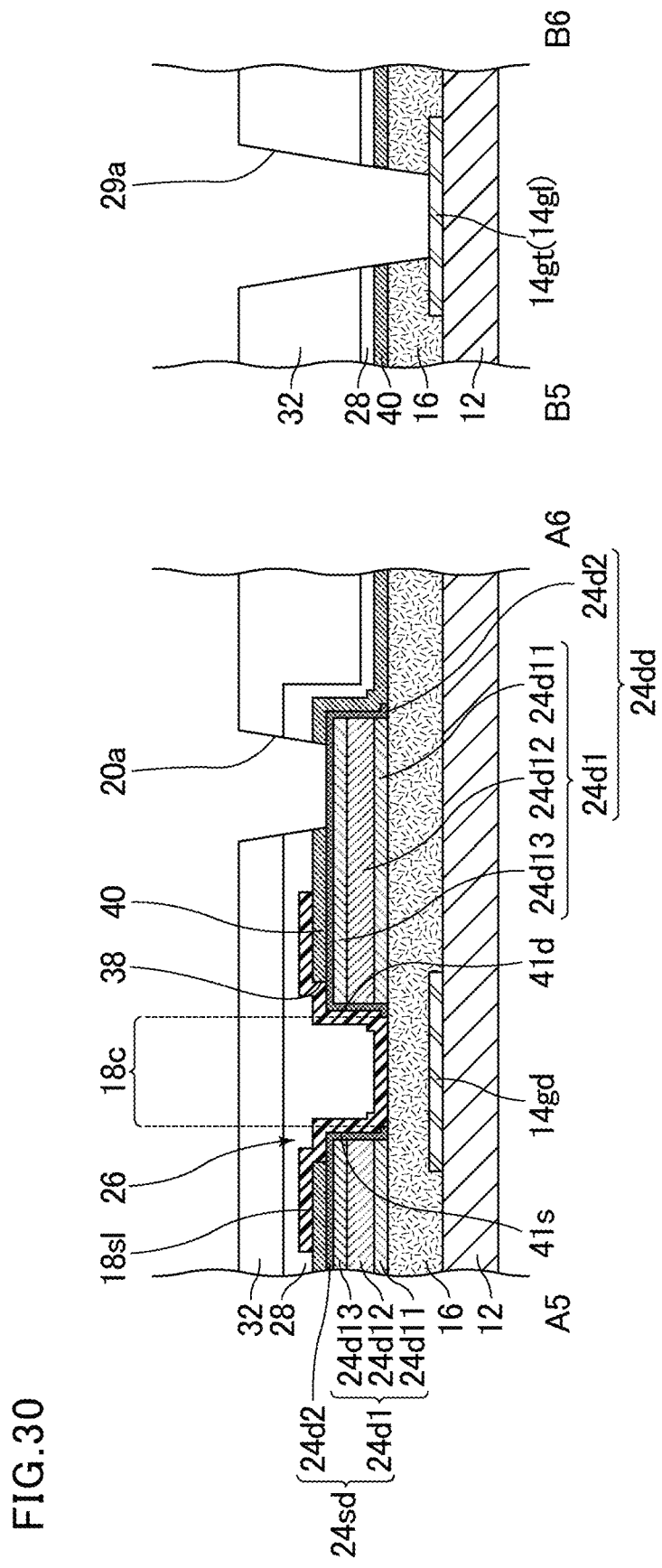
FIG. 30 includes schematic cross-sectional views of the regions shown in FIG. 23, each showing a state where a contact hole is formed in the gate insulating layer and in the protective insulating layer formed from silicon oxide in the seventh patterning in production of the TFT substrate of Embodiment 2.

An exemplary method for producing the TFT substrate 10 of the present embodiment is described with reference to FIG. 25 to FIG. 30. FIG. 25 includes schematic cross-sectional views of the regions shown in FIG. 23, each showing a state where an insulating film is formed in fourth patterning in production of the TFT substrate of Embodiment 2. FIG. 26 includes schematic cross-sectional views of the regions shown in FIG. 23, each showing a state where an insulating film is patterned in the fourth patterning in production of the TFT substrate of Embodiment 2. FIG. 27 includes schematic cross-sectional views of the regions shown in FIG. 23, each showing a state where a contact hole is formed in fifth patterning in production of the TFT substrate of Embodiment 2. FIG. 28 includes schematic cross-sectional views of the regions shown in FIG. 23, each showing a state where a protective insulating layer formed from silicon oxide is formed in seventh patterning in production of the TFT substrate of Embodiment 2. FIG. 29 includes schematic cross-sectional views of the regions shown in FIG. 23, each showing a state where a protective insulating layer formed from transparent insulating resin is formed in the seventh patterning in production of the TFT substrate of Embodiment 2. FIG. 30 includes schematic cross-sectional views of the regions shown in FIG. 23, each showing a state where a contact hole is formed in the gate insulating layer and in the protective insulating layer formed from silicon oxide in the seventh patterning in production of the TFT substrate of Embodiment 2.

<Production of TFT Substrate>

The production of a TFT substrate includes first patterning to tenth patterning.

<First Patterning to Third Patterning>

In the same manner as in Embodiment 1, the first patterning to the third patterning and the hydrofluoric acid treatment (hereinafter, also referred to as first hydrofluoric acid treatment) are performed.

<Fourth Patterning>

On the substrate having the source electrode 24sd and the drain electrode 24dd is formed a silicon oxide film by CVD to form the insulating film 400 (e.g., thickness: about 200 nm) as shown in FIG. 25.

On the substrate having the insulating film 400 is formed a resist pattern with openings in the regions for forming the contact holes 29a and 38 by photolithography using a fourth photomask. Using the resist pattern as a mask, the insulating film 400 is patterned by RIE with a fluorine-based gas. Thereby, the contact hole 38 and an opening 29a 1 for forming the contact hole 29a are formed as shown in FIG. 26.

<Second Hydrofluoric Acid Treatment>

The gate insulating layer 16 side surface of the insulating substrate 12 is treated with hydrofluoric acid. This second hydrofluoric acid treatment may be performed at a hydrofluoric acid concentration of 0.2% or higher and 20% or lower and at a temperature of 20 degrees or higher and 40 degrees or lower, for example.

<Fifth Patterning>

The same process as in the fourth patterning of Embodiment 1 is performed. In the present embodiment, the etching stopper layer 40 is disposed. Thus, even when the oxide semiconductor film is etched in the fifth patterning with the etchant (e.g., mixed acid solution) used for etching of the first conductive film and/or the second conductive film, the etching stopper layer 40 can prevent the source electrode 24sd and the drain electrode 24dd from being etched by the etchant.

<Sixth Patterning>

On the substrate having the oxide semiconductor layer 18sl, a resist pattern with an opening in the region for forming the contact hole 20a is formed by photolithography using a sixth photomask. Using the resist pattern as a mask, the gate insulating layer 16 and the etching stopper layer 40 are patterned by RIE with a fluorine-based gas. Thereby, an opening 20a1 for forming the contact hole 20a and an opening 29a11 for forming the contact hole 29a are formed as shown in FIG. 27. In the present embodiment, the patterning of the etching stopper layer 40 in the region with the gate terminal 14gt and the patterning of the gate insulating layer 16 in the region with the gate terminal 14gt are separately performed in the fourth patterning and the sixth patterning, respectively. If the etching stopper layer 40 and the gate insulating layer 16 are collectively etched, the gate insulating layer 16 in the channel portion is also etched to be eliminated. Thus, the gate insulating layer 16 is etched in the sixth patterning after the oxide semiconductor layer 18sl is disposed in the fifth patterning. In the case where the oxide semiconductor film is etched in the fifth patterning with the etchant (e.g., mixed acid solution) used for etching the first conductive film and/or the second conductive film and the opening 20a 1 is formed in the drain electrode 24dd after disposing the oxide semiconductor layer 18sl, the oxide semiconductor film can be etched without etching the drain electrode 24dd exposed through the opening 20a 1. Thus, the etching stopper layer 40 also functions as an etching stopper layer that prevents the drain electrode 24dd from being processed.

<Seventh Patterning (Formation of Protective Insulating Layer and Annealing)>

The same process as that in the fifth patterning (formation of protective insulating layer and annealing) of Embodiment 1 is performed. Seventh patterning in the present embodiment is performed as shown in FIGS. 28 to 30.

In the present embodiment, the gate insulating layer 16 in the region with the gate terminal 14gt is etched in the sixth patterning. Thus, in the seventh patterning, as shown in FIG. 28, the protective insulating layer 28 is disposed to be in contact with the gate terminal 14gt. Then, in the same manner as in Embodiment 1, the protective insulating layer 32 is disposed as shown in FIG. 29, and the contact holes 20a and 29a are formed as shown in FIG. 30.

<Eighth Patterning to Tenth Patterning>

The same processes as in the sixth patterning to the eighth patterning of Embodiment 1 are performed, whereby the TFT substrate 10 as shown in FIG. 23 can be produced.

Embodiment 3

In the present embodiment, the characteristic features of the present embodiment are mainly described and the same points as in Embodiment 1 or 2 are not described. The components having the same or a similar function have the same reference numerals in both the present embodiment and Embodiment 1 or 2, and such components are not described in the present embodiment. The present embodiment is substantially the same as Embodiment 2 except that the etching stopper layer has a different shape, as described below.

<Structure of TFT Substrate 10>

Figure 31:
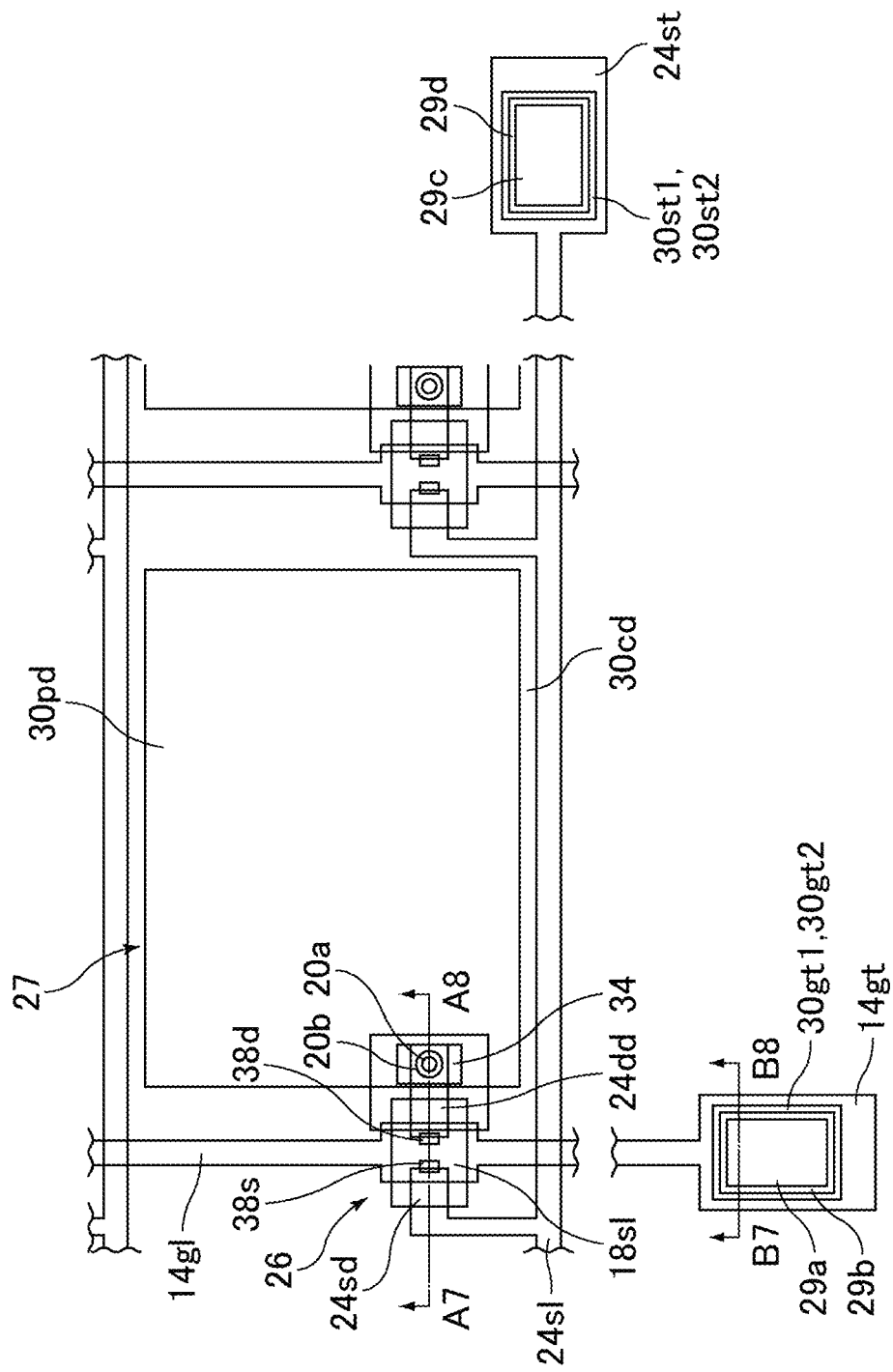
FIG. 31 is a schematic plan view showing the structures of one pixel and ends of lines on a TFT substrate of Embodiment 3.
Figure 32:
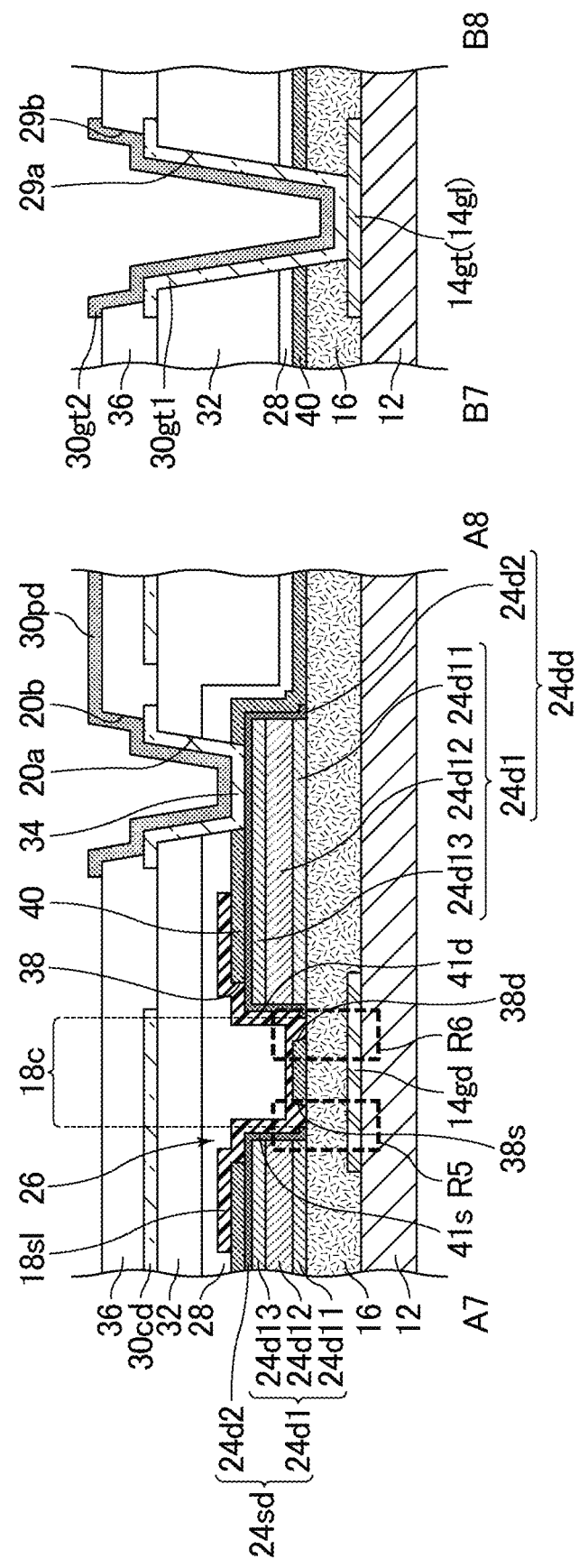
FIG. 32 includes schematic cross-sectional views taken along the line A7-A8 and the line B7-B8 in FIG. 31.

FIG. 31 and FIG. 32 show schematic structure views of the TFT substrate 10 of the present embodiment. FIG. 31 is a schematic plan view showing the structures of one pixel and ends of lines on a TFT substrate of Embodiment 3. FIG. 32 includes schematic cross-sectional views taken along the line A7-A8 and the line B7-B8 in FIG. 31. FIG. 32 shows, from left, a schematic cross-sectional view taken along the line A7-A8 in FIG. 31 and a schematic cross-sectional view taken along the line B7-B8 in FIG. 31.

In this embodiment, the TFT substrate 10 has the same planar layout as of the TFT substrate 10 of Embodiment 2 except that, as shown in FIG. 31, the etching stopper layer 40 has a contact hole 38s as the second contact hole and a contact hole 38d as the third contact hole. The contact hole 38s overlaps an end of the source electrode 24sd and the gate insulating layer 16 in a part adjacent to the end of the source electrode 24sd. The contact hole 38d overlaps an end of the drain electrode 24dd and the gate insulating layer 16 in a part adjacent to the end of the drain electrode 24dd.

In the TFT substrate 10, as shown in FIG. 32, the etching stopper layer 40 is present in a region between the oxide semiconductor layer 18sl and the gate insulating layer 16, and the oxide semiconductor layer 18sl is connected to the source electrode 24sd via the contact hole 38s formed in the etching stopper layer 40 and connected to the drain electrode 24dd via the contact hole 38d formed in the etching stopper layer 40. The source electrode 24sd and the drain electrode 24dd are connected to the oxide semiconductor layer 18sl via the contact holes 38s and 38d formed in the etching stopper layer 40.

Figure 33A:
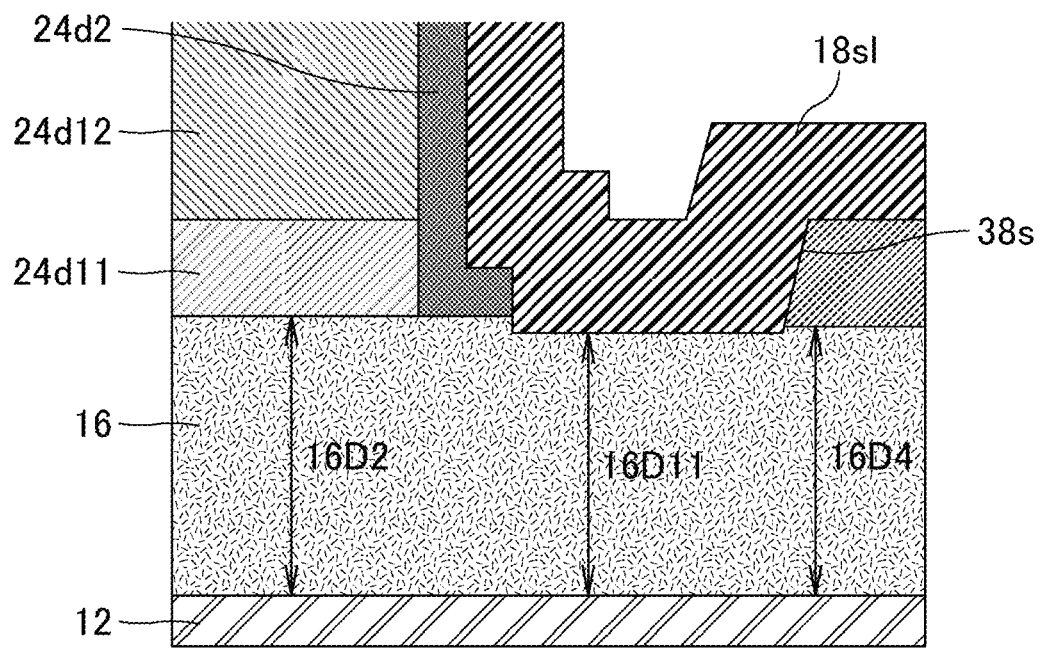
FIG. 33A is a schematic cross-sectional view of a region R5 surrounded by a broken line in FIG. 32.
Figure 33B:
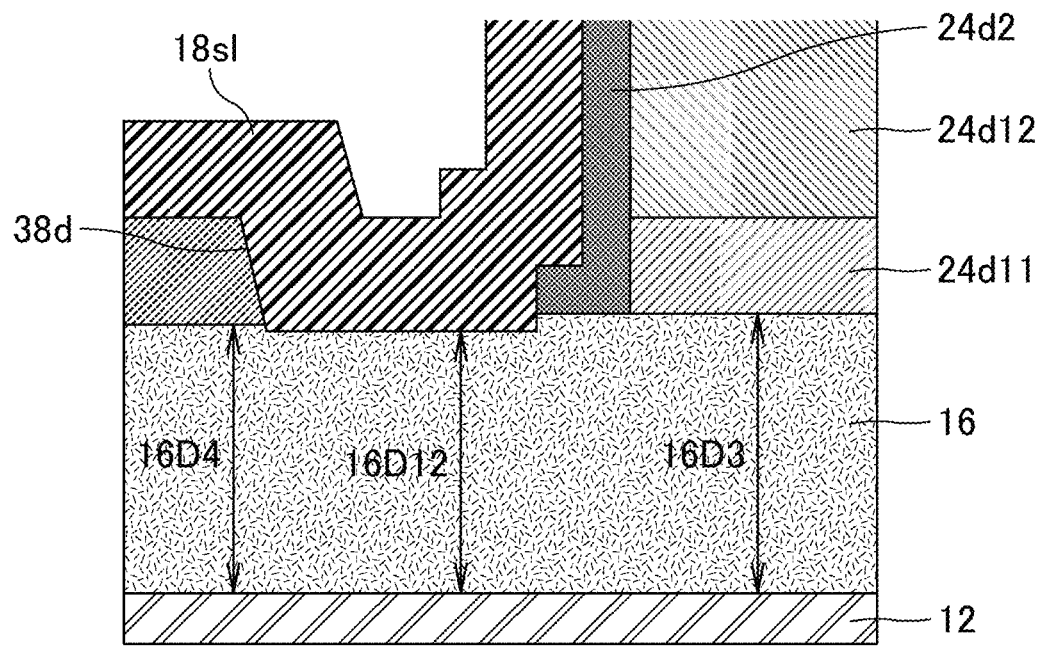
FIG. 33B is a schematic cross-sectional view of a region R6 surrounded by a broken line in FIG. 32.

FIG. 33A is a schematic cross-sectional view of the region R5 surrounded by a broken line in FIG. 31. FIG. 33B is a schematic cross-sectional view of the region R6 surrounded by a broken line in FIG. 31. The source electrode 24sd and the drain electrode 24dd each include the first conductive layer 24d1 and the second conductive layer 24d2 covering the first conductive layer 24d1. The second conductive layer 24d2 contains at least one element selected from the group consisting of molybdenum, tantalum, tungsten, and nickel. The gate insulating layer 16 may be contaminated in formation of the source electrode 24sd and the drain electrode 24dd, for example. In this case, the threshold value among the TFT properties is unstable to possibly cause reduced on-state current. In production of the TFT substrate 10 of the present embodiment, in order to remove contaminants on the gate insulating layer 16, for example, the surface of the gate insulating layer 16 in the region between the source electrode 24sd and the drain electrode 24dd is removed (modified) by etching with hydrofluoric acid before disposing the oxide semiconductor layer 18sl. This can stabilize the threshold value among the TFT properties and prevent or reduce a reduction in on-state current to achieve stable TFT properties.

Here, the TFT substrate 10 of the present embodiment includes the etching stopper layer 40 that can prevent the source electrode 24sd and the drain electrode 24dd from being etched in formation of the oxide semiconductor layer 18sl, as mentioned above. The etching stopper layer 40 is disposed on the source electrode 24sd and on the drain electrode 24dd, and is also disposed between the gate insulating layer 16 and the oxide semiconductor layer 18sl in a region between the source electrode 24sd and the drain electrode 24dd. The surface of the etching stopper layer 40 and the surface of the gate insulating layer 16 in the regions where the gate insulating layer 16 is in direct contact with the oxide semiconductor layer 18sl, i.e., the region between the etching stopper layer 40 and the source electrode 24sd and the region between the etching stopper layer 40 and the drain electrode 24dd, may be contaminated in the formation of the etching stopper layer 40, for example. When the oxide semiconductor layer 18sl is formed on the contaminated etching stopper layer 40 and gate insulating layer 16, the threshold value among the TFT properties may be unstable to possibly cause reduced on-state current. In production of the TFT substrate 10 of the present embodiment, in order to remove contaminants on the surface of the etching stopper layer 40 and the surface of the gate insulating layer 16, for example, after formation of the etching stopper layer 40, the surface of the etching stopper layer 40 and the surface of the gate insulating layer 16 are removed (modified) by etching with hydrofluoric acid, and then the oxide semiconductor layer 18sl is formed. Thereby, the TFT properties can be stabilized to a similar extent to the case without the etching stopper layer 40.

In the TFT substrate 10 of the present embodiment, the second conductive layer 24d2 contains at least one element selected from the group consisting of molybdenum, tantalum, tungsten, and nickel. When the conductive layer contains at least one element selected from the group consisting of molybdenum, tantalum, tungsten, and nickel, the conductive layer has hydrofluoric acid resistance and thus can prevent the source electrode 24sd and the drain electrode 24dd from being etched during the etching with hydrofluoric acid. This can achieve less variation in channel length of the TFT 26 in the substrate plane, and thereby can achieve less variation in carrier mobility and threshold value among the TFT properties. As a result, the TFT properties can further be stabilized.

When the surface of the gate insulating layer 16 in the region between the source electrode 24sd and the drain electrode 24dd is etched with hydrofluoric acid before disposing the oxide semiconductor layer 18sl as mentioned above, the gate insulating layer 16 in the region between the source electrode 24sd and the drain electrode 24dd is etched while the gate insulating layer 16 in the regions below the source electrode 24sd and the drain electrode 24dd is not etched. As a result, as shown in FIG. 33A and FIG. 33B, thicknesses 16D11, 16D12, and 16D4 of the gate insulating layer 16 in the region between the source electrode 24sd and the drain electrode 24dd are smaller than the thickness 16D2 of the gate insulating layer 16 in the region below the source electrode 24sd and are also smaller than the thickness 16D3 of the gate insulating layer 16 in the region below the drain electrode 24dd.

In the present embodiment, the etching with hydrofluoric acid is performed twice, i.e., before and after disposing the etching stopper layer 40. Accordingly, in a region between the source electrode 24sd and the drain electrode 24dd, the gate insulating layer 16 in the part below the etching stopper layer 40 is treated with hydrofluoric acid once before formation of the etching stopper layer 40, while the gate insulating layer 16 in the parts below the contact hole 38s and below the contact hole 38d is treated with hydrofluoric acid twice, i.e., before and after formation of the etching stopper layer 40. As a result, in a region between the source electrode 24sd and the drain electrode 24dd, the gate insulating layer 16 in the part below the etching stopper layer 40 has the thickness 16D4 larger than the thickness 16D11 of the gate insulating layer 16 in the part below the contact hole 38s and larger than the thickness 16D12 of the gate insulating layer 16 in the part below the contact hole 38d.

The thickness 16D4 of the gate insulating layer is, for example, 40% or greater and 99.8% or smaller of the thickness 16D2 of the gate insulating layer and 40% or greater and 99.8% or smaller of the thickness 16D3 of the gate insulating layer. The thickness 16D4 of the gate insulating layer is preferably 90% or greater and 99.5% or smaller of the thickness 16D2 of the gate insulating layer and 90% or greater and 99.5% or smaller of the thickness 16D3 of the gate insulating layer.

The thickness 16D11 of the gate insulating layer is, for example, 40% or greater and 99.8% or smaller of the thickness 16D4 of the gate insulating layer and the thickness 16D12 of the gate insulating layer is 40% or greater and 99.8% or smaller of the thickness 16D4 of the gate insulating layer. The thickness 16D11 of the gate insulating layer is preferably 90% or greater and 99.5% or smaller of the thickness 16D4 of the gate insulating layer and the thickness 16D12 of the gate insulating layer is preferably 90% or greater and 99.5% or smaller of the thickness 16D4 of the gate insulating layer.

Production Method

Figure 34:
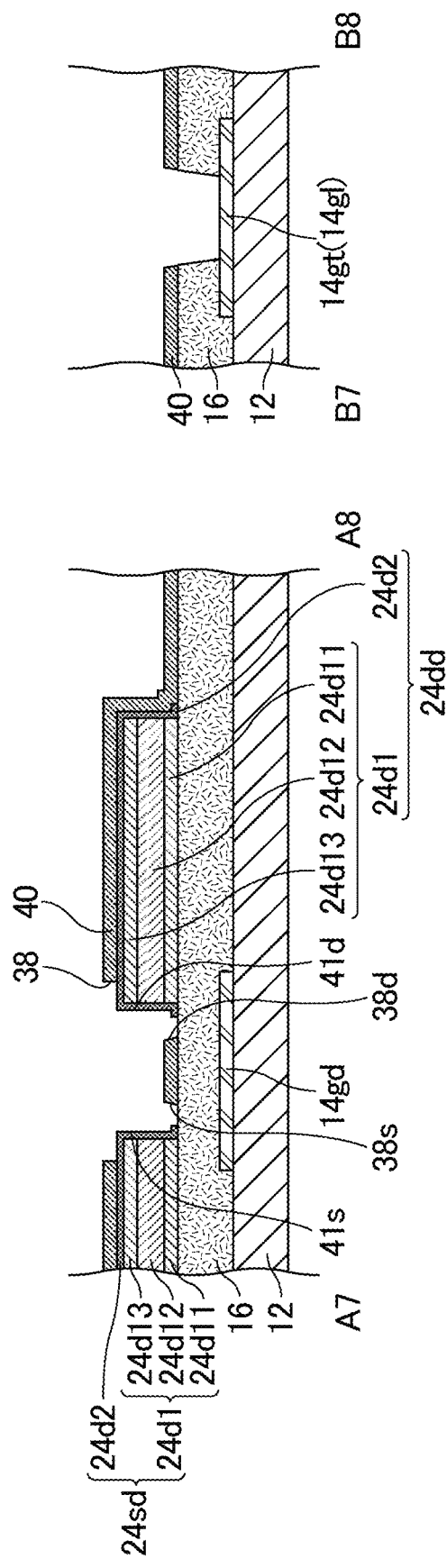
FIG. 34 includes schematic cross-sectional views of the regions shown in FIG. 32, each showing a state where an insulating film is patterned in fourth patterning in production of the TFT substrate of Embodiment 3.

An exemplary method for producing the TFT substrate 10 of the present embodiment is described with reference to FIG. 34. FIG. 34 includes schematic cross-sectional views of the regions shown in FIG. 32, each showing a state where an insulating film is patterned in fourth patterning in production of the TFT substrate of Embodiment 3.

<Production of TFT Substrate>

The production of a TFT substrate of the present embodiment is the same as the production of a TFT substrate of Embodiment 2 except that, in the fourth patterning, as shown in FIG. 34, the contact holes 38s and 38d are formed and the etching stopper layer 40 is formed by etching the insulating film in the region between the source electrode 24sd and the drain electrode 24dd.

Figure 35:
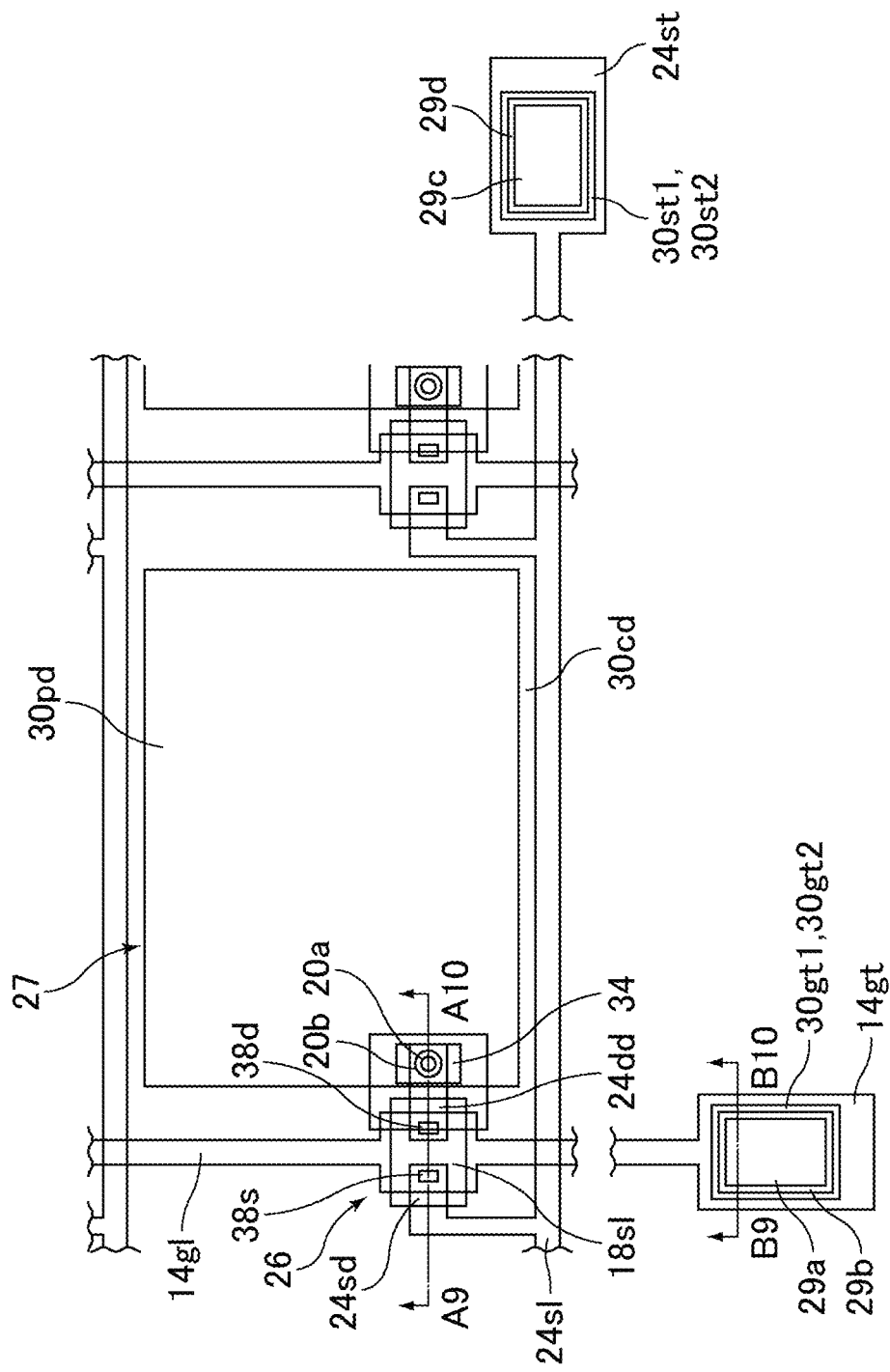
FIG. 35 is a schematic plan view showing the structures of one pixel and ends of lines on a TFT substrate of Comparative Embodiment 2.
Figure 36:
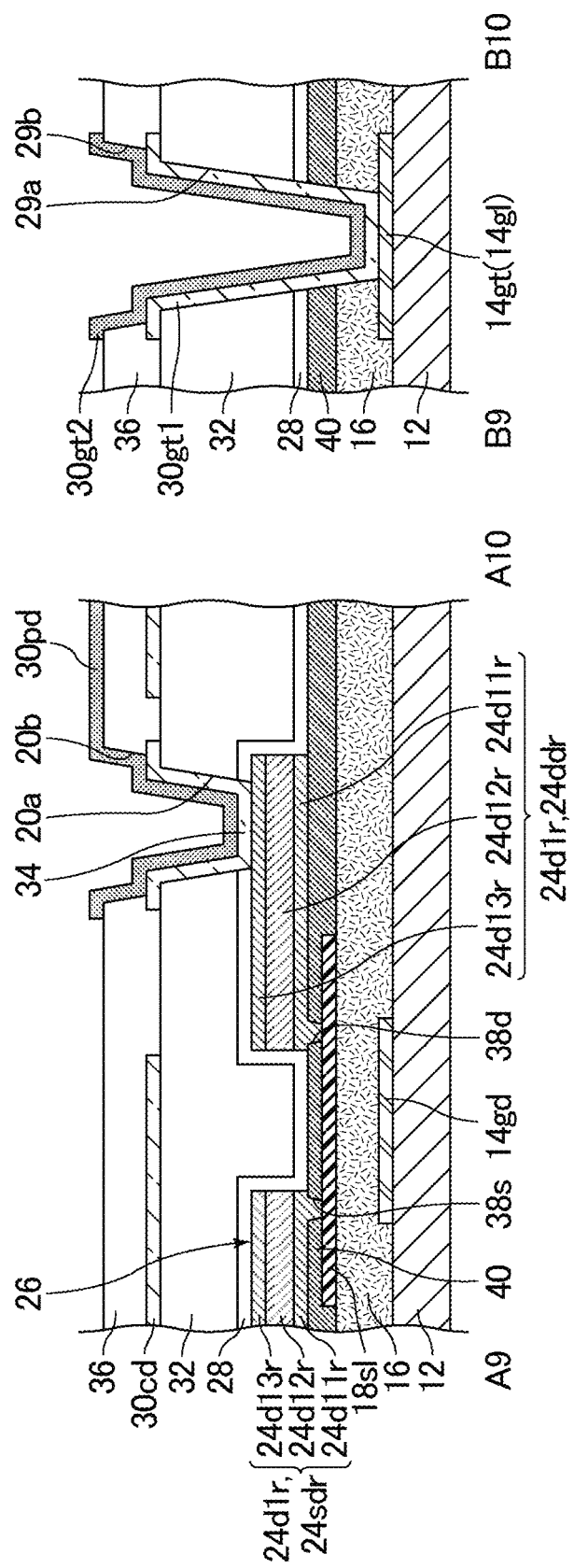
FIG. 36 includes schematic cross-sectional views taken along the line A9-A10 and the line B9-B10 in FIG. 35.

Here, a comparative embodiment is given in order to describe the difference from the present embodiment. FIG. 35 is a schematic plan view showing the structures of one pixel and ends of lines on a TFT substrate of Comparative Embodiment 2. FIG. 36 includes schematic cross-sectional views taken along the line A9-A10 and the line B9-B10 in FIG. 35. FIG. 36 shows, from left, a schematic cross-sectional view taken along the line A9-A10 in FIG. 35 and a schematic cross-sectional view taken along the line B9-B10 in FIG. 35.

The TFT substrate of the present embodiment is a bottom-contact substrate, while the TFT substrate of Comparative Embodiment 2 is a top-contact substrate as shown in FIG. 35 and FIG. 36. The TFT substrate of Comparative Embodiment 2 has the same structure as that of the TFT substrate 10 of the present embodiment except for the positions of the oxide semiconductor layer 18sl and the etching stopper layer 40 and the structures of the source electrode 24sdr and the drain electrode 24ddr. The oxide semiconductor layer 18sl of the TFT substrate of Comparative Embodiment 2 is disposed between the gate insulating layer 16 and the source electrodes 24sdr and between the gate insulating layer 16 and the drain electrodes 24ddr. The etching stopper layer 40 is disposed between the oxide semiconductor layer 18sl and the source electrode 24sdr and between the oxide semiconductor layer 18sl and the drain electrode 24ddr.

The source electrode 24sdr and the drain electrode 24ddr of the TFT substrate of Comparative Embodiment 2 are each formed from the first conductive layer 24d1r. The first conductive layer 24d1r has a laminate structure including a lower layer 24d11r, a middle layer 24d12r, and an upper layer 24d13r stacked in the stated order from the insulating substrate 12 side. Specific examples of the structure of the first conductive layer 24d1r include a structure in which the lower layer 24d11r formed from titanium, the middle layer 24d12r formed from aluminum, and the upper layer 24d13r formed from titanium are stacked (hereinafter, also referred to as Specific Example 1 of Comparative Embodiment 2), and a structure in which the lower layer 24d11r formed from titanium, the middle layer 24d12r formed from aluminum or copper, and the upper layer 24d13r formed from molybdenum or molybdenum nitride are stacked (hereinafter, also referred to as Specific Example 2 of Comparative Embodiment 2).

Figure 37:
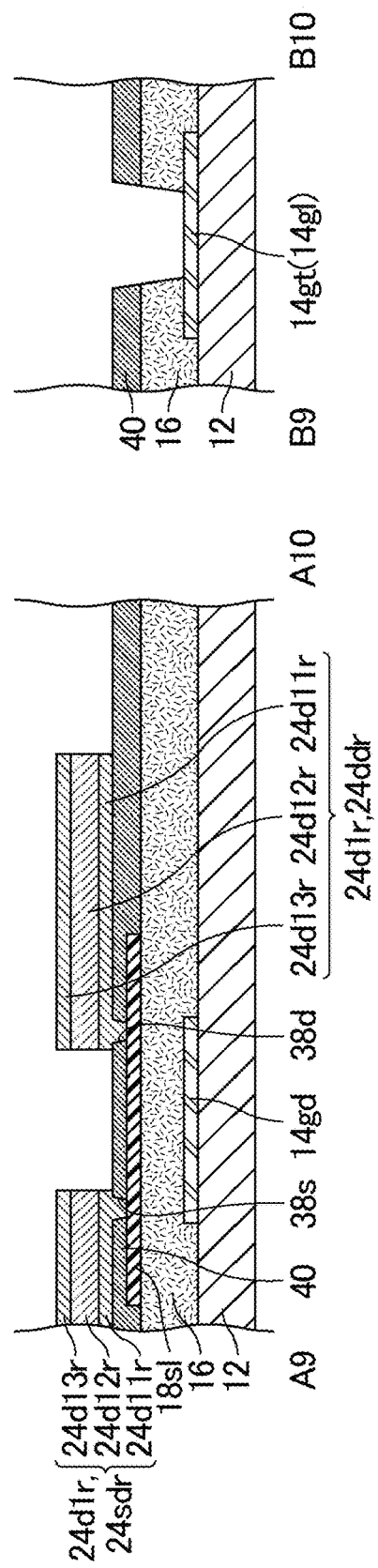
FIG. 37 includes schematic cross-sectional views of the regions shown in FIG. 36, each showing a production process of a TFT substrate of Specific Example 1 of Comparative Embodiment 2.

FIG. 37 includes schematic cross-sectional views of the regions shown in FIG. 36, each showing a production process of the TFT substrate of Specific Example 1 of Comparative Embodiment 2. In production of the TFT substrate of Comparative Embodiment 2, the gate lines 14*gl*, the gate electrodes 14*gd*, and the gate terminals 14*gt* are formed, the gate insulating layer 16 is formed, the oxide semiconductor layer 18*sl* is formed, and then the etching stopper layer 40 is formed. Next, the first conductive film as a material of the first conductive layer 24*d*1*r* is formed and then etched to form the source electrodes 24*sdr* and the drain electrodes 24*dd*. In the case of Specific Example 1 of Comparative Embodiment 2, the first conductive film is etched by dry etching. Although the etching stopper layer 40 is disposed in Comparative Embodiment 2, the channel portion of each TFT may suffer plasma damage under some conditions for the dry etching. The TFT properties may be thereby degraded, and thus the threshold value may be significantly reduced to have a negative value. As a result, the TFT may fail to function as a switching element. Such a phenomenon may be caused when the electric power is set at a high level and thereby the rate of the dry etching is increased in order to improve the productivity. In the case of Specific Example 2 of Comparative Embodiment 2, a molybdenum film or a molybdenum nitride film (corresponding to the upper layer 24*d*13*r*) and an aluminum film or a copper film (corresponding to the middle layer 24*d*12*r*) of the first conductive film are etched by wet etching using a mixed acid solution containing phosphoric acid, acetic acid, and nitric acid. Then, a titanium film (corresponding to the lower layer 24*d*11*r*) is etched by dry etching. Here, similarly to Specific Example 1 of Comparative Embodiment 2, the channel portion of each TFT may suffer plasma damage under some conditions for the dry etching. The TFT properties may be thereby degraded and the threshold value may be significantly reduced to have a negative value. As a result, the TFT may fail to function as a switching element.

In contrast, in the method for producing the TFT substrate 10 of the present embodiment, as mentioned above, the surface of the gate insulating layer 16 in the TFT channel portion can be modified while preventing the channel side end of each source electrode 24*sd* and the channel side end of each drain electrode 24*dd* from being etched. As a result, the threshold value among the TFT properties can be stable to prevent malfunction of the switching element.

Embodiment 4

In the present embodiment, the characteristic features of the present embodiment are mainly described and the same points as in Embodiment 1, 2, or 3 are not described. The components having the same or a similar function have the same reference numerals in both the present embodiment and Embodiment 1, 2, or 3, and such components are not described in the present embodiment. The present embodiment is substantially the same as Embodiments 2 and 3 except that the etching stopper layer has a different shape, as described below.

<Structure of TFT Substrate 10>

Figure 38:
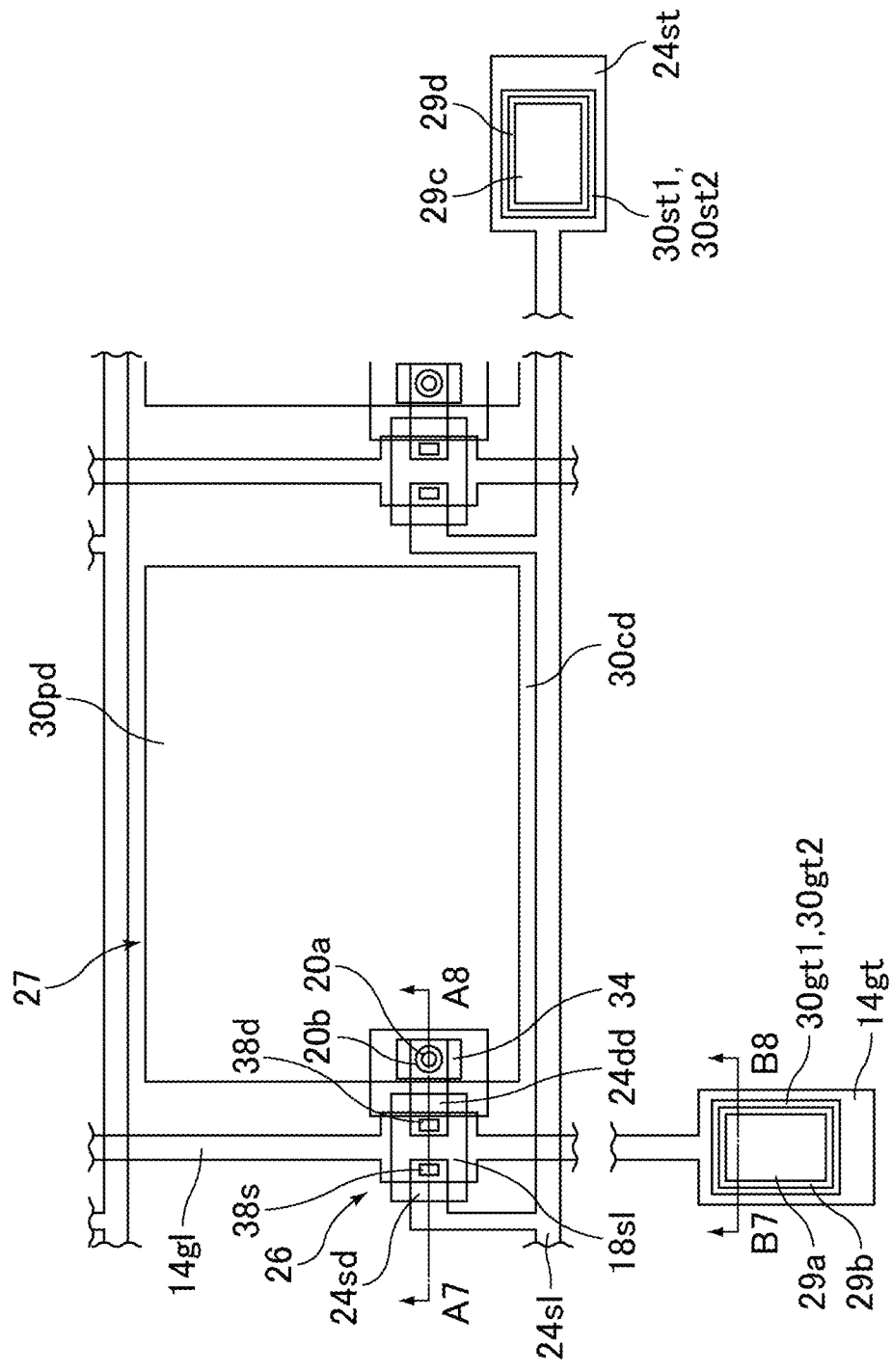
FIG. 38 is a schematic plan view showing the structures of one pixel and ends of lines on a TFT substrate of Embodiment 4.
Figure 39:
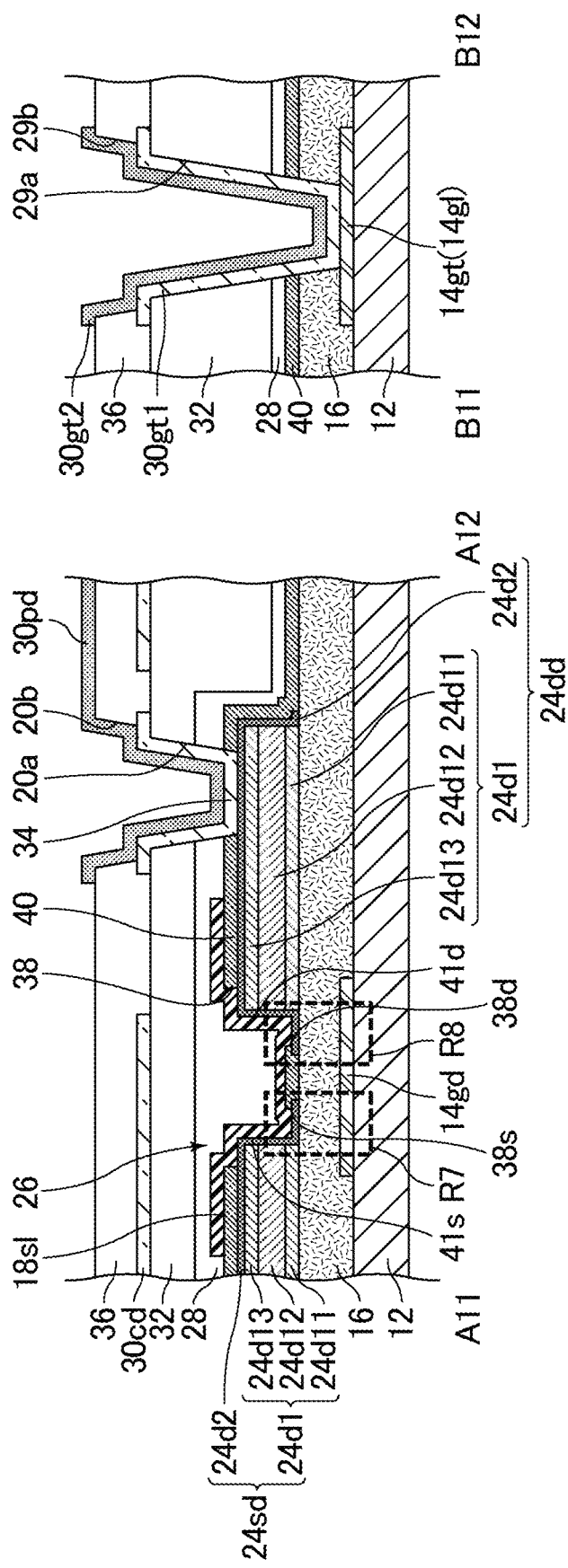
FIG. 39 includes schematic cross-sectional views taken along the line A11-A12 and the line B11-B12 in FIG. 38.

FIG. 38 and FIG. 39 show schematic structure views of the TFT substrate 10 of the present embodiment. FIG. 38 is a schematic plan view showing the structures of one pixel and ends of lines on the TFT substrate of Embodiment 3. FIG. 39 includes schematic cross-sectional views taken along the line A11-A12 and the line B11-B12 in FIG. 38. FIG. 39 shows, from left, a schematic cross-sectional view taken along the line A11-A12 in FIG. 38 and a schematic cross-sectional view taken along the line B11-B12 in FIG. 38.

In this embodiment, the TFT substrate 10 has the same planar layout as of the TFT substrate 10 of Embodiment 3 except that, as shown in FIG. 38, the contact hole 38*s* overlaps an end of the source electrode 24*sd* but does not overlap the gate insulating layer 16, and the contact hole 38*d* overlaps an end of the drain electrode 24*dd* but does not overlap the gate insulating layer 16.

In the TFT substrate 10, as shown in FIG. 39, the etching stopper layer 40 is present between the oxide semiconductor layer 18*sl* and the gate insulating layer 16, and the oxide semiconductor layer 18*sl* is connected to the source electrode 24*sd* through the contact hole 38*s* in the etching stopper layer 40 and connected to the drain electrode 24*dd* through the contact hole 38*d* in the etching stopper layer 40. The source electrode 24*sd* and the drain electrode 24*dd* are connected to the oxide semiconductor layer 18*sl* through the contact holes 38*s* and 38*d* in the etching stopper layer 40. Differently from the above Embodiment 3 where the contact holes 38*s* and 38*d* overlap the gate insulating layer 16, in the present embodiment, the contact hole 38*s* overlaps an end of the source electrode 24*sd* but does not overlap the gate insulating layer 16, while the contact hole 38*d* overlaps the drain electrode 24*dd* but does not overlap the gate insulating layer 16.

Figure 40A:
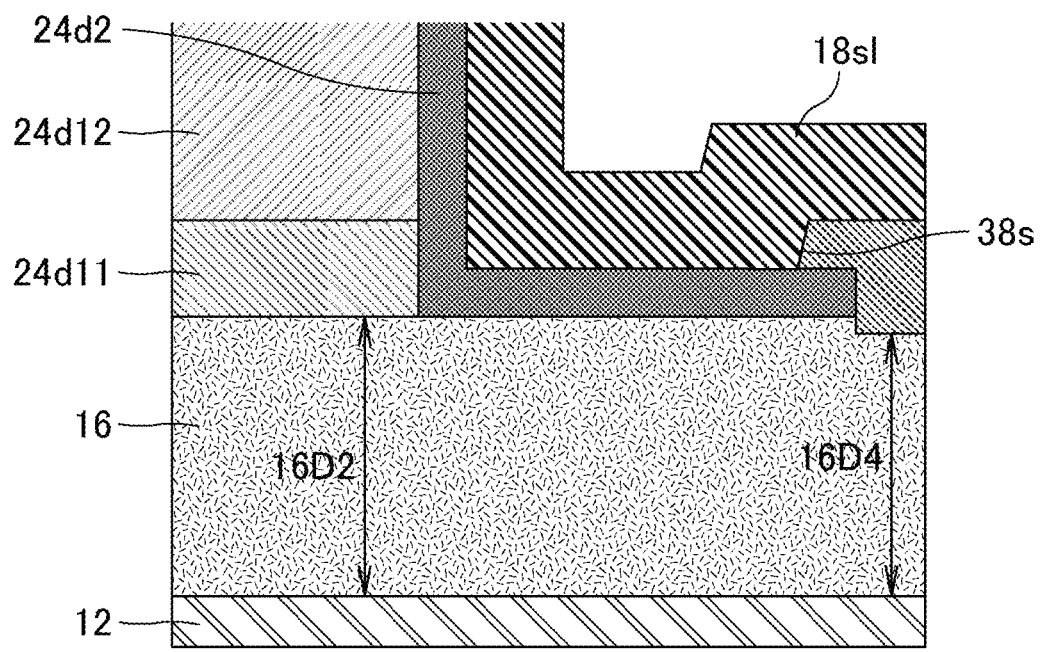
FIG. 40A is a schematic cross-sectional view of a region R7 surrounded by a broken line in FIG. 39.
Figure 40B:
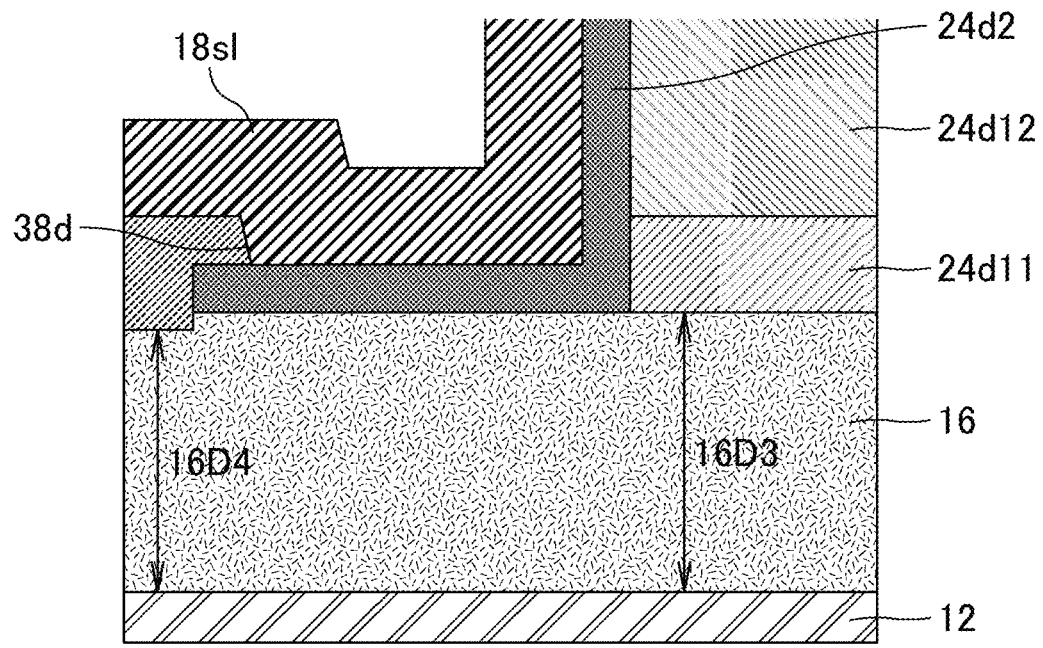
FIG. 40B is a schematic cross-sectional view of a region R8 surrounded by a broken line in FIG. 39.

FIG. 40A is a schematic cross-sectional view of the region R7 surrounded by a broken line in FIG. 39. FIG. 40B is a schematic cross-sectional view of the region R8 surrounded by a broken line in FIG. 39. The source electrode 24*sd* and the drain electrode 24*dd* each include the first conductive layer 24*d*1 and the second conductive layer 24*d*2 covering the first conductive layer 24*d*1. The second conductive layer 24*d*2 contains at least one element selected from the group consisting of molybdenum, tantalum, tungsten, and nickel. The gate insulating layer 16 may be contaminated in formation of the source electrode 24*sd* and the drain electrode 24*dd*, for example. In this case, the threshold value among the TFT properties is unstable to possibly cause reduced on-state current. In production of the TFT substrate 10 of the present embodiment, in order to remove contaminants on the gate insulating layer 16, for example, the surface of the gate insulating layer 16 in the region between the source electrode 24*sd* and the drain electrode 24*dd* is removed (modified) by etching with hydrofluoric acid and then disposing the oxide semiconductor layer 18*sl*. This can stabilize the threshold value among the TFT properties and prevent or reduce a reduction in on-state current to achieve stable TFT properties.

Here, the TFT substrate 10 of the present embodiment includes the etching stopper layer 40 that can prevent the source electrode 24*sd* and the drain electrode 24*dd* from being etched in formation of the oxide semiconductor layer 18*sl*, as mentioned above. The etching stopper layer 40 is disposed on the source electrode 24*sd* and on the drain electrode 24*dd*, and is also disposed between the gate insulating layer 16 and the oxide semiconductor layer 18*sl* in a region between the source electrode 24*sd* and the drain electrode 24*dd*. The surface of the etching stopper layer 40 may be contaminated in the formation of the etching stopper layer 40, for example. When the oxide semiconductor layer 18*sl* is formed on the contaminated etching stopper layer 40, the threshold value among the TFT properties may be unstable to possibly cause reduced on-state current. In production of the TFT substrate 10 of the present embodiment, in order to remove contaminants on the surface of the etching stopper layer 40, for example, after formation of the etching stopper layer 40, the surface of the etching stopper layer 40 is removed (modified) by etching with hydrofluoric acid and then disposing the oxide semiconductor layer 18*sl*. Thereby, the TFT properties can be stabilized to a similar extent to the case without the etching stopper layer 40.

In the TFT substrate 10 of the present embodiment, the second conductive layer 24*d*2 contains at least one element selected from the group consisting of molybdenum, tantalum, tungsten, and nickel. When the conductive layer contains at least one element selected from the group consisting of molybdenum, tantalum, tungsten, and nickel, the conductive layer has hydrofluoric acid resistance and thus can prevent the source electrode 24*sd* and the drain electrode 24*dd* from being etched during the etching with hydrofluoric acid. This can achieve less variation in channel length of the TFT 26 in the substrate plane, and thereby can achieve less variation in carrier mobility and threshold value among the TFT properties. As a result, the TFT properties can further be stabilized.

When the surface of the gate insulating layer 16 in the region between the source electrode 24*sd* and the drain electrode 24*dd* is etched with hydrofluoric acid before disposing the oxide semiconductor layer 18*sl* as mentioned above, the gate insulating layer 16 in the region between the source electrode 24*sd* and the drain electrode 24*dd* is etched while the gate insulating layer 16 in the regions below the source electrode 24*sd* and the drain electrode 24*dd* is not etched. As a result, as shown in FIG. 40A and FIG. 40B, the thickness 16D4 of the gate insulating layer 16 in a region between the source electrode 24*sd* and the drain electrode 24*dd* and below the etching stopper layer 40 is smaller than the thickness 16D2 of the gate insulating layer 16 in the region below the source electrode 24*sd* and is also smaller than the thickness 16D3 of the gate insulating layer 16 in the region below the drain electrode 24*dd*.

The thickness 16D4 of the gate insulating layer is, for example, 40% or greater and 99.8% or smaller of the thickness 16D2 of the gate insulating layer and 40% or greater and 99.8% or smaller of the thickness 16D3 of the gate insulating layer. The thickness 16D4 of the gate insulating layer is preferably 90% or greater and 99.5% or smaller of the thickness 16D2 of the gate insulating layer and 90% or greater and 99.5% or smaller of the thickness 16D3 of the gate insulating layer.

Production Method

Figure 41:
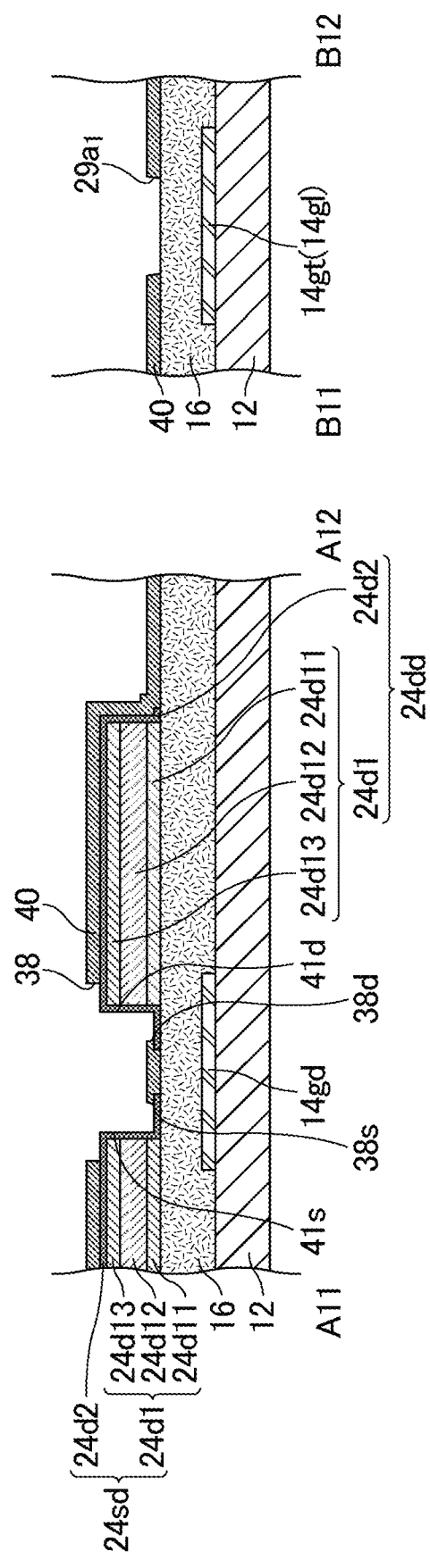
FIG. 41 includes schematic cross-sectional views of the regions shown in FIG. 39, each showing a state where an insulating film is patterned in fourth patterning in production of a TFT substrate of Embodiment 4.

An exemplary method for producing the TFT substrate 10 of the present embodiment is described with reference to FIG. 41. FIG. 41 includes schematic cross-sectional views of the regions shown in FIG. 39, each showing a state where an insulating film is patterned in fourth patterning in production of the TFT substrate of Embodiment 4.

<Production of TFT Substrate>

The production of a TFT substrate of the present embodiment is the same as the production of a TFT substrate of Embodiment 3 except that, as shown in FIG. 41, the insulating film is etched to form the etching stopper layer 40 such that the etching stopper layer 40 has the contact hole 38*s* that overlaps an end of the source electrode 24*sd* but does not overlap the gate insulating layer 16, and the contact hole 38*d* that overlaps an end of the drain electrode 24*dd* but does not overlap the gate insulating layer 16. As described, in the present embodiment, the gate insulating layer 16 in the region between the source electrode 24*sd* and the drain electrode 24*dd* is covered with the etching stopper layer 40. Thus, in the second hydrofluoric acid treatment in the present embodiment, the outermost surface of the etching stopper layer is removed by the hydrofluoric acid treatment.

Modified Example of Embodiments 1 to 4

The present invention is not limited by the above embodiments each giving an example where the TFT substrate 10 constitutes the transmissive liquid crystal display device S. The TFT substrate 10 of the present invention may be applied to other types of display devices such as reflective liquid crystal display devices, transflective liquid crystal display devices, and organic electroluminescent (EL) display devices, and methods for producing these devices.

The above embodiments of the present invention may appropriately be combined with each other within the spirit of the present invention.

What is claimed is:

1. A thin-film transistor substrate comprising a base substrate and a thin-film transistor, the thin-film transistor including:

a gate electrode disposed on the base substrate;

a gate insulating layer covering the gate electrode; a source electrode and a drain electrode facing each other and disposed above the gate electrode via the gate insulating layer; and an oxide semiconductor layer which faces the gate electrode via at least the gate insulating layer and whose first end and second end respectively overlap the source electrode and the drain electrode and are thereby respectively connected to the source electrode and the drain electrode, the source electrode and the drain electrode each including a first conductive layer and a second conductive layer covering the first conductive layer, the second conductive layer containing at least one element selected from the group consisting of molybdenum, tantalum, tungsten, and nickel, the gate insulating layer in a region between the source electrode and the drain electrode having a smaller thickness than in a region below the source electrode and in a region below the drain electrode, wherein the thin-film transistor further includes an etching stopper layer on the source electrode and on the drain electrode, the thin-film transistor substrate further comprises a protective insulating layer covering the thin-film transistor and a conductive layer disposed on the protective insulating layer and connected to the drain electrode via a first contact hole in the etching stopper layer and in the protective insulating layer, the etching stopper layer covers the source electrode except for a connection portion between the oxide semiconductor layer and the source electrode and covers the drain electrode except for a connection portion between the oxide semiconductor layer and the drain electrode and a connection portion between the conductive layer and the drain electrode, and the connection portion between the oxide semiconductor layer and the source electrode and the connection portion between the oxide semiconductor layer and the drain electrode are located in a region with the gate electrode.

2. The thin-film transistor substrate according to claim 1, wherein the etching stopper layer is not present in a region between the oxide semiconductor layer and the gate insulating layer, and the oxide semiconductor layer faces the gate electrode via the gate insulating layer.

3. The thin-film transistor substrate according to claim 1, wherein the etching stopper layer is present in a region between the oxide semiconductor layer and the gate insulating layer, and the oxide semiconductor layer is connected to the source electrode via a second contact hole in the etching stopper layer and connected to the drain electrode via a third contact hole in the etching stopper layer.

4. The thin-film transistor substrate according to claim 3, wherein the second contact hole overlaps an end of the source electrode and the gate insulating layer in a part adjacent to the end of the source electrode, the third contact hole overlaps an end of the drain electrode and the gate insulating layer in a part adjacent to the end of the drain electrode, and the gate insulating layer in a region between the source electrode and the drain electrode and below the etching stopper layer has a greater thickness than in a region below the second contact hole and in a region below the third contact hole.

5. The thin-film transistor substrate according to claim 3, wherein the second contact hole overlaps an end of the source electrode but does not overlap the gate insulating layer, the third contact hole overlaps an end of the drain electrode but does not overlap the gate insulating layer, and the gate insulating layer in a region between the source electrode and the drain electrode and below the etching stopper layer has a smaller thickness than in a region below the source electrode and in a region below the drain electrode.

6. The thin-film transistor substrate according to claim 1, wherein the first conductive layer is a laminate including a lower layer, a middle layer, and an upper layer stacked in the stated order from a base substrate side, the middle layer contains aluminum or copper, and the lower layer and the upper layer each contain titanium or molybdenum nitride.

7. The thin-film transistor substrate according to claim 1, wherein the second conductive layer contains at least one substance selected from the group consisting of molybdenum, molybdenum nitride, a molybdenum alloy, a nitride of the molybdenum alloy, tantalum, tantalum nitride, a tantalum alloy, a nitride of the tantalum alloy, tungsten, tungsten nitride, a tungsten alloy, a nitride of the tungsten alloy, nickel, nickel nitride, a nickel alloy, and a nitride of the nickel alloy.

8. The thin-film transistor substrate according to claim 1, wherein the oxide semiconductor layer includes an indium gallium zinc oxide-based oxide semiconductor.

9. A liquid crystal display device comprising:

the thin-film transistor substrate according to claim 1;

a counter substrate facing the thin-film transistor substrate; and a liquid crystal layer disposed between the thin-film transistor substrate and the counter substrate.

10. A method for producing a thin-film transistor substrate, comprising in the following order:

first patterning including forming a gate electrode conductive film on a base substrate and patterning the gate electrode conductive film using a first photomask to form a gate electrode;

formation of a gate insulating layer including forming a gate insulating layer so as to cover the gate electrode;

second patterning including forming a first conductive film so as to cover the gate insulating layer and patterning the first conductive film using a second photomask;

third patterning including forming a second conductive film containing at least one element selected from the group consisting of molybdenum, tantalum, tungsten, and nickel and patterning the second conductive film using a third photomask to form a source electrode and a drain electrode;

first hydrofluoric acid treatment including treating a gate insulating layer side surface of the base substrate with hydrofluoric acid;

fourth patterning including forming an insulating film so as to cover the source electrode and the drain electrode and patterning the insulating film using a fourth photomask to form an etching stopper layer;

second hydrofluoric acid treatment including treating the gate insulating layer side surface of the base substrate with hydrofluoric acid; and fifth patterning including forming an oxide semiconductor film so as to cover the source electrode and the drain electrode and patterning the oxide semiconductor film using a fifth photomask to form an oxide semiconductor layer.

11. The method for producing a thin-film transistor substrate according to claim 10, wherein the second conductive film is a conductive film containing at least one substance selected from the group consisting of molybdenum, molybdenum nitride, a molybdenum alloy, a nitride of the molybdenum alloy, tantalum, tantalum nitride, a tantalum alloy, a nitride of the tantalum alloy, tungsten, tungsten nitride, a tungsten alloy, a nitride of the tungsten alloy, nickel, nickel nitride, a nickel alloy, and a nitride of the nickel alloy.

12. The method for producing a thin-film transistor substrate according to claim 10, wherein the oxide semiconductor film is an indium gallium zinc oxide-based oxide semiconductor.

* * * * *